US012796125B2

(12) United States Patent
Miyata

(10) Patent No.: US 12,796,125 B2
(45) Date of Patent: Nov. 10, 2026

(54) IMAGING DEVICE AND ELECTRONIC APPARATUS

(71) Applicant: SONY SEMICONDUCTOR SOLUTIONS CORPORATION, Kanagawa (JP)

(72) Inventor: Koji Miyata, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 380 days.

(21) Appl. No.: 18/554,268

(22) PCT Filed: Mar. 2, 2022

(86) PCT No.: PCT/JP2022/008988

§ 371 (c)(1),
(2) Date: Oct. 6, 2023

(87) PCT Pub. No.: WO2022/230355

PCT Pub. Date: Nov. 3, 2022

(65) Prior Publication Data

US 2024/0186341 A1 Jun. 6, 2024

(30) Foreign Application Priority Data

Apr. 30, 2021 (JP) ................................. 2021-077617

(51) Int. Cl.

| | |
|---|---|
| ***H10F 39/00*** | (2025.01) |
| ***H04N 25/61*** | (2023.01) |
| ***H10F 39/12*** | (2025.01) |
| ***H10F 39/18*** | (2025.01) |

(52) U.S. Cl.

CPC ........... *H10F 39/802* (2025.01); *H04N 25/61* (2023.01); *H10F 39/182* (2025.01); *H10F 39/199* (2025.01); *H10F 39/8053* (2025.01)

(58) Field of Classification Search

CPC .. H10F 39/199; H10F 39/802; H10F 39/8053; H04N 25/61

USPC .......................................................... 257/447

See application file for complete search history.

(56) References Cited

U.S. PATENT DOCUMENTS

| | | | | |
|---|---|---|---|---|
| 2014/0367817 | A1 | 12/2014 | Furuta | |
| 2016/0269619 | A1 | 9/2016 | Ui | |
| 2020/0235148 | A1* | 7/2020 | Shim | H10F 39/8027 |

FOREIGN PATENT DOCUMENTS

| | | | |
|---|---|---|---|
| CN | 104253136 A * | 12/2014 | H04N 25/771 |
| JP | 2015-002340 | 1/2015 | |
| JP | 2015-012127 | 1/2015 | |
| JP | 2020-188267 | 11/2020 | |
| JP | 2020-194965 | 12/2020 | |

(Continued)

OTHER PUBLICATIONS

International Search Report and Written Opinion prepared by the Japan Patent Office on May 18, 2022, for International Application No. PCT/JP2022/008988, 2 pgs.

*Primary Examiner* — Phuc T Dang

(74) *Attorney, Agent, or Firm* — SHERIDAN ROSS P.C.

(57) ABSTRACT

An imaging device according to an embodiment includes: a pixel array unit including a plurality of pixels arranged in matrix arrangement, in which a separation portion that separates a pixel with a separation surface to acquire a phase difference is provided at an angle different from 0 degrees with respect to a column direction in the arrangement in at least some of the plurality of pixels.

20 Claims, 42 Drawing Sheets

(56) References Cited

FOREIGN PATENT DOCUMENTS

| | | | | | |
|---|---|---|---|---|---|
| KR | 20200091195 | A | | 7/2020 | |
| WO | WO-2017048425 | A1 | * | 3/2017 | ........... H04N 25/133 |
| WO | WO-2019069556 | A1 | * | 4/2019 | ........... H10F 39/014 |
| WO | WO-2020209107 | A1 | * | 10/2020 | ............. H04N 23/12 |

* cited by examiner (a)

(b)

(a)

(b)

(a)

(b)

IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2022/008988, having an international filing date of 2 Mar. 2022, which designated the United States, which PCT application claimed the benefit of Japanese Patent Application No. 2021-077617, filed 30 Apr. 2021, the entire disclosures of each of which are incorporated herein by reference.

FIELD

The present disclosure relates to an imaging device and an electronic apparatus.

BACKGROUND

A pixel array in which a plurality of pixels are arranged in matrix arrangement is known. In addition, there is known an image plane phase difference autofocus (AF) method that performs AF processing and parallax detection on the basis of pixel signals of a plurality of pixels arranged in a row direction (or a column direction) in a pixel array.

Regarding the above-described image plane phase difference AF method, there is known a phase difference pixel using a pupil division method in which a photoelectric transformation unit included in a pixel is divided by an insulated light shielding film, and image plane phase difference AF is performed using each divided region in the pixel (for example, Patent Literature 1).

CITATION LIST

Patent Literature

Patent Literature 1: JP 2015-012127 A

SUMMARY

Technical Problem

In the phase difference pixel using the pupil division method described above, light incident on the pixel is scattered on a pixel separation surface including an upper end (an end on an incident side) of the light shielding film that divides the pixel, and the scattered light leaks to an adjacent pixel, which causes color mixing. Therefore, hitherto, an influence of the color mixing has been reduced by devising a phase difference acquisition method, a waveguide structure, a reading control method, and the like. However, with color mixing reduction measures according to the related arts, it is difficult to reduce the color mixing on the pixel separation surface.

An object of the present disclosure is to provide an imaging device and an electronic apparatus capable of reducing color mixing in a pixel for acquiring a phase difference by using a pupil division method.

Solution to Problem

For solving the problem described above, an imaging device according to one aspect of the present disclosure has a pixel array unit that includes a plurality of pixels arranged in matrix arrangement, wherein a separation portion that separates a pixel with a separation surface to acquire a phase difference is provided at an angle different from 0 degrees with respect to a column direction in the arrangement in at least some of the plurality of pixels.

DESCRIPTION OF EMBODIMENTS

Hereinafter, embodiments of the present disclosure will be described in detail with reference to the drawings. Note that, in the following embodiments, the same reference signs denote the same portions, and an overlapping description will be omitted.

Hereinafter, embodiments of the present disclosure will be described in the following order.

1. Configuration Applicable to Embodiment
2. Brief Description of Embodiment
3. First Embodiment
3-1. First Modified Example of First Embodiment
3-2. Second Modified Example of First Embodiment
3-3. Third Modified Example of First Embodiment
3-4. Fourth Modified Example of First Embodiment
3-5. Fifth Modified Example of First Embodiment
3-6. Sixth Modified Example of First Embodiment
3-7. Seventh Modified Example of First Embodiment
3-8. Eighth Modified Example of First Embodiment
3-9. Ninth Modified Example of First Embodiment
3-10. Tenth Modified Example of First Embodiment
3-11. Eleventh Modified Example of First Embodiment
4. Second Embodiment
4-1. Modified Example of Second Embodiment
5. Third Embodiment
6. Fourth Embodiment
7. Fifth Embodiment
8. Sixth Embodiment
9. Seventh Embodiment
9-1. Application Example of Technology of Present Disclosure
9-2. Example of Application to Endoscopic Surgery System
9-3. Example of Application to Moving Body

1. Configuration Applicable to Embodiment

First, a configuration applicable to an embodiment of the present disclosure will be described.

(Configuration of Electronic Apparatus)

Figure 1:
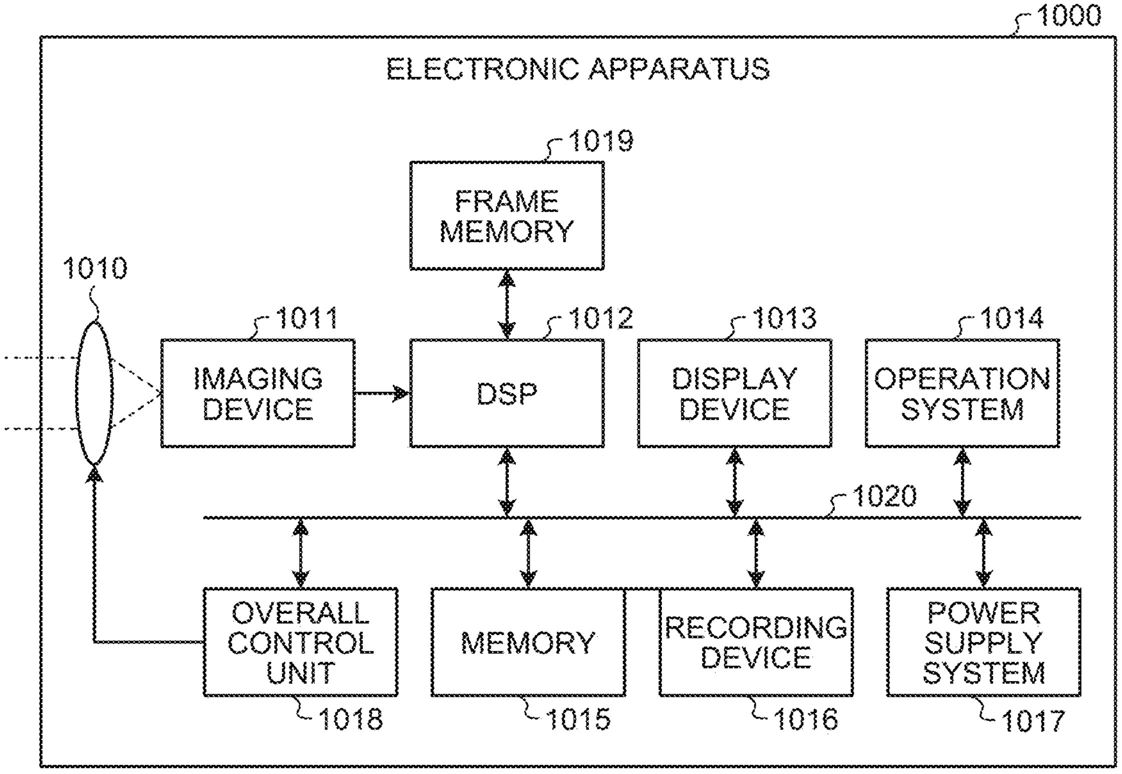
FIG. 1 is a block diagram depicting a configuration of an example of an electronic apparatus applicable to each embodiment of the present disclosure.

FIG. 1 is a block diagram depicting a configuration of an example of an electronic apparatus applicable to each embodiment of the present disclosure. In FIG. 1, an electronic apparatus 1000 is configured as a camera that performs imaging by an imaging device 1011.

As depicted in FIG. 1, the electronic apparatus 1000 includes an optical system 1010, the imaging device 1011, and a digital signal processor (DSP) 1012, and is configured by connecting the DSP 1012, a display device 1013, an operation system 1014, a memory 1015, a recording device 1016, a power supply system 1017, and an overall control unit 1018 via a bus 1020, and is capable of capturing a still image and a moving image.

The optical system 1010 includes one or a plurality of lenses, guides image light (incident light) from a subject to the imaging device 1011, and forms an image on a light receiving surface (sensor unit) of the imaging device 1011. The optical system 1010 can perform an autofocus (AF) operation, a zoom operation, aperture control, and the like under the control of the overall control unit 1018 described later.

As the imaging device 1011, an imaging device according to each embodiment and each modified example thereof to be described later can be applied. The imaging device 1011 outputs pixel data based on a signal for each pixel according to an image formed on the light receiving surface via the optical system 1010. The pixel data output from the imaging device 1011 is supplied to the DSP 1012 and stored in a frame memory 1019. The pixel data for one frame stored in the frame memory 1019 constitutes image data.

The DSP 1012 performs various types of signal processing on the image data stored in the frame memory 1019, and temporarily stores the image data in the memory 1015. The image data stored in the memory 1015 is recorded in the recording device 1016 or supplied to the display device 1013 to display the image. In addition, the operation system 1014 receives various operations by a user and supplies an operation signal to each block of the electronic apparatus 1000, and the power supply system 1017 supplies power necessary for driving each block of the electronic apparatus 1000.

The overall control unit 1018 includes, for example, a central processing unit (CPU), a read only memory (ROM), a random access memory (RAM), and the like, and controls an overall operation of the electronic apparatus 1000 by using the RAM as a work memory according to a program stored in the ROM, for example. For example, the overall control unit 1018 can generate an AF control signal on the basis of the image data acquired from the imaging device 1011 via the DSP 1012 and control an AF operation performed by the optical system 1010.

(Configuration of Imaging Device)

Next, a schematic configuration of the imaging device 1011 applicable to each embodiment and each modified example of the present disclosure will be described. The imaging device 1011 is configured as a complementary metal-oxide-semiconductor (CMOS) type solid-state imaging element (CMOS image sensor). Here, the CMOS image sensor is an image sensor created by applying or partially using a CMOS process. For example, the CMOS image sensor applicable to each embodiment and each modified example includes a back-illuminated CMOS image sensor.

Figure 2:
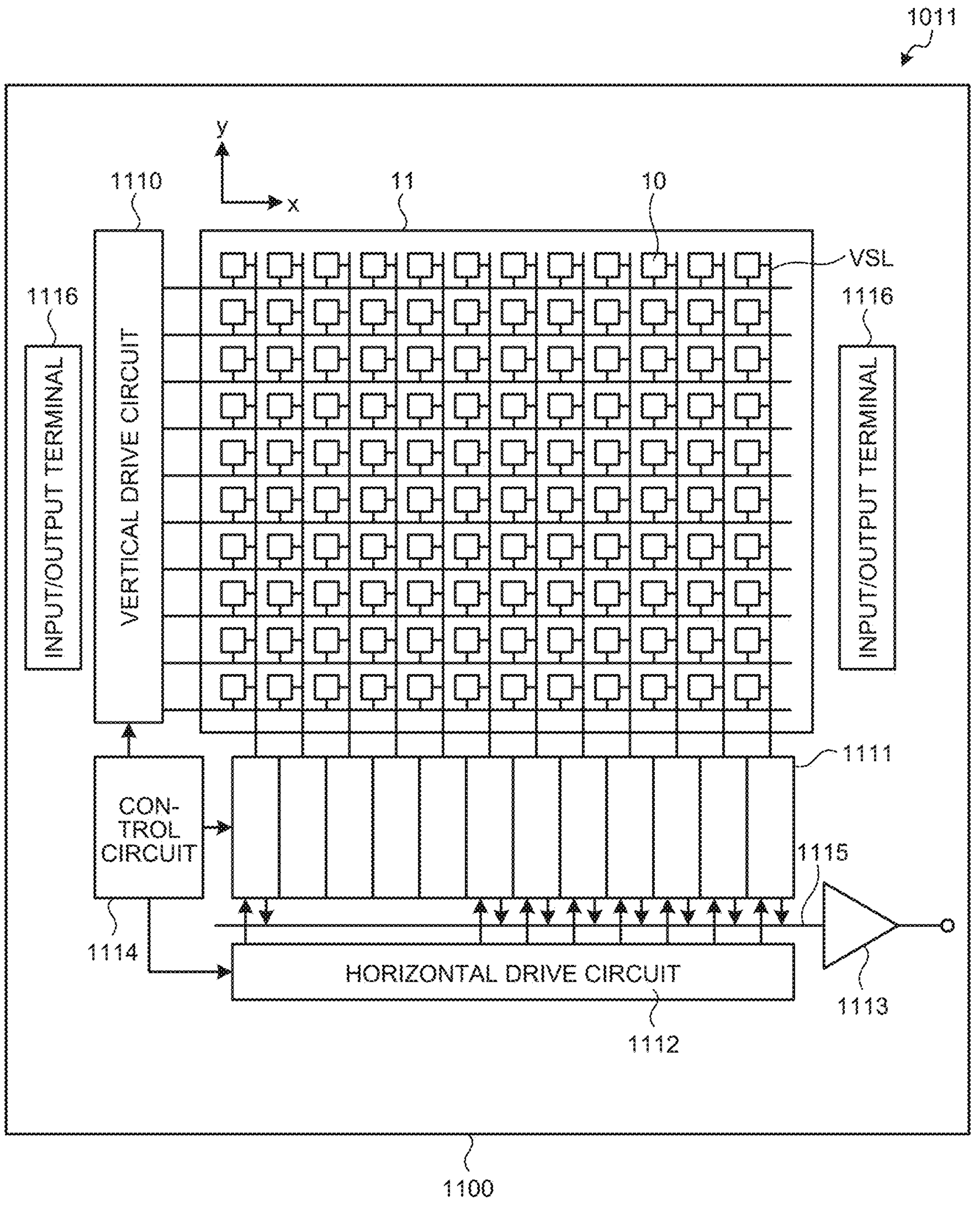
FIG. 2 is a schematic diagram depicting a configuration of an example of an imaging device applicable to each embodiment and each modified example of the present disclosure.

FIG. 2 is a schematic diagram depicting a configuration of an example of the imaging device 1011 applicable to each embodiment and each modified example of the present disclosure.

In FIG. 2, the imaging device 1011 includes a pixel array unit 11 in which pixels 10 including a plurality of photoelectric transformation elements are arranged in matrix arrangement on a semiconductor substrate 1100 formed of, for example, a silicon substrate, and a peripheral circuit unit.

The pixel 10 includes, for example, a photodiode serving as the photoelectric transformation element and a plurality of pixel transistors each of which is, for example, a metal oxide semiconductor (MOS) transistor. In the present disclosure, the pixel 10 includes two photodiodes.

The peripheral circuit unit includes a vertical drive circuit 1110, a column signal processing circuit 1111, a horizontal drive circuit 1112, an output circuit 1113, a control circuit 1114, and the like.

The control circuit 1114 receives an input clock and data instructing an operation mode and the like, and outputs data such as internal information of the imaging device 1011. That is, the control circuit 1114 generates a clock signal or a control signal serving as a reference of operations of the vertical drive circuit 1110, the column signal processing circuit 1111, the horizontal drive circuit 1112, and the like on the basis of a vertical synchronization signal, a horizontal synchronization signal, and a master clock. Then, these signals are input to the vertical drive circuit 1110, the column signal processing circuit 1111, the horizontal drive circuit 1112, and the like.

The vertical drive circuit 1110 is implemented by, for example, a shift register, selects a pixel drive wiring, supplies a pulse for driving pixels to the selected pixel drive wiring, and drives the pixels in units of rows. That is, the vertical drive circuit 1110 selectively scans the respective pixels 10 of the pixel array unit 11 sequentially in a vertical direction in units of rows, and supplies, to the column signal processing circuit 1111 through a vertical signal line VSL, a pixel signal based on a signal charge generated according to the amount of light received by, for example, a photodiode serving as the photoelectric transformation element of each pixel 10.

The column signal processing circuit 1111 is arranged, for example, for each column of the pixels 10, and performs signal processing such as noise removal on the pixel signals output from the pixels 10 of one row for each pixel column. That is, the column signal processing circuit 1111 performs signal processing such as CDS for removing fixed pattern noise unique to the pixel 10, signal amplification, and analog to digital (AD) conversion. A horizontal selection switch (not depicted) is connected to an output stage of the column signal processing circuit 1111, and provided between the column signal processing circuit 1111 and a horizontal signal line 1115.

In the present disclosure, since each pixel 10 includes two photoelectric transformation elements, two vertical signal lines VSL are actually provided for each column of the pixels 10. Similarly, two column signal processing circuits 1111 are arranged for each column of the pixels 10.

The horizontal drive circuit 1112 is implemented by, for example, a shift register, sequentially selects each of the column signal processing circuits 1111 by sequentially outputting horizontal scanning pulses, and causes each of the column signal processing circuits 1111 to output, to the horizontal signal line 1115, pixel data obtained by AD conversion of the pixel signal.

The output circuit 1113 performs signal processing on the pixel data sequentially supplied from each of the column signal processing circuits 1111 through the horizontal signal line 1115, and outputs the pixel data. The output circuit 1113 may perform only buffering, for example, or may perform black level adjustment, column variation correction, various types of digital signal processing, and the like. Image data for one frame is generated by the pixel data based on the pixel signal output from the pixel 10 in a region set as an effective image region among the plurality of pixels 10 included in the pixel array unit 11. An input/output terminal 1116 exchanges a signal with the outside.

(Pixel Circuit)

Figure 3:
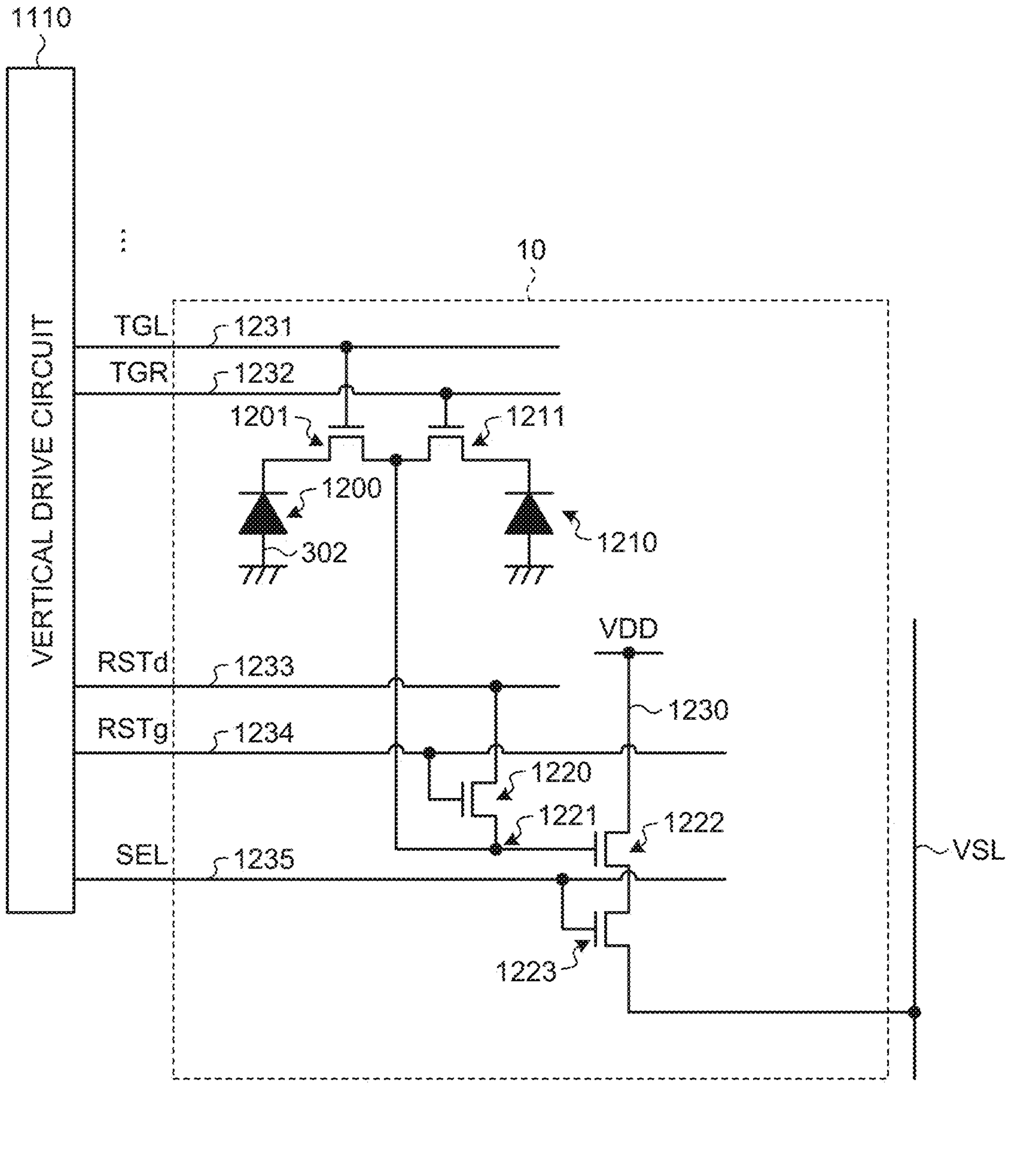
FIG. 3 is a circuit diagram depicting a circuit configuration of an example of a pixel applicable to each embodiment and each modified example of the present disclosure.

FIG. 3 is a circuit diagram depicting a circuit configuration of an example of the pixel 10 applicable to each embodiment and each modified example of the present disclosure. In FIG. 3, the pixel 10 includes photoelectric transformation elements 1200 and 1210 and transfer transistors 1201 and 1211. Furthermore, the pixel 10 includes a reset transistor 1220, a floating diffusion layer 1221, an amplification transistor 1222, and a selection transistor 1223.

Anodes of the photoelectric transformation elements 1200 and 1210 are connected to a ground terminal.

A transfer signal TGL from the vertical drive circuit 1110 is input to a gate of the transfer transistor 1201 via a transfer gate drive wiring 1231. A transfer signal TGR from the vertical drive circuit 1110 is input to a gate of the transfer transistor 1211 via a transfer gate drive wiring 1232.

A drain of the reset transistor 1220 is connected to the vertical drive circuit 1110 by a reset drain drive wiring 1233. A reset drain signal RSTd is input to the drain of the reset transistor 1220 via the reset drain drive wiring 1233, and a reset gate signal RSTg is input to a gate of the reset transistor 1220 via a reset gate drive wiring 1234.

A drain of the amplification transistor 1222 is connected to a power supply terminal via a power supply line 1230. A selection signal SEL from the vertical drive circuit 1110 is input to a gate of the selection transistor 1223 via a selection gate drive wiring 1235. Furthermore, a row of the pixels 10 is set as an FD row, and a source of the selection transistor 1223 of the FD row is connected to the column signal processing circuit 1111 via the vertical signal line VSL.

The photoelectric transformation elements 1200 and 1210 receive a pair of light rays obtained by pupil division. The transfer transistors 1201 and 1211 transfer charges (electrons and the like) from the photoelectric transformation element 1200 to the floating diffusion layer 1221 according to the transfer signal TGL.

The floating diffusion layer 1221 accumulates the charges and generates a pixel signal of a voltage corresponding to the amount of charges. Since the transfer transistors 1201 and 1211 share the floating diffusion layer 1221, the pixel signals of the photoelectric transformation elements 1200 and 1210 are sequentially generated one by one. The floating diffusion layer 1221 is not limited to this example, and may be provided for each of the transfer transistors 1201 and 1211.

The reset transistor 1220 sets a charge amount of the floating diffusion layer 1221 to an initial value according to the reset gate signal RSTg. Furthermore, the vertical drive circuit 1110 can control a drain potential of the reset transistor 1220 by the reset drain signal RSTd.

The amplification transistor 1222 amplifies the pixel signal and supplies the amplified pixel signal to the selection transistor 1223. The selection transistor 1223 outputs the amplified pixel signal to the corresponding vertical signal line VSL according to the selection signal SEL.

(Optical Configuration of Imaging Device)

Figure 4A:
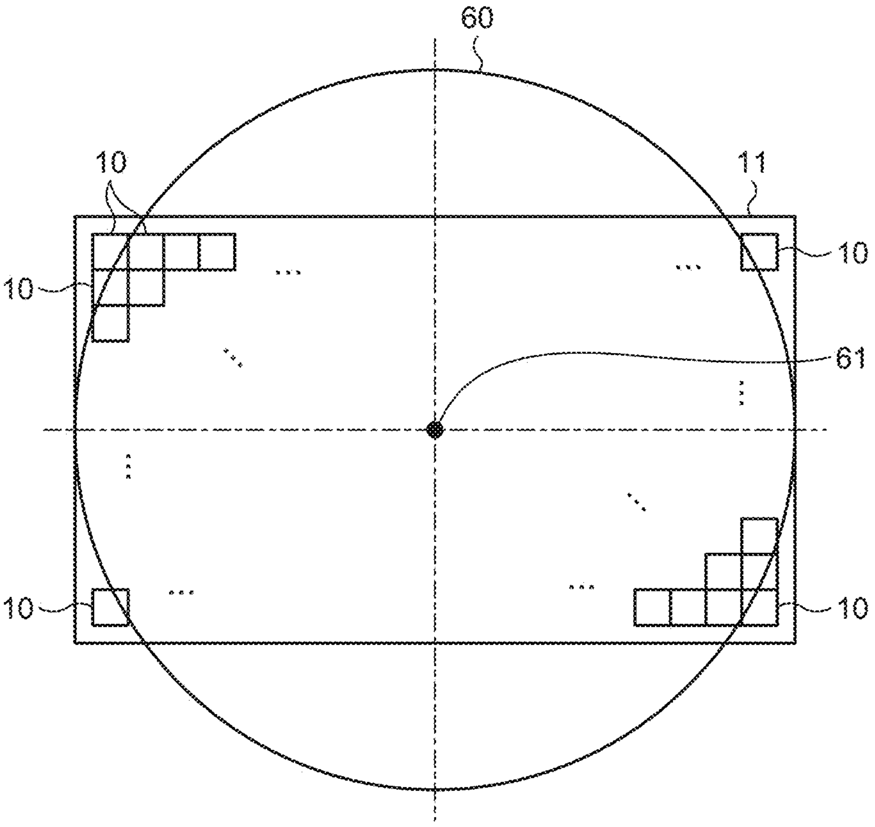
FIG. 4A is a top view of an example of a pixel array unit of the imaging device as viewed from an incident surface side.
Figure 4B:
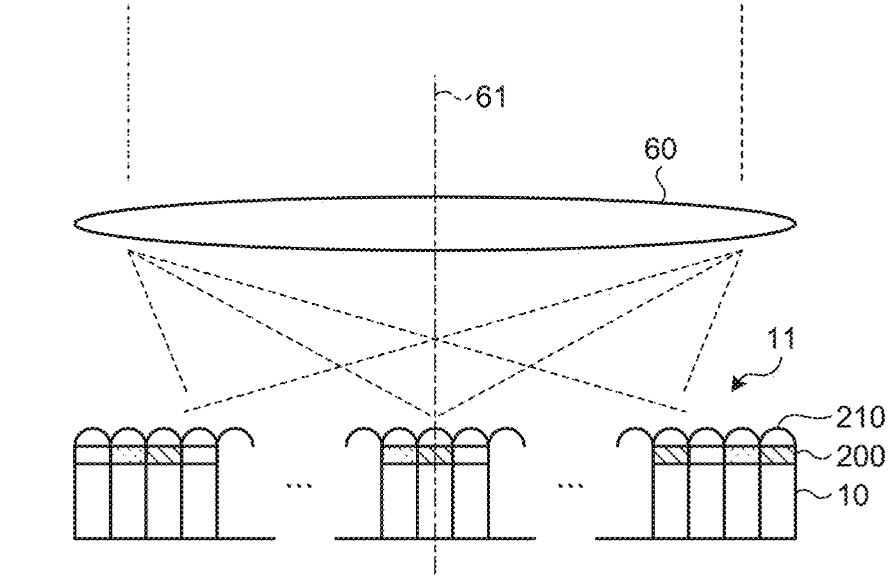
FIG. 4B is a side view of an example of the pixel array unit as viewed from a plane perpendicular to an incident surface.

Next, an optical configuration of the imaging device 1011 applicable to each embodiment and each modified example will be briefly described with reference to FIGS. 4A and 4B. FIG. 4A is a top view of an example of the pixel array unit 11 of the imaging device 1011 as viewed from an incident surface side. FIG. 4B is a side view of an example of the pixel array unit 11 as viewed from a plane perpendicular to incident surface.

As depicted in FIG. 4A, a lens 60 is arranged with respect to the pixel array unit 11 in which the pixels 10 are arranged on matrix arrangement. The lens 60 irradiates each pixel 10 of the pixel array unit 11 with incident light, and is hereinafter referred to as a main lens 60. In the example of FIGS. 4A and 4B, a position of an optical axis 61 of the main lens 60 coincides with the center position of the pixel array unit 11. Furthermore, as depicted in FIG. 4B, in each pixel 10, a color filter 200 as an optical filter and an on-chip lens (OCL) 210 are provided by being stacked on the incident surface.

As can be seen from FIGS. 4A and 4B, light is incident on the pixels 10 arranged at the position of the optical axis 61 of the main lens 60 and in the vicinity thereof in the pixel array unit 11 from the main lens 60 in a direction substantially perpendicular to the incident surface. On the other hand, light is incident on the pixels 10 arranged at positions deviated from the optical axis 61 of the main lens 60 in a more oblique direction with respect to the incident surface as the distance from the position of the optical axis 61 increases. Pupil correction may be performed to suppress a change in entrance pupil diameter caused by a change in incident angle of light with respect to the pixel 10 according to the position in the pixel array unit 11. The pupil correction is performed, for example, by adjusting the position and shape of the OCL 210 according to the position of the pixel 10 in the pixel array unit 11.

The light incident on the imaging device 1011 is emitted to each pixel 10 via the main lens 60. In each pixel 10, light emitted from the main lens 60 enters the semiconductor substrate on which the photoelectric transformation elements 1200 and 1210 are formed from the incident surface of the semiconductor substrate via the OCL 210 and the color filter 200. This light is received by the photoelectric transformation elements 1200 and 1210 and is photoelectrically transformed by the photoelectric transformation elements 1200 and 1210, and a charge is generated.

2. Brief Description of Embodiment

Next, an embodiment of the present disclosure will be briefly described.

(Pixel According to Existing Technology)

Figure 5A:
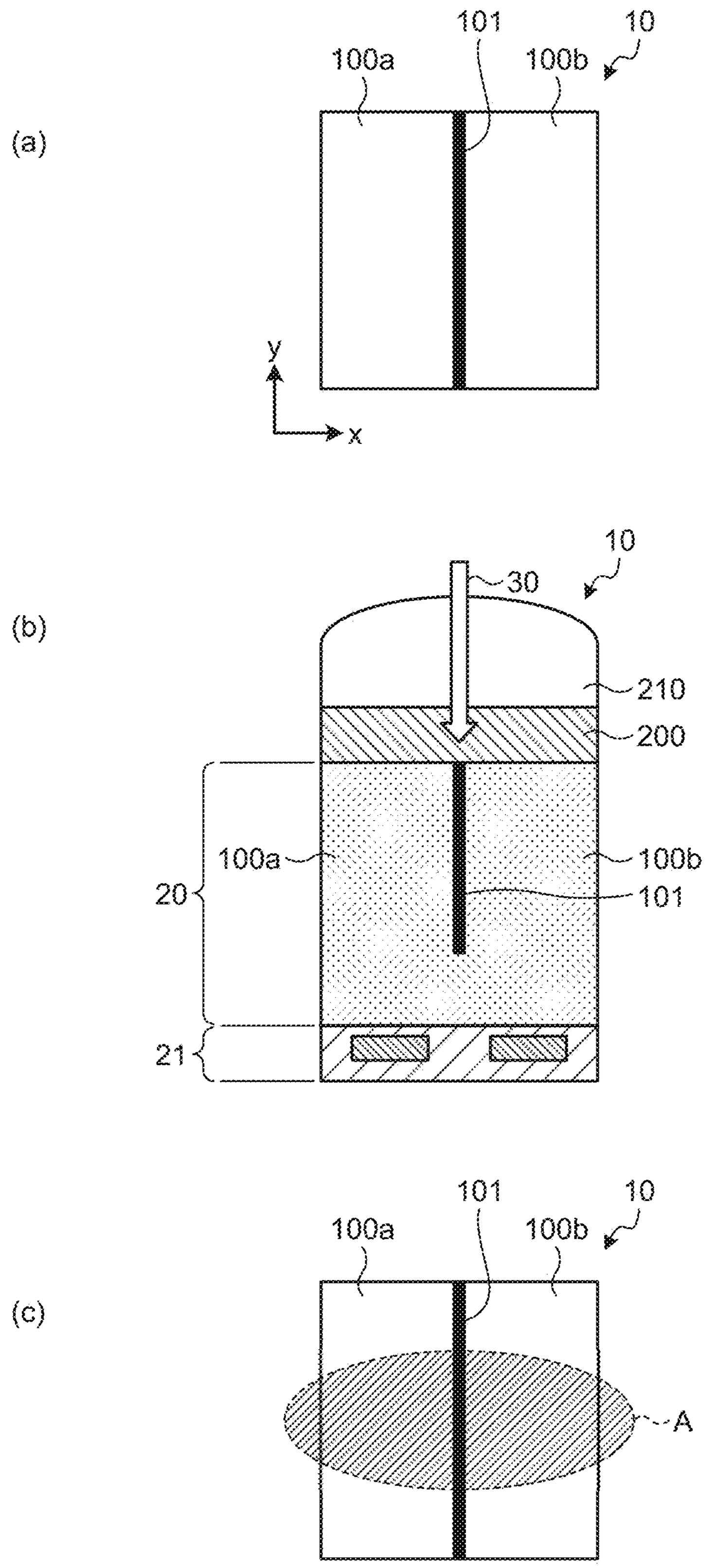
FIG. 5A is a schematic view schematically depicting a structure of an example of a pixel according to an existing technology.

First, in order to facilitate understanding, a pixel 10 according to an existing technology will be described. FIG. 5A is a schematic view schematically depicting a structure of an example of the pixel 10 according to the existing technology. In FIG. 5A, a section (a) is a plan view of an example when the pixel 10 is viewed from the incident surface side, and a section (b) is a cross-sectional view of an example as viewed from a plane perpendicular to the incident surface of the pixel 10. The section (b) is a cross-sectional view in which a lower side of the pixel 10 depicted in the section (a) corresponds to the front side.

Furthermore, a section (c) of FIG. 5A schematically depicts diffusion of light in a case where light is incident on the incident surface of the pixel 10. In the sections (a) and (c), an x direction and a y direction indicate a row direction and a column direction in the pixel array unit 11, respectively.

In the example of the section (a) of FIG. 5A, a pupil separation portion 101 is provided at the center of pixel 10 in the row direction in parallel with the column direction. The pupil separation portion 101 divides the pixel 10 into a left side and a right side in the drawing, and the divided left side is a photodiode (PD) 100*a* corresponding to the photoelectric transformation element 1200, for example, and the right side is a PD 100*b* corresponding to the photoelectric transformation element 1210, for example.

As depicted in the section (b) of FIG. 5A, in the pixel 10, the color filter 200 and the on-chip lens (OCL) 210 are provided on the incident surface of a semiconductor layer 20, which is a surface on which incident light 30 is incident. In addition, a wiring layer 21 is provided on a surface of the semiconductor layer 20 opposite to the incident surface. In this example, in the pixel 10, the pupil separation portion 101 is provided in the semiconductor layer 20 from the incident surface toward the wiring layer 21. A surface including an upper end of the pupil separation portion 101 (an end of a side on which the incident light 30 is incident) may be referred to as a pixel separation surface. The pupil separation portion 101 can be formed, for example, by forming a trench in the semiconductor layer 20, forming an insulating film on an inner wall of the trench, and further filling the trench with a light shielding material.

In the semiconductor layer 20, a separation surface in which the pupil separation portion 101 is formed is separated into two regions, the PD 100*a* is configured in one of the separated regions, and the PD 100*b* is configured in the other region. The color filter 200 and the OCL 210 are shared by the PDs 100*a* and 100*b*.

By configuring the two PDs 100*a* and 100*b* for one pixel 10 in this manner, an image plane phase difference AF method can be implemented. In the image plane phase difference AF method, autofocus control and parallax detection are performed using a phase difference of pixel signals based on charges photoelectrically transformed by the photoelectric transformation elements at different positions.

In the example of FIG. 5A, for example, the overall control unit 1018 detects a phase difference of the respective pixel signals by the PDs 100*a* and 100*b* for the pixel 10 including two PDs 100*a* and 100*b* sharing one OCL 210. Specifically, the overall control unit 1018 may detect the phase difference on the basis of, for example, the pixel data of each pixel 10 included in the image data stored in the frame memory 1019. The overall control unit 1018 acquires, for example, information for performing the autofocus control on the basis of the detected phase difference. The phase difference detection processing is not limited to being performed by the overall control unit 1018, and may be performed in the DSP 1012, for example.

In a case where the incident light 30 is incident on the pixel 10, for example, perpendicularly to the incident surface, the incident light 30 is scattered by the upper end (the end on the side on which the incident light 30 is incident) of the pupil separation portion 101 as depicted as a range A in the section (c) of FIG. 5A. For example, in a case where the incident light 30 is incident on the center of the pixel 10, the range A is scattered around a direction of 90° with respect to the pupil separation portion 101, for example. The light power of the scattered light decreases as the distance from the pupil separation portion 101 increases, but the scattered light may be mixed into adjacent pixels.

Figure 5B:
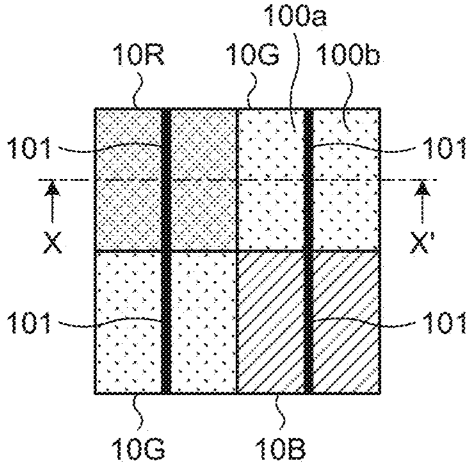
FIG. 5B is a schematic view depicting an example in which a plurality of pixels are arranged adjacent to each other according to arrangement of color filters.
Figure 5B:
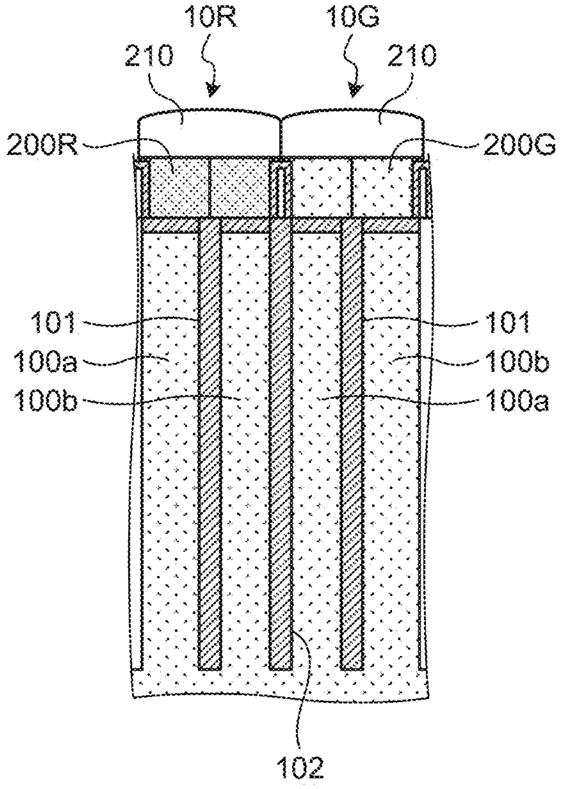

FIG. 5B is a schematic view depicting an example in which a plurality of pixels 10 are arranged adjacent to each other according to arrangement of the color filters 200. In FIG. 5B, a pixel 10 provided with a color filter 200R that is an optical filter having a characteristic of transmitting light in a red (R) wavelength range is defined as a pixel 10R. Similarly, a pixel 10 provided with a color filter 200G that is an optical filter having a characteristic of transmitting light in a green (G) wavelength range is defined as a pixel 10G, and a pixel 10 provided with a color filter 200B (not depicted) that is an optical filter having a characteristic of transmitting light in a blue (B) wavelength range is defined as a pixel 10B.

In the following description, unless otherwise specified, for example, "the color filter 200R that transmits light in the red (R) wavelength range" is referred to as "red color filter 200R" or the like. Furthermore, the "pixel 10R provided with the color filter 200R that transmits light in the red (R) wavelength range" is referred to as "red pixel 10R" or the like.

In FIG. 5B, a section (a) is a plan view of an example of arrangement of the pixels 10R, 10G, and 10B as viewed from the incident surface side. As described above, two pixels 10G, one pixel 10R, and one pixel 10B are arranged in a grid pattern in such a way that the two pixels 10G are not adjacent to each other. The respective pixels 10R, 10G, and 10B are arranged according to so-called Bayer arrangement.

A section (b) of FIG. 5B is a cross-sectional view of an example taken along line X-X' in the section (a). As depicted in the section (b), the respective pixels 10 (the pixel 10R and the pixel 10G in this example) are separated by an element separation portion 102 formed in the semiconductor layer 20. In the pixel 10R, the red color filter 200R and the OCL 210 are shared by the PDs 100*a* and 100*b*. Similarly, in the pixel 10G, the green color filter 200G and the OCL 210 are shared by the PDs 100*a* and 100*b*.

For example, a case where the incident light 30 is scattered by the pupil separation portion 101 as indicated by the range A in the pixel 10G positioned on the upper right side in the section (a) of FIG. 5B. In this case, the scattered light of the incident light 30 is also incident on the pixel 10R adjacent to the pixel 10G in a direction perpendicular to the separation surface of the pupil separation portion 101, and there is a possibility that the scattered light and the incident light 30 incident on the pixel 10R are mixed in the pixel 10R.

Generally, as depicted in the section (a) of FIG. 5B, another pixel 10 provided with a color filter of a color different from that of a certain pixel 10 is arranged adjacent to the certain pixel 10, for example. Therefore, when scattered light from the adjacent pixel 10 is mixed into the certain pixel 10, color mixing may occur and the image quality may be deteriorated.

Hitherto, an influence of the color mixing has been reduced by devising a phase difference acquisition method, a waveguide structure, a reading control method, and the like. However, with color mixing reduction measures according to the related arts, it is difficult to reduce the color mixing on the pixel separation surface.

Pixel According to Embodiment

Figure 6A:
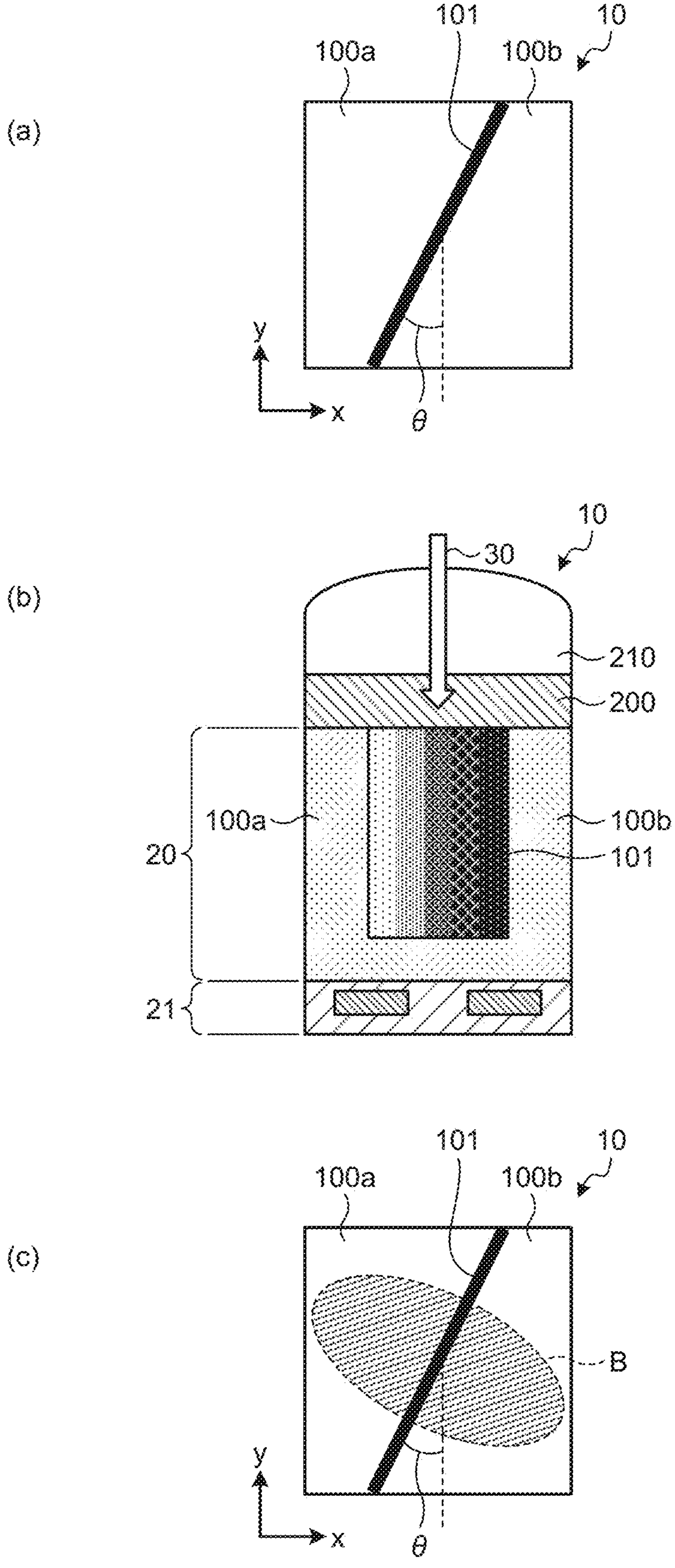
FIG. 6A is a schematic view schematically depicting a structure of an example of a pixel according to an embodiment.

Next, a pixel 10 according to an embodiment of the present disclosure will be described. FIG. 6A is a schematic view schematically depicting a structure of an example of the pixel 10 according to the embodiment. In FIG. 6A, sections (a) to (c) depict contents corresponding to the sections (a) to (c) of FIG. 5A, respectively. That is, the section (a) of FIG. 6A is a plan view of an example of the pixel 10 according to the embodiment as viewed from the incident surface side, and the section (b) of FIG. 6A is a view of the pixel 10 as viewed from a direction perpendicular to the incident surface of the pixel 10. The section (b) depicts an example of the pixel 10 as viewed from a lower end side in the plan view in the section (a). Furthermore, the section (c) schematically depicts diffusion of light in a case where light is incident on the incident surface of the pixel 10.

As depicted in the section (a) of FIG. 6A, in the pixel 10 according to the embodiment, the pupil separation portion 101 is provided at a predetermined angle θ other than 0° with respect to a direction parallel to the column direction. Even in this case, the pupil separation portion 101 divides the pixel 10 into the left side and the right side in the drawing, and the divided left side is the photodiode (PD) 100*a* corresponding to the photoelectric transformation element 1200, for example, and the right side is the PD 100*b* corresponding to the photoelectric transformation element 1210, for example.

As depicted in the section (b) of FIG. 6A, the pupil separation portion 101 is depicted with a width corresponding to the angle θ, for example, in a cross section in which the lower side in the section (a) corresponds to the front side.

Similarly to the case described with reference to FIG. 5A, in a case where the incident light is perpendicularly incident on the incident surface, for example, at the center of the pixel 10, the incident light 30 is scattered by the upper end (the end on the side on which the incident light 30 is incident) of the pupil separation portion 101 as depicted as a range B in the section (c) of FIG. 6A. Also in this case, the range B is scattered around a direction of 90° with respect to the pupil separation portion 101, for example. On the other hand, in this example, since the pupil separation portion 101 is arranged at the predetermined angle θ with respect to the column direction, the range B is scattered around a diagonal direction of the pixel 10.

A distance from the center of the pupil separation portion 101 (the center of the pixel 10) to a boundary of the pixel 10 is larger in a case where the angle θ of the pupil separation portion 101 with respect to the column direction is set to a predetermined angle other than 0° as depicted in FIG. 6A than that in a case where the angle θ is 0° (see FIG. 5A). Therefore, with the configuration of the pixel 10 according to the embodiment, the degree of mixing of the scattered light of the incident light 30 scattered by the pupil separation portion 101 into an adjacent pixel can be reduced as compared with the example according to the existing technology described above. Therefore, with the configuration of the pixel 10 according to the embodiment, mixing of scattered light from an adjacent pixel with the incident light 30 is suppressed, and the influence of color mixing can be reduced.

Figure 6B:
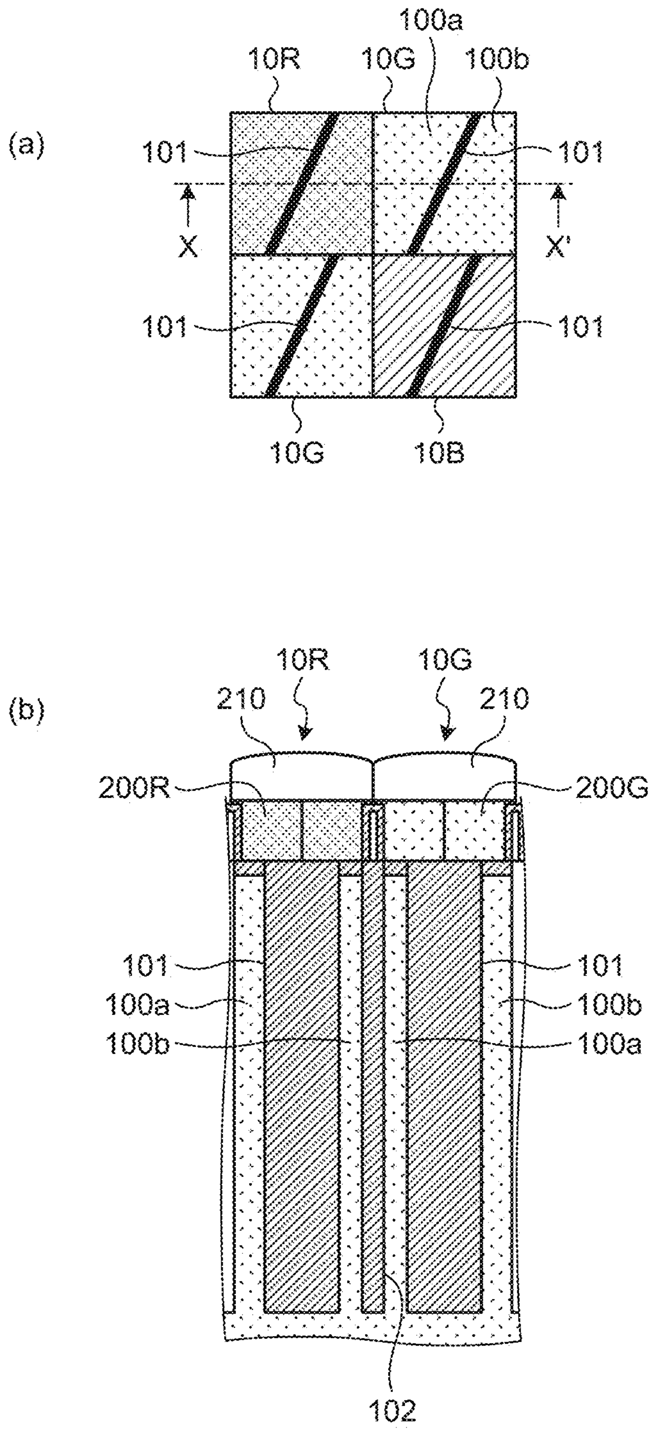
FIG. 6B is a schematic view depicting an example in which a plurality of pixels are arranged adjacent to each other according to arrangement of color filters for the pixel according to the embodiment.

FIG. 6B is a schematic view depicting an example in which a plurality of pixels 10 are arranged adjacent to each other according to arrangement of the color filters 200 for the pixel 10 according to the embodiment. In FIG. 6B, the arrangement of the pixels 10R, 10G, and 10B is the Bayer arrangement described above and is similar to the example of FIG. 5B, and thus a detailed description thereof will be omitted here.

In the example of a section (a) of FIG. 6B, the pupil separation portion 101 is provided in each of the pixels 10R, 10G, and 10B. In the example of FIG. 6B, the pupil separation portion 101 is provided at the same angle θ in each of the pixels 10R, 10G, and 10B, but the present disclosure is not limited to this example. Details will be described later. For example, the pupil separation portion 101 may be provided at a different angle θ for each of the pixels 10R, 10G, and 10B. Furthermore, a pixel not provided with the pupil separation portion 101 may be set among the pixels 10R, 10G, and 10B.

A section (b) of FIG. 6B is a cross-sectional view of an example taken along line X-X' in the section (a). Since the structures of the pixels 10R and 10G are similar to the configuration described in the section (b) of FIG. 5B, a detailed description thereof will be omitted here. As depicted in the section (b) of FIG. 6B, the pupil separation portion 101 is depicted with a width corresponding to the angle θ, for example, in a cross section taken along line X-X' in the section (a).

Characteristic Comparison Between Pixel According to Embodiment and Pixel According to Existing Technology Next, the characteristics of the pixel 10 according to the embodiment described above are compared with the characteristics of the pixel 10 according to the existing technology. One of the characteristics required for the pixel 10 is quantum efficiency (QE). In addition, color mixing is another characteristic required for the pixel 10. Furthermore, in a case of the pixel 10 that is used in the image plane phase difference AF method and includes a plurality of photoelectric transformation elements in one pixel, a separation ratio of a read signal among the plurality of photoelectric transformation elements is obtained as the characteristic of the pixel 10.

Figure 7A:
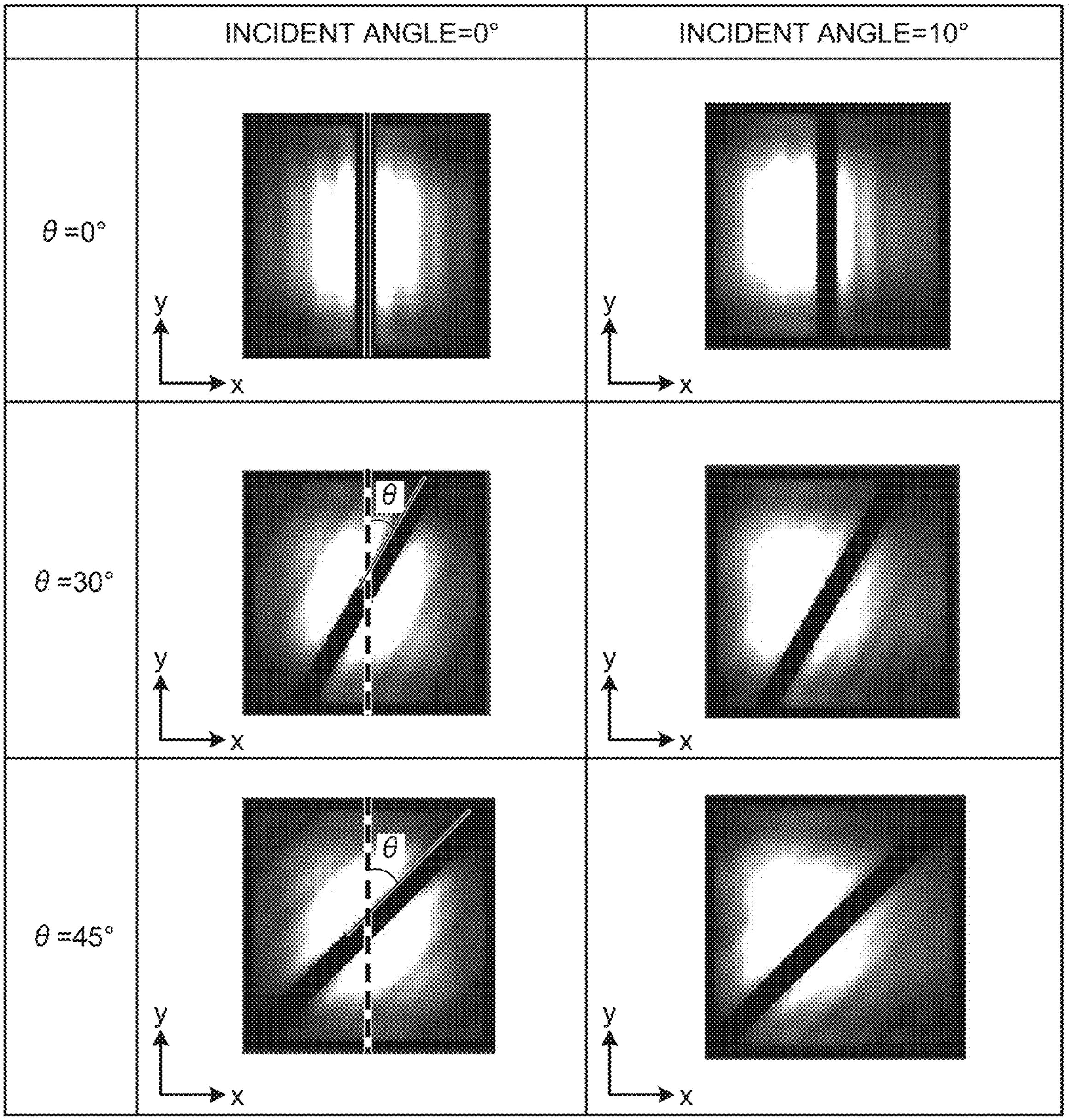
FIG. 7A is a schematic diagram depicting an example of results of simulating quantum efficiency (QE), a color mixing ratio, and a separation ratio in the pixel according to the embodiment and the pixel according to the existing technology.

FIG. 7A is a schematic diagram depicting an example of results of simulating the QE, a color mixing ratio, and the separation ratio in the pixel 10 according to the embodiment and the pixel 10 according to the existing technology. In the example of FIG. 7A, examples of simulation results in a case where the angle θ of the pupil separation portion 101 is set to angles θ=0°, 30°, and 45° for each of the incident angles=0° and 10° of the incident light 30 are depicted.

Figure 7B:
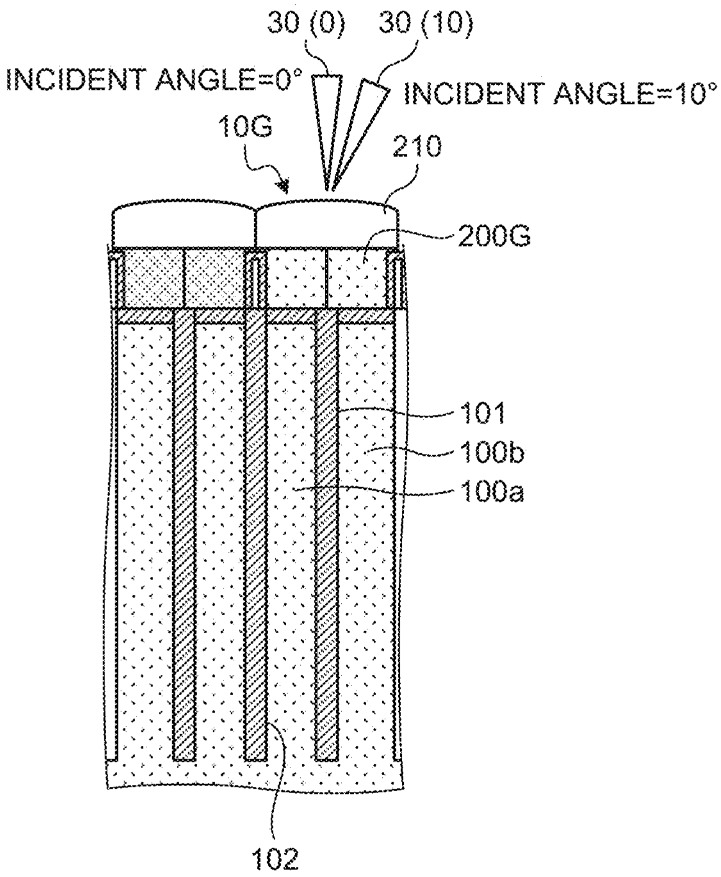
FIG. 7B is a schematic view for describing a definition of an incident angle in the simulation.
Figure 7B:
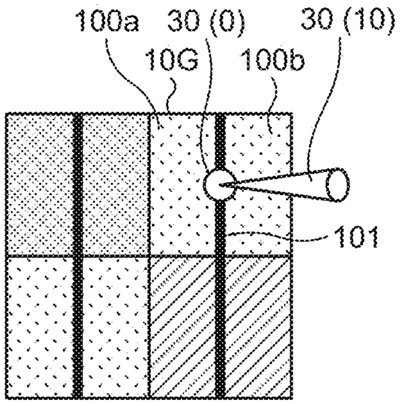

FIG. 7B is a schematic view for describing a definition of the incident angle in the simulation of FIG. 7A. A section (a) of FIG. 7B corresponds to the section (b) of FIG. 5B, for example, and depicts a cross section of the pixel 10 taken along line X-X' depicted in the section (a) of FIG. 5B, and a section (b) of FIG. 7B is a plan view of an example of the arrangement of pixels 10R, 10G, and 10B as viewed from the incident surface side.

The incident light 30 (0) whose incident angle is 0° is incident perpendicularly to the center of the pixel 10G, that is, at an angle of 0°. The incident light 30 (0) is a dominant component in the incident light 30 incident on the pixel 10G. On the other hand, the incident light 30 (10) whose incident angle is 10° is incident on the center of the pixel 10G in the row direction. As a result, a color mixing value of the incident light 30 (10) for the pixel 10G with respect to the adjacent pixel 10R can be obtained.

For example, in a case of the pixel 10G, the color mixing value is a value (the maximum value=1.0) indicating the intensity of light of another wavelength range (red or blue in this case) incident on the pixel 10G in a case where light of the green wavelength range is incident. The color mixing value is preferably small. Furthermore, the separation ratio is a value indicating a ratio between read data of the PD 100*a* and read data of the PD 100*b* in the pixel 10. The larger the separation ratio, the easier the phase difference is acquired. The QE is a value indicating the sensitivity of the pixel 10 itself, and is preferably large.

In FIG. 7A, a white or gray portion in a black background indicate scattered light of the incident light 30 incident on the pixel 10 (the PDs 100*a* and 100*b*) and scattered by the pupil separation portion 101 and the intensity of the scattered light. Furthermore, a black straight line portion in the white or gray portion corresponds to the pupil separation portion 101.

In FIG. 7A, the simulation result for the angle θ=0° corresponds to the characteristic of the pixel 10 according to the existing technology. According to the simulation result for the incident angle=0°, the QE has larger values at the angle θ=30° and the angle θ=45° than that at the angle θ=0°. It is considered that this is because, as the pupil separation portion 101 has the angle θ exceeding 0°, the distance to the position where the scattered light leaks to the adjacent pixel, that is, the boundary of the pixel 10G becomes larger than that in a case where the angle θ=0°, and thus the amount of scattered light taken into the pixel 10G increases.

The color mixing value is smaller at the angle θ=30° and the angle θ=45° than at the angle θ=0°. Therefore, it can be seen that the color mixing is reduced at the angle θ=30° and the angle θ=45° than at the angle θ=0°.

On the other hand, the separation ratio has smaller values at the angle θ=30° and the angle θ=45° than that at the angle θ=0°, and the separation ratio has a smaller value at the angle θ=45° than at the angle θ=30°. Therefore, it can be seen that the smaller the angle θ, the smaller the separation ratio, and the easier the phase difference is detected. Therefore, for example, it is preferable to determine a lower limit of the separation ratio for the imaging device 1011, that is, a lower limit of the separation ratio at which the phase difference that can be used in the image plane phase difference AF method can be acquired, and increase the angle θ to the lower limit of the separation ratio.

As described above, by increasing the angle θ of the pupil separation portion 101 to the lower limit of the separation ratio, it is possible to achieve both reduction of the influence of the color mixing, improvement of the QE, and the autofocus control by the image plane phase difference AF method unlike the pixel 10 according to the existing technology.

3. First Embodiment

Next, a first embodiment of the present disclosure will be described. The first embodiment relates to arrangement of the pixels 10 of the pixel array unit 11. More specifically, the first embodiment relates to the arrangement, that is, the angle θ, of the pupil separation portion 101 in each pixel 10 of the pixel array unit 11.

(Arrangement of Pupil Separation Portion According to Existing Technology)

Figure 8:
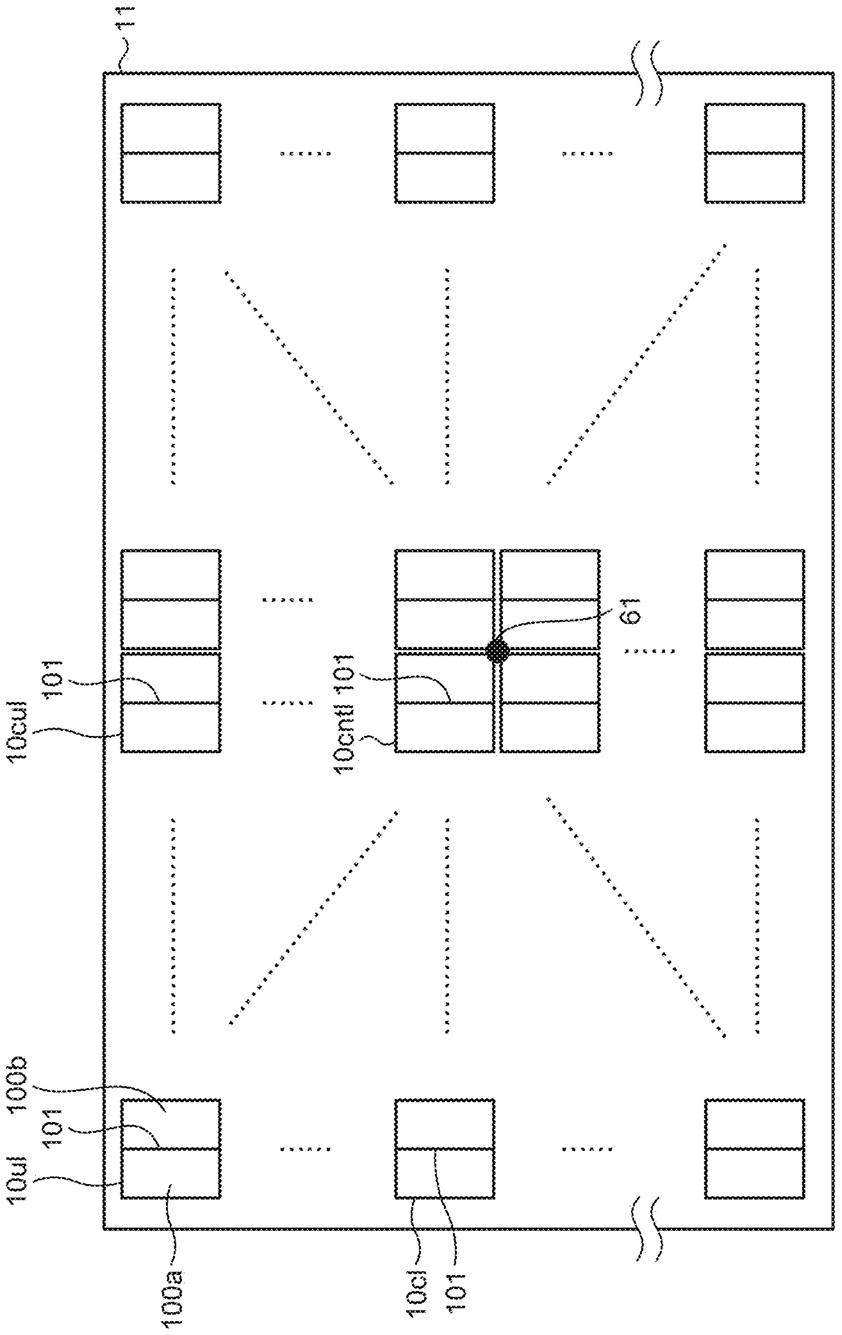
FIG. 8 is a schematic view depicting an example of arrangement of pixels for a pixel array unit according to the existing technology.

Prior to the description of the first embodiment, arrangement according to the existing technology will be described for easy understanding. FIG. 8 is a schematic view depicting an example of arrangement of the pixels 10 for the pixel array unit 11 according to the existing technology. In FIG. 8, the center of the pixel array unit 11 is set to the position of the optical axis 61 of the main lens 60. If the number of pixels 10 included in the pixel array unit 11 is an even number in each of the row direction and the column direction of the matrix arrangement, the optical axis 61 comes to a position where, for example, four pixels 10 at the central portion of the pixel array unit 11 are in contact with one another.

Hereinafter, unless otherwise specified, a second quadrant in a case where the pixel array unit 11 is divided into two in each of the row direction and the column direction with the position of the optical axis 61 as the origin to obtain four quadrants (first to fourth quadrants) will be described as a target. Furthermore, in the second quadrant, a direction parallel to the column direction of the matrix arrangement of the pixels 10 is set as the angle θ=0°, and the angle θ is defined clockwise in the drawing. The other quadrants can be handled by changing the angle value and the like in the description of the second quadrant for each quadrant.

In FIG. 8, a pixel 10 of the second quadrant that corresponds to the position of the optical axis 61 is defined as a pixel 10*cntl*, and a pixel 10 at an end (left end) of the pixel array unit 11 in the row direction from the pixel 10*cntl* is defined as a pixel 10*cl*. Furthermore, a pixel 10 at the upper left corner of the pixel array unit 11 in the drawing is defined as a pixel 10*ul*, and a pixel 10 at an end (upper end) of the pixel array unit 11 in the column direction from the pixel 10*cntl* is defined as a pixel 10*cul*.

In the existing technology, as depicted in FIG. 8, in the pixels 10*cntl*, 10*cl*, 10*ul*, and 10*cul* in the pixel array unit 11, the pupil separation portion 101 is parallel to the column direction, that is, the pupil separation portion 101 has the angle θ=0°. Furthermore, similarly, the angle θ of the pupil separation portion 101 is set to 0° for the other pixels 10 included in the pixel array unit 11.

According to the arrangement of the respective pixels 10 and the pupil separation portion 101 depicted in FIG. 8, there is a possibility that, in each pixel 10, color mixing occurs and the image quality is deteriorated due to mixing of the scattered light from adjacent pixels 10. Therefore, in the existing technology, the influence of the color mixing has been reduced by devising a phase difference acquisition method, a waveguide structure, a reading control method, and the like. However, with color mixing reduction measures according to the related arts, it is difficult to reduce the color mixing on the pixel separation surface.

Arrangement of Pupil Separation Portion According to First Embodiment

Figure 9:
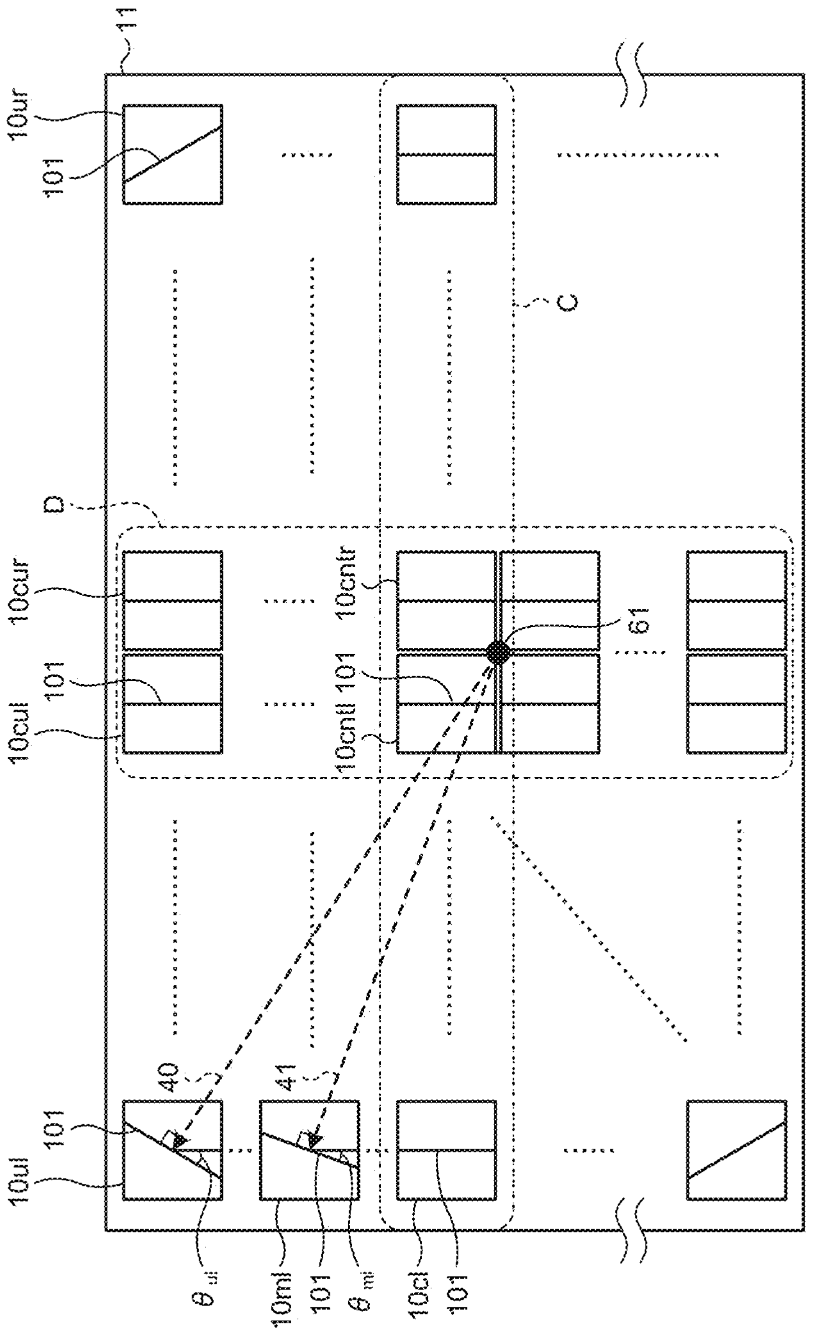
FIG. 9 is a schematic view depicting an example of arrangement of pixels for a pixel array unit according to a first embodiment.

FIG. 9 is a schematic view depicting an example of the arrangement of the pixels 10 for the pixel array unit 11 according to the first embodiment. In FIG. 9, the pupil separation portion 101 of the pixel 10*ul* is provided at an angle $\theta_{ul}$ of larger than 0° and smaller than 90° with respect to the column direction of the pixel array unit 11. More specifically, the pupil separation portion 101 of the pixel 10*ul* is provided substantially at a right angle with respect to a straight line 40 from the position of the optical axis 61 toward the center of the pixel 10*ul*. Furthermore, the pupil separation portion 101 is also provided at a right angle with respect to the straight line 40 for each pixel 10 (not depicted) arranged corresponding to the straight line 40 between the pixel 10*ul* and the pixel 10*cnt*.

Meanwhile, in the pixel 10*cntl* and the pixel cl, the pupil separation portion 101 is provided in parallel to the column direction, that is, the pupil separation portion 101 is provided at the angle θ=0°. Similarly, the pupil separation portion 101 is provided at the angle θ=0° also in a pixel 10*cntr* arranged to the right of the pixel 10*cntl* in the drawing.

Furthermore, in a pixel 10*ml* arranged between the pixel 10*ul* and the pixel 10*cl* at the left end of the pixel array unit 11, the pupil separation portion 101 is provided at an angle $\theta_{ml}$ larger than 0° and smaller than 90° and smaller than the angle $\theta_{ul}$. More specifically, similarly to the pixel 10*ul* described above, the pupil separation portion 101 of the pixel 10*ml* is provided at a right angle with respect to a straight line 41 from the position of the optical axis 61 toward the center of the pixel 10*ml*. Also in this case, the pupil separation portion 101 is provided at a right angle with respect to the straight line 41 for each pixel 10 (not depicted) arranged corresponding to the straight line 40 between the pixel ml and the pixel 10*cntl*.

For each pixel 10 (not depicted) arranged between the pixel 10*ul* and the pixel 10*cul*, the pupil separation portion 101 is provided in such a way that the angle θ decreases as approaching from the pixel 10*ul* to the pixel 10*cul*.

Furthermore, in the pixels 10 (not depicted) including the pixel 10*cl*, which are indicated as a range C in FIG. 9 and are arranged in the row direction with respect to the pixel 10*cntl* whose arrangement position corresponds to the optical axis 61, the pupil separation portion 101 has the angle θ=0°. Similarly, also in the pixels 10 (not depicted) including the pixels 10*cul* and 10*cur*, which are indicated as a range D in FIG. 9 and are arranged in the column direction with respect to the pixels 10*cntl* and 10*cntr* whose arrangement positions correspond to the optical axis 61, respectively, the pupil separation portion 101 has the angle θ=0°.

In this manner, the pupil separation portions 101 of the pixels 10*ul* and 10*ml* are arranged to be inclined to the right, that is, toward the position of the optical axis 61 of the pixel array unit 11 by the angles $\theta_{ul}$ and $\theta_{ml}$, respectively. Similarly, in a pixel 10*ur* arranged at the upper right corner of the first quadrant in the drawing, the pupil separation portion 101 is arranged to be inclined toward the position of the optical axis 61 at the angle θ counterclockwise in the drawing.

Here, the angle θ in each of the first to fourth quadrants will be briefly described. In a case where the angle θ parallel to the column direction of the pixel array unit 11 is set to 0°, for example, in the second quadrant, the angle θ exceeds 0° and is smaller than 90° clockwise. In the first quadrant, the angle θ is larger than 0° and smaller than 90° counterclockwise. In the third quadrant, the angle θ is larger than 0° and smaller than 90° clockwise. In the fourth quadrant, the angle θ is larger than 0° and smaller than 90° counterclockwise. In other words, the angle θ is set in such a way that one separation surface of the pupil separation portion 101 faces the optical axis 61.

In the following description, in a case where it is not necessary to particularly distinguish the pixels 10*cntl*, 10*cntr*, 10*cl*, 10*ml*, 10*ul*, 10*cul*, 10*cur*, and the like, these are collectively referred to as the pixel 10, if appropriate.

Figure 10:
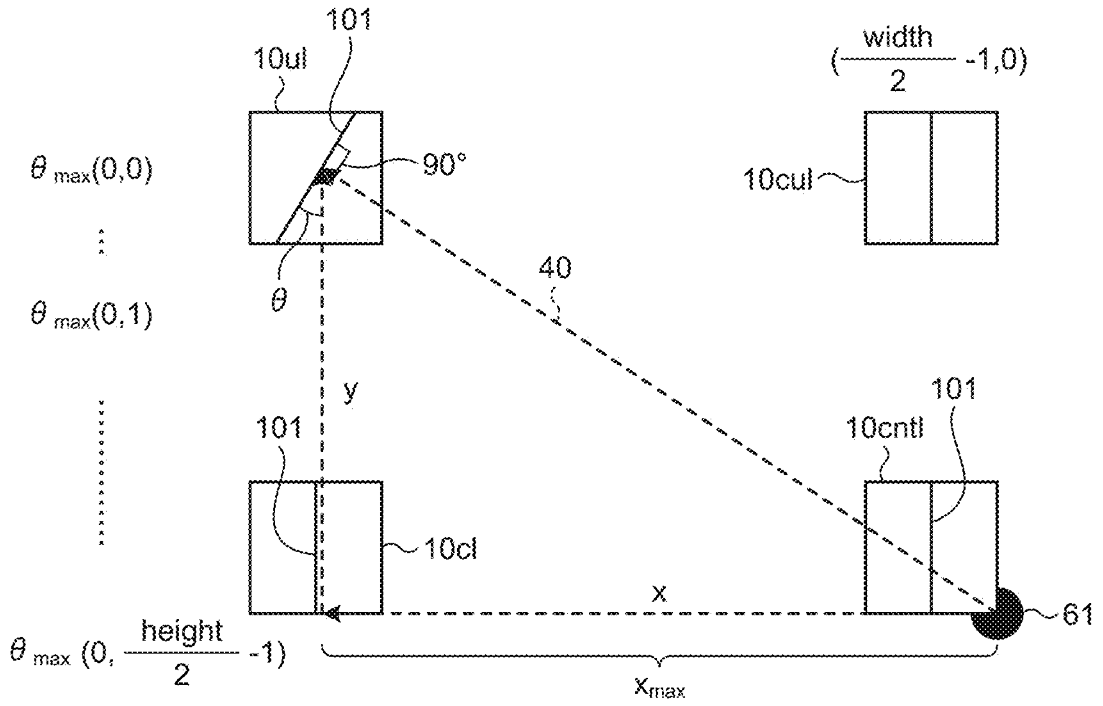
FIG. 10 is a schematic view for describing a definition of an angle 0 according to the first embodiment.

FIG. 10 is a schematic view for describing a definition of the angle θ according to the first embodiment.

In FIG. 10, coordinates (i,j) indicate coordinates of each pixel 10 in the pixel array unit 11 with the position of the pixel ul at the upper left corner of the pixel array unit 11 as the origin in units of the pixels 10. The values i and j correspond to the positions in the row direction and the column direction of the pixel array unit 11, respectively. In the second quadrant, the value j increases from the origin in the y direction (downward in the drawing), and the value i increases in the x direction (rightward in the drawing). Furthermore, values [height] and [width] indicate the height and the width of the pixel array unit 11 in units of the pixels 10, respectively. Furthermore, an angle $\theta_{max}$ indicates the maximum value of the angle θ of the pupil separation portion 101 in the pixel 10 at the position indicated by the coordinates (i,j). Furthermore, a value x indicates a distance from the position of the optical axis 61 in the horizontal direction (row direction) for the coordinates (i,j) in units of, for example, [millimeters (mm)], and a value y indicates a distance from the position of the optical axis 61 in the vertical direction (column direction) for coordinates (0,j) in units of, for example, [mm]. A value $x_{max}$ indicates the maximum value of the value x.

In FIG. 10, for example, the position of the pixel 10*cul* is set to coordinates (width/2−1,0), and the position of the pixel 10*cl* is set to coordinates (0,height/2−1).

In a case where the pupil separation portion 101 is provided at a right angle with respect to a straight line from the position of the optical axis 61 toward the center of the target pixel 10, the angle $\theta_{max}$ at the position j in the column direction is defined by the following Formula (1).

$$\theta_{max}(0, j) = \tan^{-1}\frac{y}{x_{max}} \tag{1}$$

Furthermore, the angle θ in each pixel 10 toward the center of the pixel array unit 11, that is, the position of the optical axis 61, is defined by the following Formula (2).

$$\theta(i, j) = \frac{x}{x_{max}} \cdot \theta_{max}(0, j) \tag{2}$$

As an example, in a case where an aspect ratio of the pixel array unit 11 is 4:3, the angle $\theta_{max}$=36.87° by the above-described Formulas (1) and (2). In addition, the angle $\theta_{max}$ decreases as the distance from the position of the optical axis 61 in the column direction decreases, and approaches 0°. The first, third, and fourth quadrants are based on the calculation result for the second quadrant.

In the actual pixel array unit 11, it may be difficult to provide the pupil separation portion 101 at the angle θ obtained by the calculation as described above due to manufacturing inconsistency and the like. Therefore, the angle θ of the actual pupil separation portion 101 preferably allows a predetermined margin for the angle θ calculated on the basis of Formulas (1) and (2). As the margin in this case, for example, it is conceivable to use the minimum value capable of tolerating manufacturing inconsistency.

Figure 11:
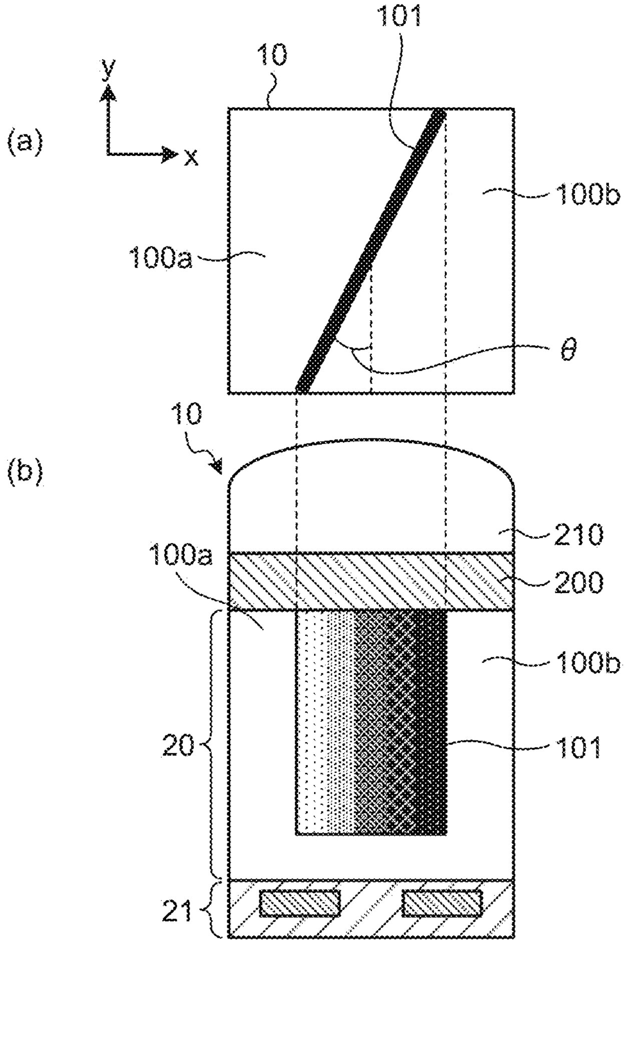
FIG. 11 is a schematic view schematically depicting a structure of an example of a pixel according to the first embodiment.

FIG. 11 is a schematic view schematically depicting a structure of an example of the pixel 10 according to the first embodiment. A section (a) of FIG. 11 is a plan view of an example of the pixel 10 according to the embodiment as viewed from the incident surface side, and a section (b) of FIG. 11 is a view of the pixel 10 as viewed from a direction perpendicular to the incident surface of the pixel 10. The section (b) depicts an example of the pixel 10 as viewed from a lower end side in the plan view in the section (a).

The structure depicted in FIG. 11 corresponds to the structure depicted in FIG. 6A described above, and as depicted in the section (a) of FIG. 11, in the pixel 10 according to the first embodiment, the pupil separation portion 101 is provided at the angle θ corresponding to the arrangement position in the pixel array unit 11 with respect to a direction parallel to the column direction, on the basis of Formulas (1) and (2) described above. In the planar structure viewed from the incident surface side, the pupil separation portion 101 is provided in such a way as to penetrate from one end of the pixel 10 toward the other end opposite to the one end. The pupil separation portion 101 divides the pixel 10 into a left side and a right side in the drawing, and the divided left side is a photodiode (PD) 100*a* corresponding to the photoelectric transformation element 1200, for example, and the right side is a PD 100*b* corresponding to the photoelectric transformation element 1210, for example.

As depicted in the section (b) of FIG. 11, the pupil separation portion 101 is depicted with a width corresponding to the angle θ, for example, in a cross section in which the lower side in the section (a) corresponds to the front side. Furthermore, in the first embodiment, the pupil separation portion 101 is provided from the incident surface of the semiconductor layer 20 toward the surface opposite to the incident surface, that is, the wiring layer 21, while having a gap from the wiring layer 21. In other words, the pupil separation portion 101 is provided from the incident surface of the semiconductor layer 20 toward the wiring layer 21 in such a way that a part of the semiconductor layer 20 is sandwiched between the pupil separation portion 101 and the wiring layer 21.

As described above, in the first embodiment, the pupil separation portion 101 is provided in the pixel 10 at the angle θ corresponding to the position of the pixel 10 in the pixel array unit 11. Therefore, the influence of the color mixing can be reduced as compared with the pixel 10 according to the existing technology. In addition, it is possible to achieve both reduction of the influence of the color mixing, improvement of the QE, and the autofocus control by the image plane phase difference AF method.

3-1. First Modified Example of First Embodiment

Next, a first modified example of the first embodiment will be described. The first modified example of the first embodiment and second to eleventh modified examples of the first embodiment to be described later each relate to the structure of the pupil separation portion 101.

Figure 12A:
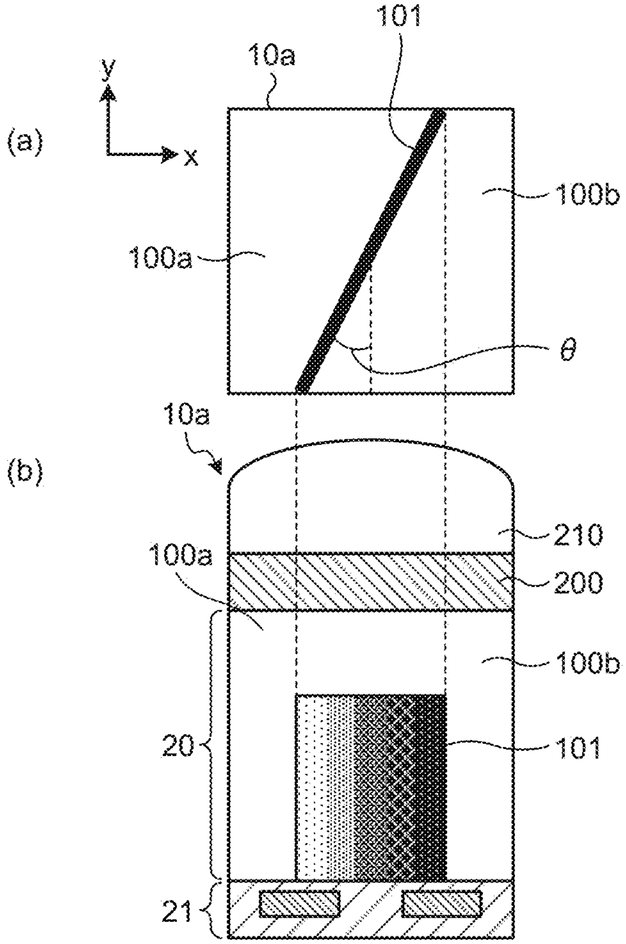
FIG. 12A is a schematic view schematically depicting a structure of an example of a pixel according to a first modified example of the first embodiment.

FIG. 12A is a schematic view schematically depicting a structure of an example of a pixel 10*a* according to the first modified example of the first embodiment.

A section (a) of FIG. 12A is a plan view of an example of the pixel 10*a* according to the first embodiment as viewed from the incident surface side, and a section (b) of FIG. 12A is a view of the pixel 10 as viewed from a direction perpendicular to the incident surface of the pixel 10*a*. The section (b) depicts an example of the pixel 10*a* as viewed from a lower end side in the plan view in the section (a).

In FIGS. 12B to 12D, FIGS. 13A and 13B, and FIGS. 14A to 14E described later, the meanings of sections (a) and (b) are similar to the meanings of the sections (a) and (b) of FIG. 12A, and thus, a description of the meanings of the sections (a) and (b) will be omitted below.

In FIG. 12A, the planar structure of the pupil separation portion 101 as viewed from the incident surface side depicted in the section (a) is similar to the structure depicted in the section (a) of FIG. 11 described above, and thus a description thereof will be omitted here.

As depicted in the section (b) of FIG. 12A, in the first modified example of the first embodiment, the pupil separation portion 101 is provided from the surface that is in contact with the wiring layer 21 toward the incident surface while having a gap from the incident surface. In other words, the pupil separation portion 101 is provided from the surface that is in contact with the wiring layer 21 toward the incident surface of the semiconductor layer 20 in such a way that a part of the semiconductor layer 20 is sandwiched between the pupil separation portion 101 and the wiring layer 21.

3-2. Second Modified Example of First Embodiment

Figure 12B:
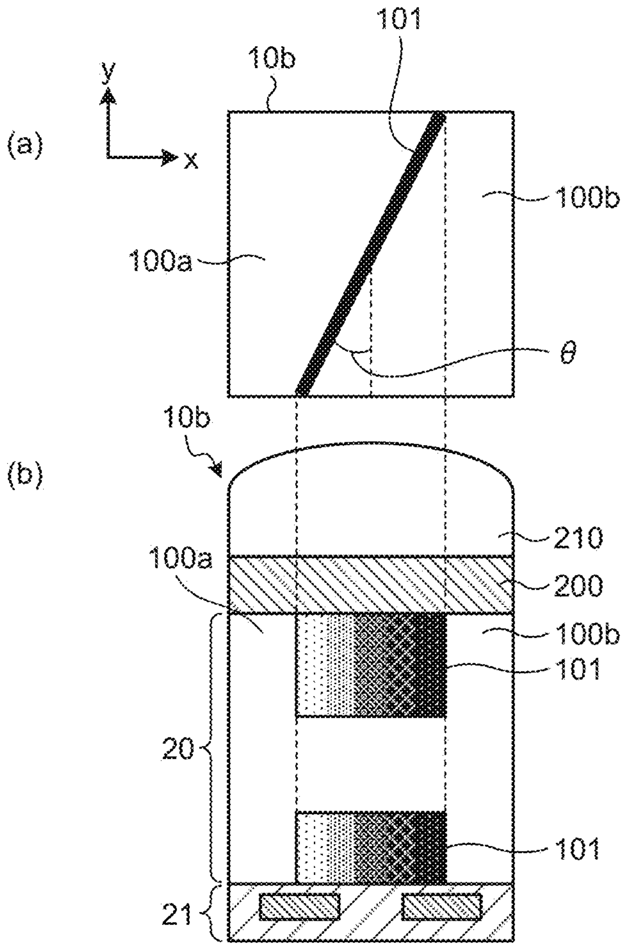
FIG. 12B is a schematic view schematically depicting a structure of an example of a pixel according to a second modified example of the first embodiment.

Next, the second modified example of the first embodiment will be described. FIG. 12B is a schematic view schematically depicting a structure of an example of a pixel 10*b* according to the second modified example of the first embodiment.

In FIG. 12B, the planar structure of the pupil separation portion 101 as viewed from the incident surface side depicted in the section (a) is similar to the structure depicted in the section (a) of FIG. 11 described above, and thus a description thereof will be omitted here.

As depicted in the section (b) of FIG. 12B, the pupil separation portion 101 according to the second modified example of the first embodiment is provided from the incident surface of the semiconductor layer 20 to the surface that is in contact with the wiring layer 21 while having a gap at the middle portion of the semiconductor layer 20. In other words, the pupil separation portion 101 is provided from the surface that is in contact with the wiring layer 21 to the incident surface of the semiconductor layer 20 in such a way that a part of the semiconductor layer 20 is sandwiched at the middle portion of the semiconductor layer 20.

3-3. Third Modified Example of First Embodiment

Figure 12C:
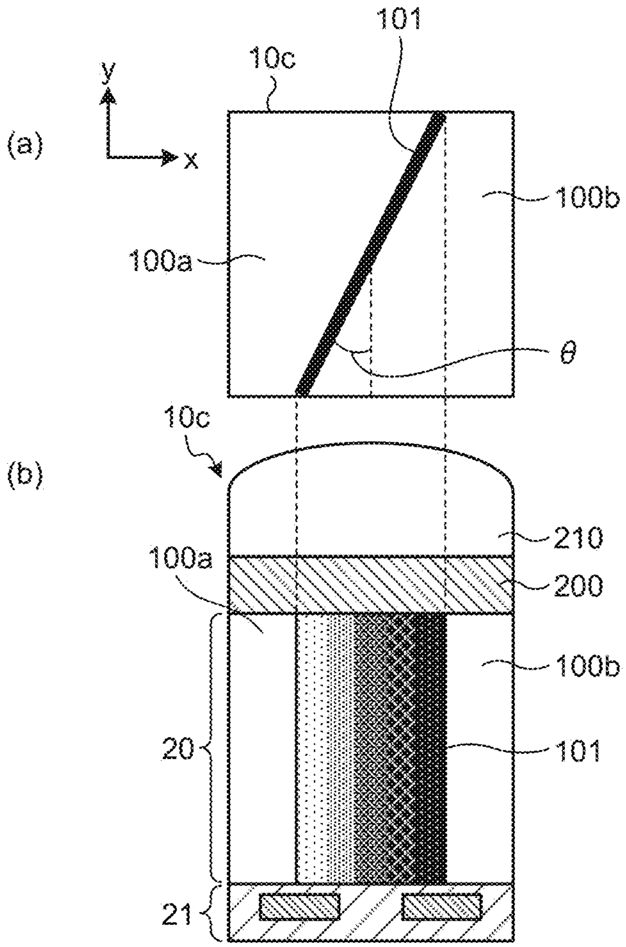
FIG. 12C is a schematic view schematically depicting a structure of an example of a pixel according to a third modified example of the first embodiment.

Next, the third modified example of the first embodiment will be described. FIG. 12C is a schematic view schematically depicting a structure of an example of a pixel 10*c* according to the third modified example of the first embodiment.

In FIG. 12C, the planar structure of the pupil separation portion 101 as viewed from the incident surface side depicted in the section (a) is similar to the structure depicted in the section (a) of FIG. 11 described above, and thus a description thereof will be omitted here.

As depicted in the section (b) of FIG. 12C, in the third modified example of the first embodiment, the pupil separation portion 101 is provided to penetrate through the semiconductor layer 20 from the surface that is in contact with the wiring layer 21 to the incident surface.

In this example, the floating diffusion layer 1221 is preferably provided in each of the transfer transistors 1201 and 1211 corresponding to the PDs 100*a* and 100*b*, respectively.

3-4. Fourth Modified Example of First Embodiment

Figure 12D:
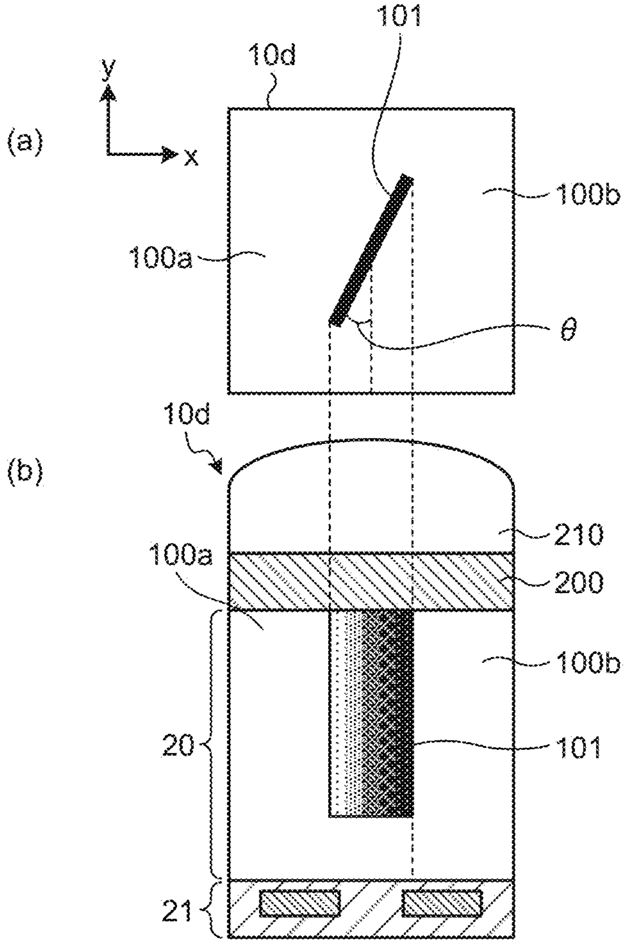
FIG. 12D is a schematic view schematically depicting a structure of an example of a pixel according to a fourth modified example of the first embodiment.

Next, the fourth modified example of the first embodiment will be described. FIG. 12D is a schematic view schematically depicting a structure of an example of a pixel 10*d* according to the fourth modified example of the first embodiment.

In FIG. 12D, the planar structure of the pupil separation portion 101 as viewed from the incident surface side depicted in the section (a) is provided from one end of the pixel 10*d* toward the other end opposite the one end at the angle θ corresponding to the position of the pixel 10*d* in the pixel array unit 11, similarly to the structure depicted in the section (a) of FIG. 11 described above. Here, in the pixel 10*d*, the pupil separation portion 101 is provided with gap from the one end of the pixel 10*d* and from the other end. In other words, in the fourth modified example of the first embodiment, the pupil separation portion 101 is provided in such a way that both ends of the planar structure of the pupil separation portion 101 do not in contact with outer edges of the pixel 10*d*.

3-5. Fifth Modified Example of First Embodiment

Figure 13A:
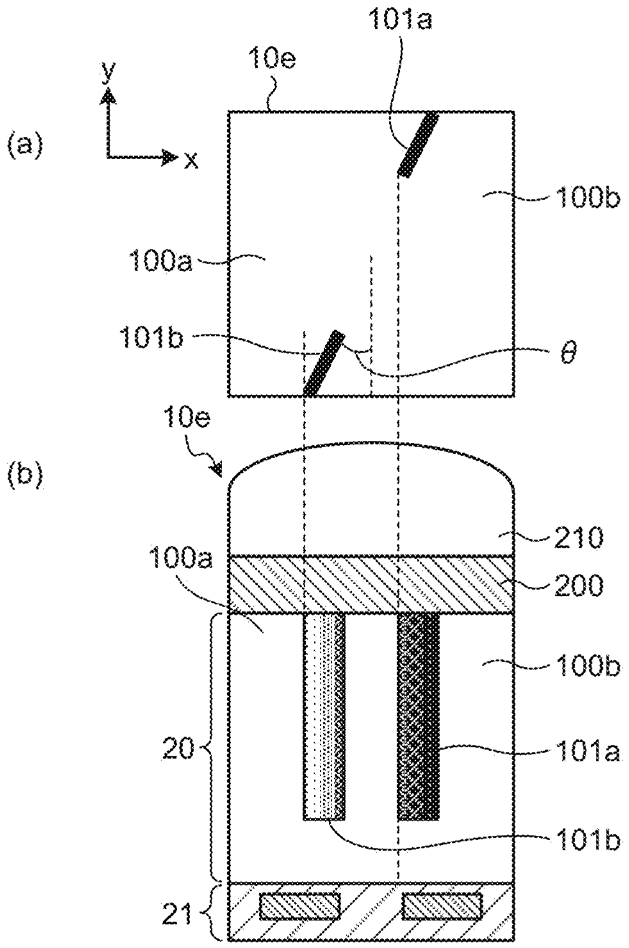
FIG. 13A is a schematic view schematically depicting a structure of an example of a pixel according to a fifth modified example of the first embodiment.

Next, the fifth modified example of the first embodiment will be described. FIG. 13A is a schematic view schematically depicting a structure of an example of a pixel 10*e* according to the fifth modified example of the first embodiment.

In FIG. 13A, in a planar structure of the pixel 10*e* depicted in the section (a) as viewed from the incident surface side, the pixel 10*e* includes a pupil separation portion 101*a* provided from one end of the pixel 10*e* and a pupil separation portion 101*b* provided from the other end opposite to the one end at the angle θ corresponding to the position of the pixel 10*e* in the pixel array unit 11. Each of the pupil separation portions 101*a* and 101*b* is provided in such a way as not to reach an intermediate position between the one end and the other end. In the fifth modified example of the first embodiment, the pupil separation portion 101*a* and the pupil separation portion 101*b* are provided on the same straight line.

As depicted in the section (b) of FIG. 13A, the pupil separation portions 101*a* and 101*b* are provided from the incident surface of the semiconductor layer 20 toward the wiring layer 21 with gaps from the wiring layer 21. In other words, each of the pupil separation portions 101*a* and 101*b* is provided from the incident surface of the semiconductor layer 20 toward the wiring layer 21 in such a way that a part of the semiconductor layer 20 is sandwiched between each of the pupil separation portions 101*a* and 101*b* and the wiring layer 21.

3-6. Sixth Modified Example of First Embodiment

Figure 13B:
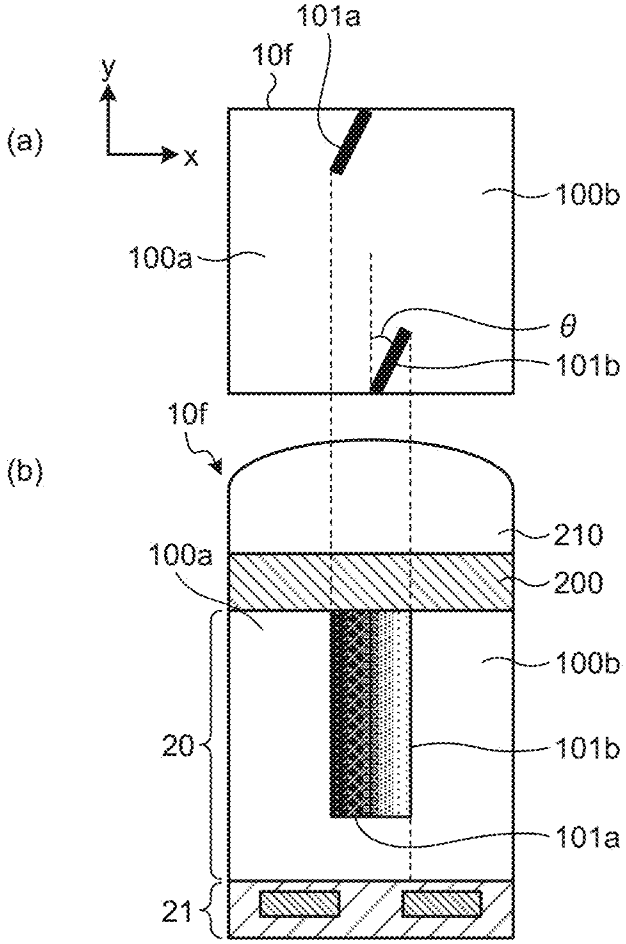
FIG. 13B is a schematic view schematically depicting a structure of an example of a pixel according to a sixth modified example of the first embodiment.

Next, the sixth modified example of the first embodiment will be described. FIG. 13B is a schematic view schematically depicting a structure of an example of a pixel 10*f* according to the sixth modified example of the first embodiment.

In FIG. 13B, in a planar structure of the pixel 10*e* depicted in the section (a) as viewed from the incident surface side, the pixel 10*f* includes a pupil separation portion 100*a* provided from one end of the pixel 10*f* and a pupil separation portion 100*b* provided from the other end opposite to the one end at the angle θ corresponding to the position of the pixel 10*f* in the pixel array unit 11, similarly to the section (a) of FIG. 13A described above. Each of the pupil separation portions 100*a* and 100*b* is provided in such a way as not to reach an intermediate position between the one end and the other end. In the sixth modified example of the first embodiment, the pupil separation portion 100*a* and the pupil separation portion 100*b* are provided on different straight lines.

As depicted in the section (b) of FIG. 13B, the pupil separation portions 101*a* and 101*b* are provided from the incident surface of the semiconductor layer 20 toward the wiring layer 21 with gaps from the wiring layer 21, similarly to the section (b) of FIG. 13A.

3-7. Seventh Modified Example of First Embodiment

Figure 14A:
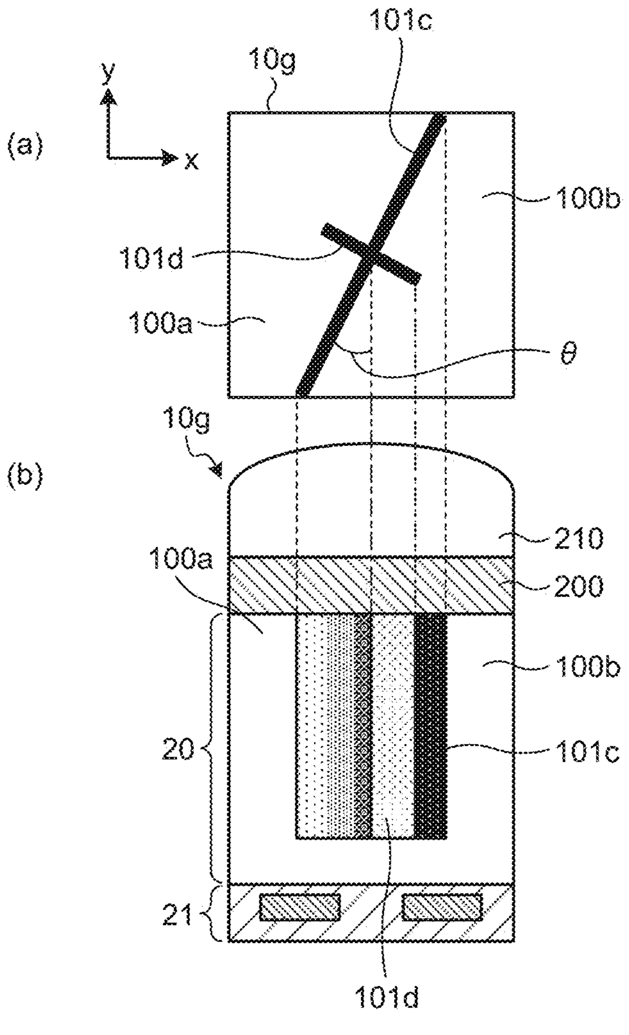
FIG. 14A is a schematic view schematically depicting a structure of an example of a pixel according to a seventh modified example of the first embodiment.

Next, the seventh modified example of the first embodiment will be described. FIG. 14A is a schematic view schematically depicting a structure of an example of a pixel 10*g* according to the seventh modified example of the first embodiment.

In FIG. 14A, as depicted in the section (a), the pixel 10*g* includes a pupil separation portion 101*c* and a pupil separation portion 101*d* intersecting with the pupil separation portion 101*c*. The pupil separation portion 101*c* is provided in such a way as to penetrate from one end of the pixel 10 toward the other end opposite to the one end at the angle θ corresponding to the position of the pixel 10*g* in the pixel array unit 11. On the other hand, the pupil separation portion 101*d* is shorter than the pupil separation portion 101*c*, and intersects with the pupil separation portion 101*d* at a right angle, for example.

As depicted in the section (b) of FIG. 14A, the pupil separation portions 101*c* and 101*d* are provided from the incident surface of the semiconductor layer 20 toward the wiring layer 21 with gaps from the wiring layer 21. In other words, each of the pupil separation portions 101*c* and 101*d* is provided from the incident surface of the semiconductor layer 20 toward the wiring layer 21 in such a way that a part of the semiconductor layer 20 is sandwiched between each of the pupil separation portions 101*c* and 101*d* and the wiring layer 21.

3-8. Eighth Modified Example of First Embodiment

Figure 14B:
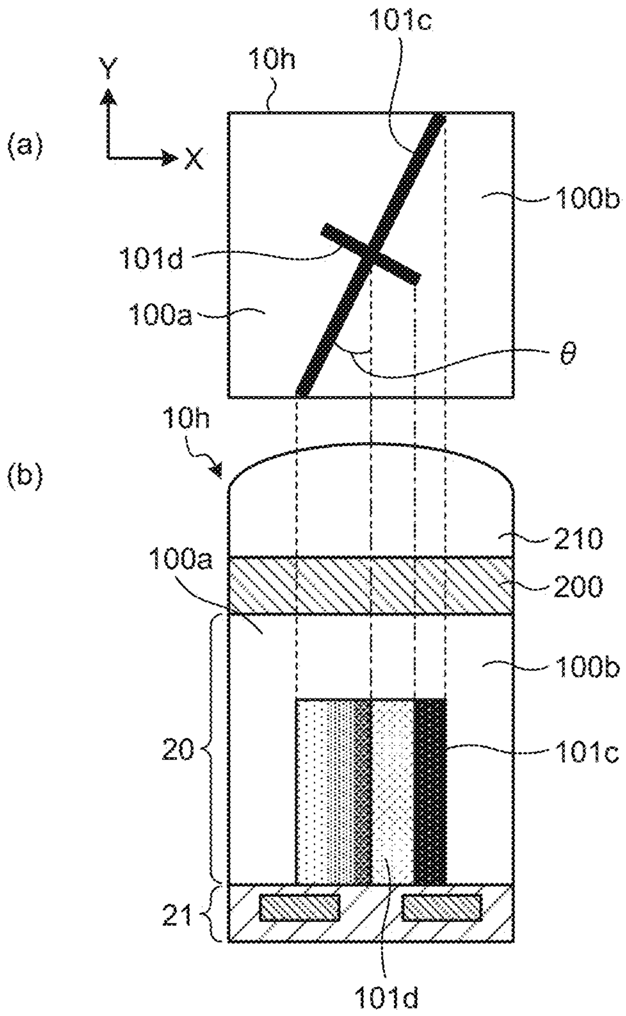
FIG. 14B is a schematic view schematically depicting a structure of an example of a pixel according to an eighth modified example of the first embodiment.

Next, the eighth modified example of the first embodiment will be described. FIG. 14B is a schematic view schematically depicting a structure of an example of a pixel 10*h* according to the eighth modified example of the first embodiment.

In FIG. 14B, planar structures of pupil separation portions 101*c* and 101*d* as viewed from the incident surface side depicted in the section (a) are similar to the structures depicted in the section (a) of FIG. 14A described above, and thus a description thereof will be omitted here.

As depicted in the section (b) of FIG. 14B, in the eighth modified example of the first embodiment, each of the pupil separation portions 101*c* and 101*d* is provided from the surface of the semiconductor layer 20 that is in contact with the wiring layer 21 toward the incident surface while having a gap from the incident surface.

3-9. Ninth Modified Example of First Embodiment

Figure 14C:
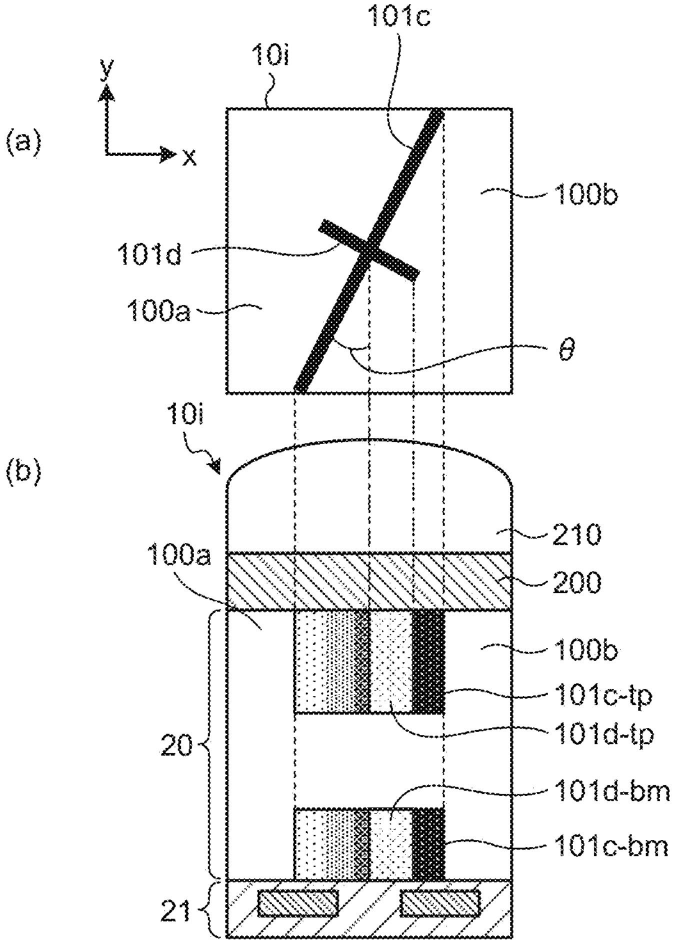
FIG. 14C is a schematic view schematically depicting a structure of an example of a pixel according to a ninth modified example of the first embodiment.

Next, the ninth modified example of the first embodiment will be described. FIG. 14C is a schematic view schematically depicting a structure of an example of a pixel 10*i* according to the ninth modified example of the first embodiment.

In FIG. 14C, planar structures of pupil separation portions 101*c* and 101*d* as viewed from the incident surface side depicted in the section (a) are similar to the structures depicted in the section (a) of FIG. 14A described above, and thus a description thereof will be omitted here.

As depicted in the section (b) of FIG. 14C, in the ninth modified example of the first embodiment, the pupil separation portions 101*c* and 101*d* are each provided from the incident surface of the semiconductor layer 20 to the surface that is in contact with the wiring layer 21 while having a gap at the middle portion of the semiconductor layer 20. In the example of the section (b) of FIG. 14C, a portion of the pupil separation portion 101*c* on the incident surface side is depicted as a pupil separation portion 101*c-tp*, and a portion of the pupil separation portion 101*c* on a wiring layer 21 side is depicted as a pupil separation portion 10*c-bm*. Similarly, a portion of the pupil separation portion 101*d* on the incident surface side is depicted as a pupil separation portion 101*d-tp*, and a portion of the pupil separation portion 101*d* on the wiring layer 21 side is depicted as a pupil separation portion 10*d-bm*.

3-10. Tenth Modified Example of First Embodiment

Figure 14D:
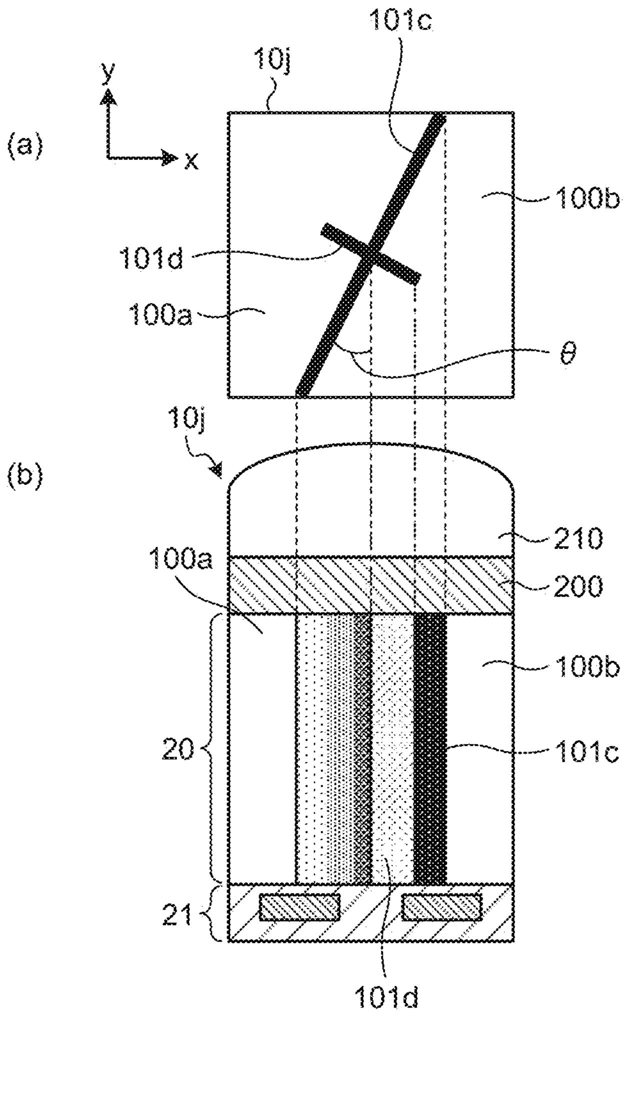
FIG. 14D is a schematic view schematically depicting a structure of an example of a pixel according to a tenth modified example of the first embodiment.

Next, the tenth modified example of the first embodiment will be described. FIG. 14D is a schematic view schematically depicting a structure of an example of a pixel 10*j* according to the tenth modified example of the first embodiment.

In FIG. 14D, planar structures of pupil separation portions 101*c* and 101*d* as viewed from the incident surface side depicted in the section (a) are similar to the structures depicted in the section (a) of FIG. 14A described above, and thus a description thereof will be omitted here.

As depicted in the section (b) of FIG. 14D, in the tenth modified example of the first embodiment, each of the pupil separation portions 101*c* and 101*d* is provided to penetrate from the incident surface of the semiconductor layer 20 to the surface that is in contact with the wiring layer 21.

In this example, the floating diffusion layer 1221 is preferably provided in each of the transfer transistors 1201 and 1211 corresponding to the PDs 100*a* and 100*b*, respectively.

3-11. Eleventh Modified Example of First Embodiment

Figure 14E:
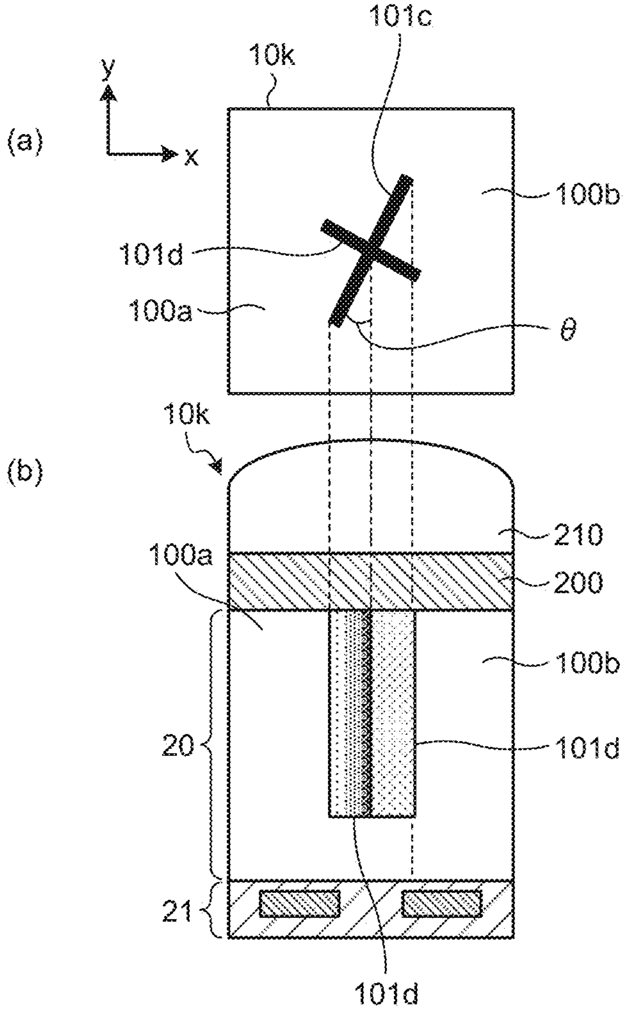
FIG. 14E is a schematic view schematically depicting a structure of an example of a pixel according to an eleventh modified example of the first embodiment.

Next, the eleventh modified example of the first embodiment will be described. FIG. 14E is a schematic view schematically depicting a structure of an example of a pixel 10*k* according to the eleventh modified example of the first embodiment.

In FIG. 14E, in planar structures of pupil separation portions 101*c* and 101*d* depicted in the section (a) as viewed from the incident surface side, the pupil separation portion 101*c* is provided with gaps between the pupil separation portion 101*c* and one end of the pixel 10*k* and the pupil separation portion 101*c* and the other end of the pixel 10*k*, similarly to the pupil separation portion 101 in FIG. 12D. Also in this case, the pupil separation portion 101*d* is shorter than the pupil separation portion 101*c*, and intersects with the pupil separation portion 101*d* at a right angle, for example.

As depicted in the section (b) of FIG. 14E, the pupil separation portions 101*c* and 101*d* are provided from the incident surface of the semiconductor layer 20 toward the wiring layer 21 with gaps from the wiring layer 21.

4. Second Embodiment

Next, a second embodiment of the present disclosure will be described. The second embodiment is an example in which a pupil separation portion 101 is provided at an angle θ corresponding to an arrangement position in each pixel 10 arranged along an optical axis 61. More specifically, the pupil separation portion 101 is provided at the angle θ corresponding to the arrangement position in a pixel 10*cul* at an end (referred to as an upper end) of a pixel array unit 11 in a column direction from a pixel 10*cntl* in a second quadrant corresponding to the position of the optical axis 61, and each pixel 10 arranged between the pixel 10*cntl* and the pixel 10*cul*.

Figure 15:
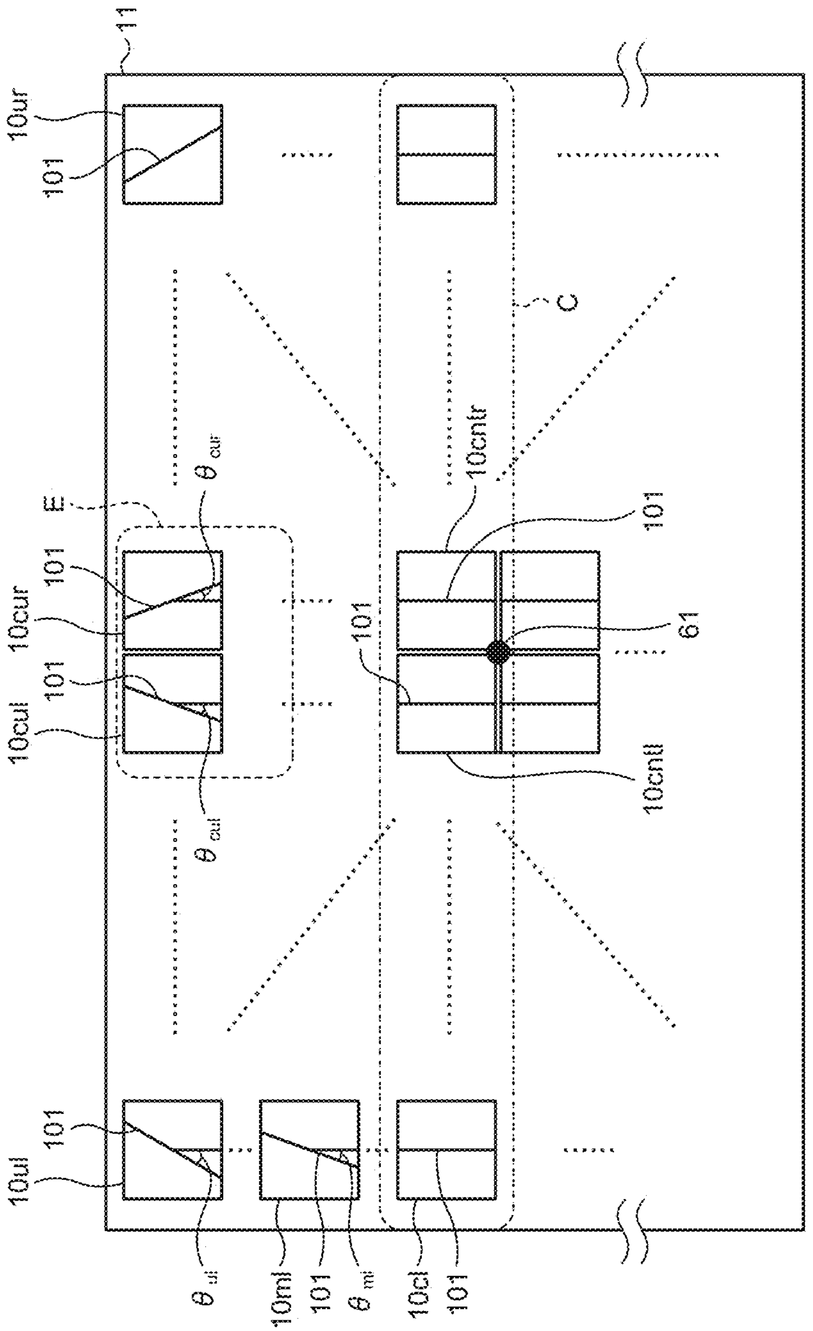
FIG. 15 is a schematic view depicting an example of arrangement of pixels for a pixel array unit according to a second embodiment.

FIG. 15 is a schematic view depicting an example of arrangement of the pixels 10 for the pixel array unit 11 according to the second embodiment. As depicted in FIG. 15, in the pixel 10*cul*, the pupil separation portion 101 is provided at an angle $\theta_{cul}$ clockwise with respect to a direction parallel to the column direction of the pixel array unit 11. Similarly, in a pixel 10*cur*, the pupil separation portion is provided at an angle $\theta_{cur}$ counterclockwise with respect to the direction parallel to the column direction of the pixel array unit 11.

Figure 16:
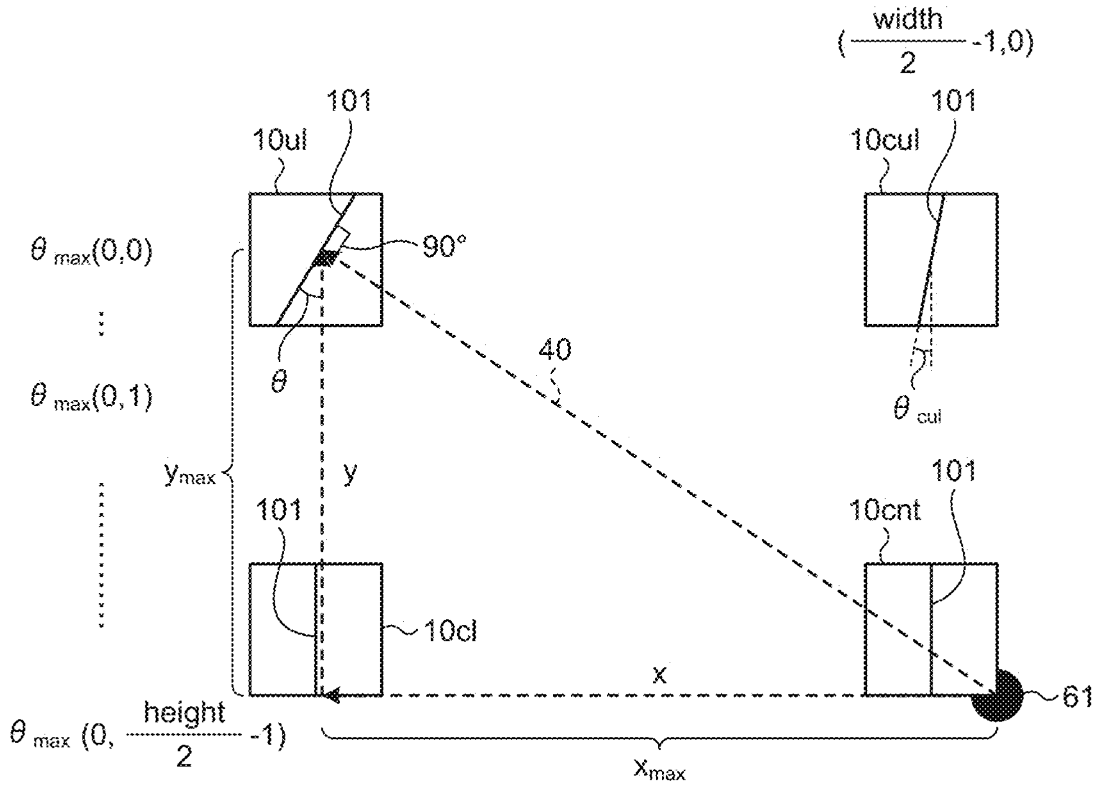
FIG. 16 is a schematic view for describing a definition of an angle 0 according to the second embodiment.

FIG. 16 is a schematic view for describing a definition of the angle θ according to the second embodiment. In FIG. 16, a description of values common to the values described in FIG. 10 will be omitted here.

In the second quadrant, the angle θ with respect to each of pixels 10*ul* to 10*cl* at the left end can be obtained by Formula (1) described above.

In the second quadrant, an angle $\theta_v$ of the pupil separation portion 101 in each pixel 10 arranged in the column direction along the position of the optical axis 61 is defined by the following Formulas (3) and (4). In Formula (3), an angle $\theta_{min}$ is the minimum value of the angle θ. In Formula (4), a value $y_{max}$ is the maximum value of a value y, and an angle $\theta_{valid}$ is the maximum value of a preset angle θ.

$$\theta_{min}\left(\frac{\text{width}-1}{2}, j\right) = \theta_v(j) \tag{3}$$

$$\theta_v(i, j) = \frac{y}{y_{max}} \cdot \theta_{valid} \tag{4}$$

For a pixel 10 at an arbitrary arrangement position (i,j) included in the pixel array unit 11, the clockwise (in a case of the second quadrant) angle θ(i,j) of the pupil separation portion 101 provided in the pixel 10 is obtained by the following Formula (5). Formula (5) indicates that the angle θ of the pupil separation portion 101 in the pixel 10 (for example, the pixel 10*cntl*) at the arrangement position corresponding to the position of the optical axis 61 and the angle θ of the pupil separation portion 101 in the pixel 10 (for example, the pixel 10*cl*, 10*ml*, or 10*ul*) at an end portion of the pixel array unit 11 are blended on the basis of the arrangement position of the pixel 10 in the x direction. Therefore, the angle θ of the pupil separation portion 101 in the pixel 10 increases as the distance from the optical axis 61 increases.

$$\theta(i, j) = \frac{x}{x_{max}} \cdot \theta_{max}(0, j) + \left(1 - \frac{x}{x_{max}}\right) \cdot \theta_{min}\left(\frac{\text{width}-1}{2}, j\right) \tag{5}$$

As described above, by providing the pupil separation portion 101 at the angle θ in each pixel 10 arranged in the column direction from the position of the optical axis 61, for example, it is possible to acquire a separation ratio with respect to the vertical direction (column direction) for a pixel 10 on a high image height side (for example, the pixels 10*cul* and 10*cur*) indicated by a range E in FIG. 15.

Also in this case, the actual angle θ of the pupil separation portion 101 preferably allows a predetermined margin for the angle θ calculated on the basis of Formulas (3) to (5) in order to tolerate manufacturing inconsistency of the pixel array unit 11 and the like.

4-1. Modified Example of Second Embodiment

Next, a modified example of the second embodiment will be described. According to the modified example of the second embodiment, the angle θ of the pupil separation portion 101 in a pixel 10 having a high image height among the pixels 10 arranged in the column direction from the position of the optical axis 61 is made larger than that in the above-described second embodiment. As a more specific example, in the pixels 10*cul* and 10*cur* arranged at the end portion in the column direction from the position of the optical axis 61, the angle θ of the pupil separation portion 101 is set to 90°.

Figure 17:
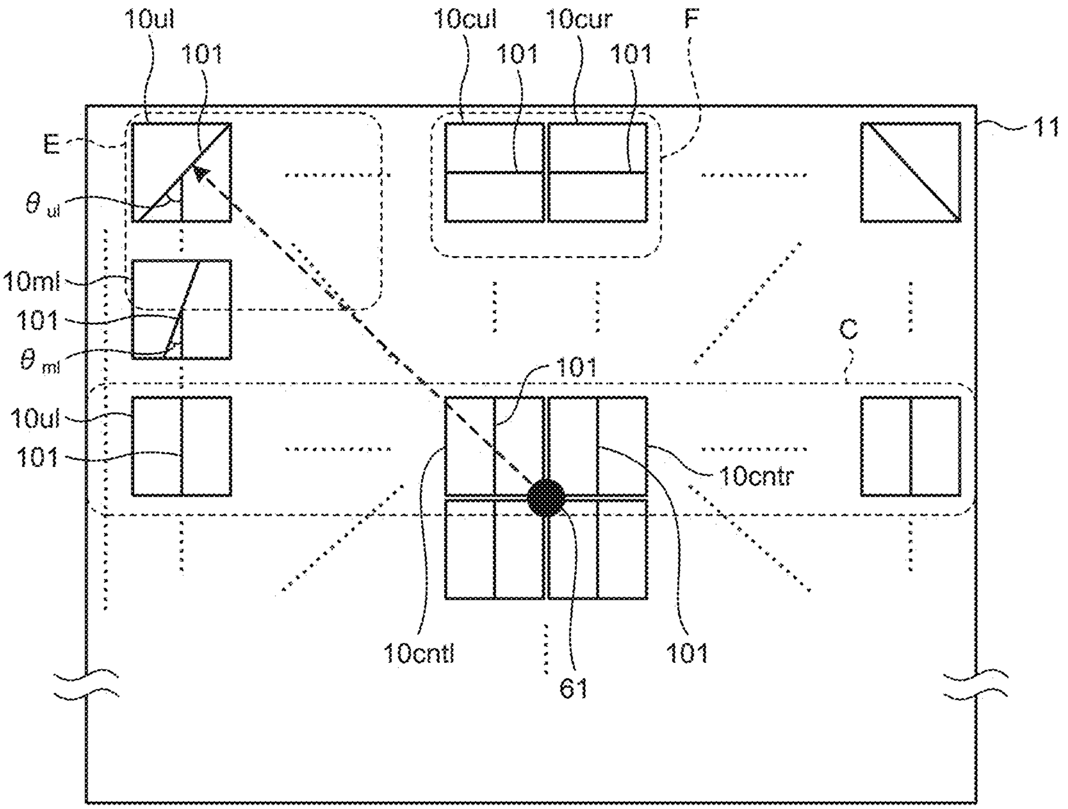
FIG. 17 is a schematic view depicting an example of arrangement of pixels for a pixel array unit according to a modified example of the second embodiment.

FIG. 17 is a schematic view depicting an example of arrangement of the pixels 10 for the pixel array unit 11 according to the modified example of the second embodiment. As depicted in FIG. 17, in the pixel 10*cul*, the pupil separation portion 101 is provided at the angle θ of 90° with respect to a direction parallel to the column direction of the pixel array unit 11. Similarly, in the pixel 10*cur*, the pupil separation portion is provided at the angle θ of 90° with respect to the direction parallel to the column direction of the pixel array unit 11.

Here, in a case where an aspect ratio of the pixel array unit 11 is 1:1, the angle θ of the pupil separation portion 101 in the pixel 10 at the arbitrary arrangement position (i.j) included in the pixel array unit 11 is obtained by the following Formula (6). In Formula (6), the meanings of the value y and the value $x_{max}$ are the same as the meanings described in FIG. 10, and thus, a description thereof here will be omitted.

$$\theta(i, j) = \tan^{-1}\frac{y}{x_{max}} \quad (6)$$

As described above, for example, it is possible to acquire the separation ratio with respect to the vertical direction (column direction) for a pixel 10 on the high image height side (for example, the pixels 10*cul* and 10*cur*) indicated by a range F in FIG. 17.

Also in this case, the actual angle θ of the pupil separation portion 101 preferably allows a predetermined margin for the angle θ calculated on the basis of Formula (6) in order to tolerate manufacturing inconsistency of the pixel array unit 11 and the like.

Figure 18A:
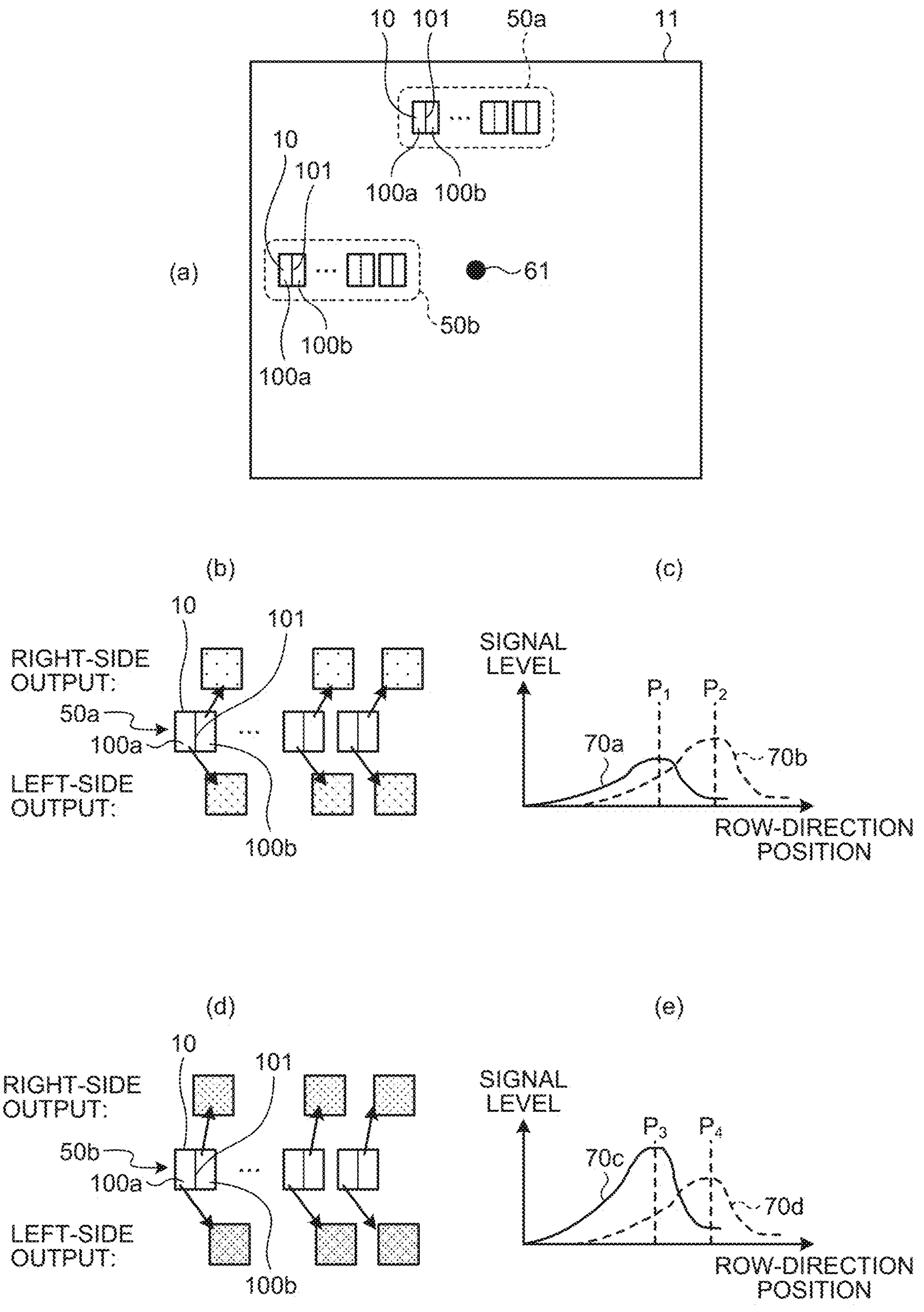
FIG. 18A is a schematic diagram for describing phase difference acquisition processing in a case where an angle θ of a pupil separation portion is set to 0° with respect to a column direction, which corresponds to the existing technology.

Phase difference acquisition processing in a case where the angle θ of the pupil separation portion 101 is set to 90° with respect to the column direction in the modified example of the second embodiment will be described. FIG. 18A is a schematic diagram for describing the phase difference acquisition processing in a case where the angle θ of the pupil separation portion 101 is set to 0° with respect to the column direction, which corresponds to the existing technology.

In the existing technology, as depicted in a section (a) of FIG. 18A, in each pixel 10 arranged to be aligned in the row direction, for example, in a region 50*a* at an end portion in the column direction with respect to the position of the optical axis 61 of the pixel array unit 11, and each pixel 10 arranged to be aligned in the row direction, for example, in a region 50*b* in the row direction, the pupil separation portion 101 is provided in a direction parallel to the column direction (the angle θ=0°.

In the region 50*a*, as depicted in a section (b) of FIG. 18A, for example, a signal level is detected with an output of a PD 100*a* of each pixel 10 as a left-side output and an output of a PD 100*b* as a right-side output. A section (c) of FIG. 18A schematically depicts an example of a relationship between a signal level 70*a* of the left-side output and a signal level 70*b* of the right-side output of each pixel 10 in the section (b), and a row-direction position of each pixel 10. A difference between a row-direction position of a peak $P_1$ of the signal level 70*a* and a row-direction position of a peak $P_2$ of the signal level 70*b* is acquired as a phase difference.

The same applies to the region 50*b* like the region 50*a*. That is, as depicted in a section (d) of FIG. 18A, for example, the signal level is detected with the output of the PD 100*a* of each pixel 10 as the left-side output and the output of the PD 100*b* as the right-side output. As depicted in a section (e) of FIG. 18A, a difference between a row-direction position of a peak $P_3$ of a signal level 70*c* of the PD 100*a* and a row-direction position of a peak $P_4$ of a signal level 70*d* of the PD 100*b* is acquired as the phase difference.

Figure 18B:
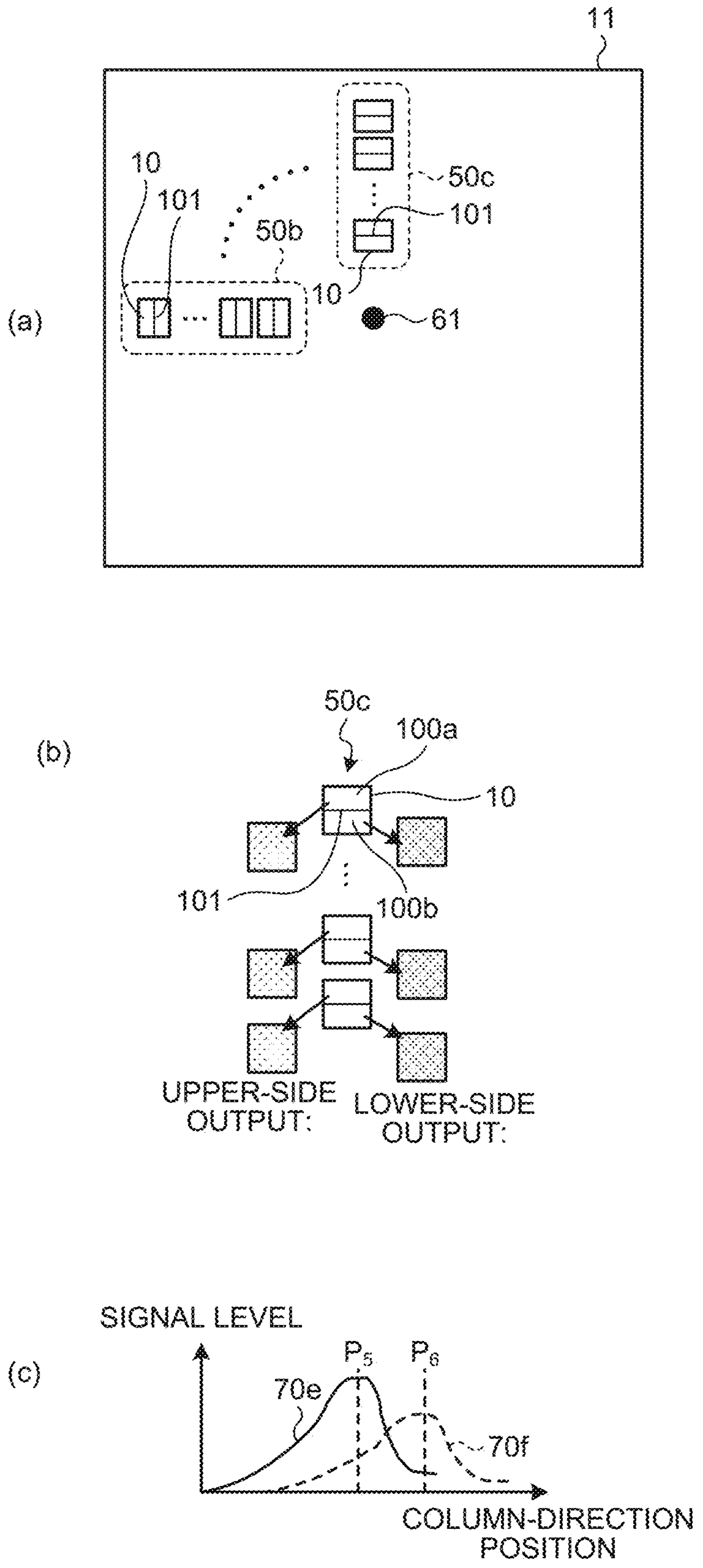
FIG. 18B is a schematic diagram for describing phase difference acquisition processing in a case where the angle θ of the pupil separation portion is 90° with respect to the column direction according to the modified example of the second embodiment.

FIG. 18B is a schematic diagram for describing the phase difference acquisition processing in a case where the angle θ of the pupil separation portion 101 is 90° with respect to the column direction according to the modified example of the second embodiment. In the modified example of the second embodiment, as depicted in a section (a) of FIG. 18B, in each pixel 10 in a region 50*c*, for example, at an end portion of the pixel array unit 11 in the column direction with respect to the position of the optical axis 61, the pupil separation portion 101 is provided at the angle θ=90° with respect to the column direction. In FIG. 18B, for the sake of explanation, the pupil separation portion 101 is depicted as being provided at the angle θ=90° with respect to the column direction in each of a plurality of pixels 10 included in the region 50*c*.

In the region 50*c*, as depicted in a section (b) of FIG. 18B, for example, a signal level is detected with the output of the PD 100*a* of each pixel 10 as an upper-side output and the output of the PD 100*b* as a lower-side output. A section (c) of FIG. 18B schematically depicts an example of a relationship between a signal level 70*e* of the upper-side output and a signal level 70*f* of the lower-side output of each pixel 10 in the section (b), and a column-direction position of each pixel 10. A difference between a column-direction position of a peak $P_5$ of the signal level 70*e* and a column-direction position of the peak $P_5$ of the signal level 70*f* is acquired as the phase difference.

Furthermore, for example, the pupil separation portion 101 is provided in a direction (the angle θ=0° parallel to the column direction in each pixel 10 arranged to be aligned in the row direction with respect to the position of the optical axis 61 in the region 50*b*, similarly to the example of FIG. 18A. Therefore, as described above, the difference between the row-direction position of the peak $P_3$ of the signal level 70*c* of the PD 100*a* and the row-direction position of the peak $P_4$ of the signal level 70*d* of the PD 100*b* is acquired as the phase difference.

In the modified example of the second embodiment, as described above, the phase difference can be acquired for each of the column direction and the row direction of the pixel array unit 11. Therefore, it is possible to perform the autofocus control based on horizontal-direction information and vertical-direction information of the captured image, which is difficult in the existing technology. As a result, the accuracy of the autofocus control can be improved as compared with the existing technology.

5. Third Embodiment

Next, a third embodiment of the present disclosure will be described. In the third embodiment, a value corresponding to each quadrant is uniformly applied to each quadrant as the angle θ of a pupil separation portion 101 in each pixel 10 included in each quadrant of a pixel array unit 11.

Figure 19:
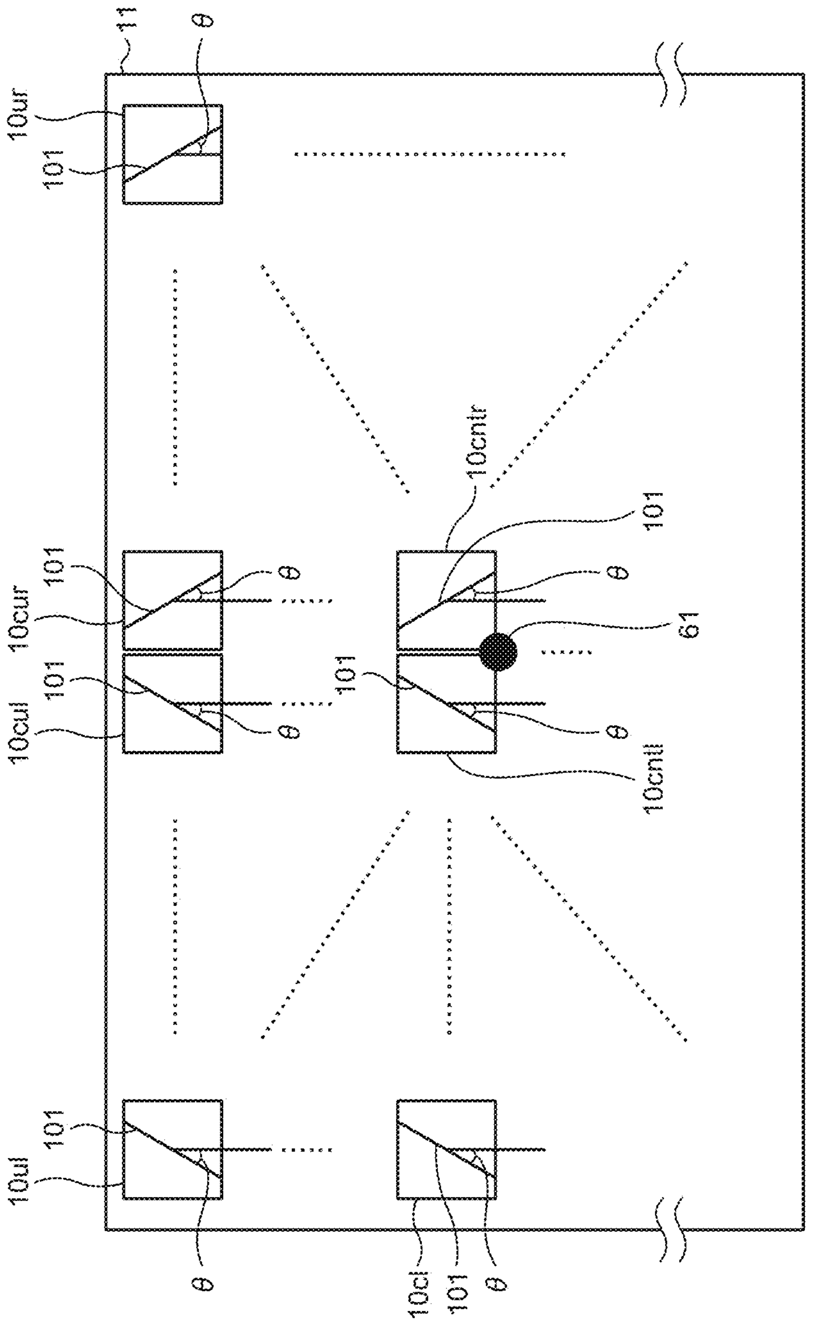
FIG. 19 is a schematic view depicting an example of arrangement of pixels for a pixel array unit according to a third embodiment.

FIG. 19 is a schematic view depicting an example of arrangement of the pixels for the pixel array unit 11 according to the third embodiment. As depicted in FIG. 19, in each of pixels 10*cntl*, 10*cl*, 10*ul*, and 10*cul* and pixels 10 (not depicted) included in a second quadrant having a position of an optical axis 61 as the origin, the pupil separation portion 101 is provided at a uniform angle θ clockwise in the drawing.

The angle θ in the second quadrant is defined by the following Formula (7). In Formula (7), (i,j) indicates the position of the pixel 10 in the pixel array unit 11 in units of pixels. An angle $\theta_{valid}$ is the maximum value of a preset angle θ.

$$\theta(i,j)=\theta_{valid} \quad (7)$$

Furthermore, in each of pixels 10*cntr*, 10*ur*, and 10*cur* and pixels 10 (not depicted) included in a first quadrant having the position of the optical axis 61 as the origin, the pupil separation portion 101 is provided at the same uniform angle θ counterclockwise as the second quadrant in the drawing. The same applies to a third quadrant and a fourth quadrant.

Also in this case, the actual angle θ of the pupil separation portion 101 preferably allows a predetermined margin for the angle θ calculated on the basis of Formula (7) in order to tolerate manufacturing inconsistency of the pixel array unit 11 and the like.

The arrangement of the pupil separation portion 101 in each pixel 10 according to the third embodiment can also reduce the influence of the color mixing and improve the QE as compared with the pixel 10 according to the existing technology. In addition, it is possible to achieve both reduction of the influence of the color mixing, improvement of the QE, and the autofocus control by the image plane phase difference AF method.

6. Fourth Embodiment

Next, a fourth embodiment of the present disclosure will be described. The fourth embodiment is an example in which a thickness of a pupil separation portion 101 in each pixel 10 of a pixel array unit 11 is changed according to an image height, that is, a distance between the pixel 10 and a position of an optical axis 61. The fourth embodiment is applicable to the first to third embodiments described above and modified examples thereof.

Figure 20:
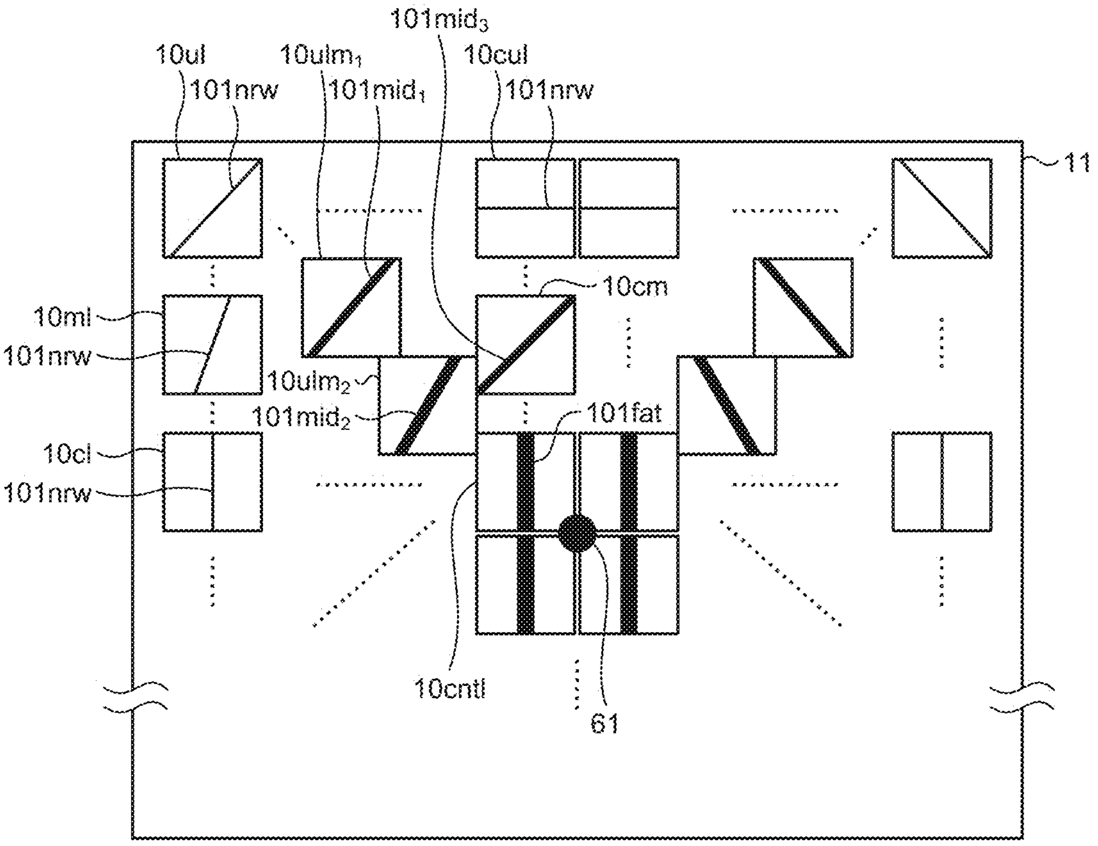
FIG. 20 is a schematic view depicting an example of arrangement of pixels for a pixel array unit according to a fourth embodiment.

FIG. 20 is a schematic view depicting an example of arrangement of the pixels for the pixel array unit 11 according to the fourth embodiment. In FIG. 20, in a case of each pixel included in a second quadrant of the pixel array unit 11 with the position of the optical axis 61 as the origin, among pixels 10 arranged between a pixel 10*cntl* closest to the optical axis 61 and a pixel 10*ul* at the upper left corner in the drawing, a pixel 10 closer to the optical axis 61 is depicted as a pixel 10$ulm_2$, and a pixel 10 between the pixel 10$ulm_2$ and the pixel 10*ul* is depicted as a pixel 10$ulm_1$. Furthermore, a pixel 10 arranged between the pixel 10*cntl* and the pixel 10*cul* at an end in the column direction with respect to the pixel 10*cntl* is depicted as a pixel 10$cm_3$.

In the example of FIG. 20, the thickest pupil separation portion 101*fat* is provided in the pixel 10*cntl* closest to the optical axis 61 (having the lowest image height). On the other hand, the thinnest pupil separation portion 101*nrw* is provided in the pixels 10*ul* and 10*cl* that are farthest (have the highest image height) from the position of the optical axis 61 with respect to each direction, and a pixel 10*ml* arranged between the pixels 10*ul* and 10*cl*.

Furthermore, the pixels 10$ulm_1$ and 10$ulm_2$ are respectively provided with pupil separation portions 101$mid_1$ and 101$mid_2$ having intermediate thicknesses between the thicknesses of the pupil separation portion 101*fat* and the pupil separation portion 101*nrw*. In a case of the pupil separation portions 101$mid_1$ and 101$mid_2$, the thickness of the pupil separation portion 101$mid_2$ of the pixel 10$ulm_2$ close in distance from the optical axis 61 may be larger than the thickness of the pupil separation portion 101$mid_1$ of the pixel 10$ulm_1$ farther in distance from the optical axis 61 than the pixel 10$ulm_2$. Similarly, the pixel 10*cm* arranged between the pixel 10*cntl* and the pixel 20*cul* is provided with a pupil separation portion 101$mid_3$ having a thickness smaller than the pupil separation portion 101*fat* and larger than the pupil separation portion 101*nrw*.

In FIG. 20, the pupil separation portions 101*nrw* having the same thickness are provided in the pixels 10*cl*, 10*ml*, 10*ul*, and 10*cul* arranged at the end portion of the pixel array unit 11, but the present disclosure is not limited to this example. For example, the pupil separation portion 101 having a thickness corresponding to the distance from the optical axis 61 may be provided for each of the pixels 10*cl*, 10*ml*, 10*ul*, and 10*cul*.

Incident light 30 from a main lens 60 is incident on the pixels 10 having a high image height, such as the pixels 10*cl*, 10*ml*, 10*ul*, and 10*cul*, at a larger angle with respect to the direction of the optical axis 61 and a larger spot diameter, so that scattered light at the pixel separation surface is diffused in a wider range. In the fourth embodiment, the pupil separation portion 101*nrw* having a smaller thickness is provided in the pixels 10 having a high image height such as the pixels 10*cl*, 10*ml*, 10*ul*, and 10*cul*. As a result, it is possible to reduce scattering of the incident light 30 at an end portion of the pixel separation surface, that is, the pupil separation portion 101*nrw*, on the incident surface side.

7. Fifth Embodiment

Next, a fifth embodiment of the present disclosure will be described. In the fifth embodiment, in each pixel 10 included in a pixel array unit 11, a pupil separation portion 101 is provided at a position shifted in accordance with pupil correction.

As described above with reference to FIGS. 4A and 4B, pupil correction may be performed to suppress a change in entrance pupil diameter caused by a change in incident angle of incident light 30 incident on each pixel 10 from a main lens 60 according to the position in the pixel array unit 11. The pupil correction is performed, for example, by adjusting the position and shape of an OCL 210 according to the position (image height) of the pixel 10 in the pixel array unit 11. For example, the position of the OCL 210 is shifted toward the optical axis 61 according to the arrangement position of the pixel 10 in the pixel array unit 11. More specifically, a shift amount of the position of the OCL 210 is made larger for a pixel 10 having a higher image height, that is, a pixel 10 arranged at a position farther from the optical axis 61. In the fifth embodiment, the position of the pupil separation portion 101 of each pixel 10 is shifted toward the optical axis 61 by the shift amount corresponding to the image height in accordance with the pupil correction.

Figure 21:
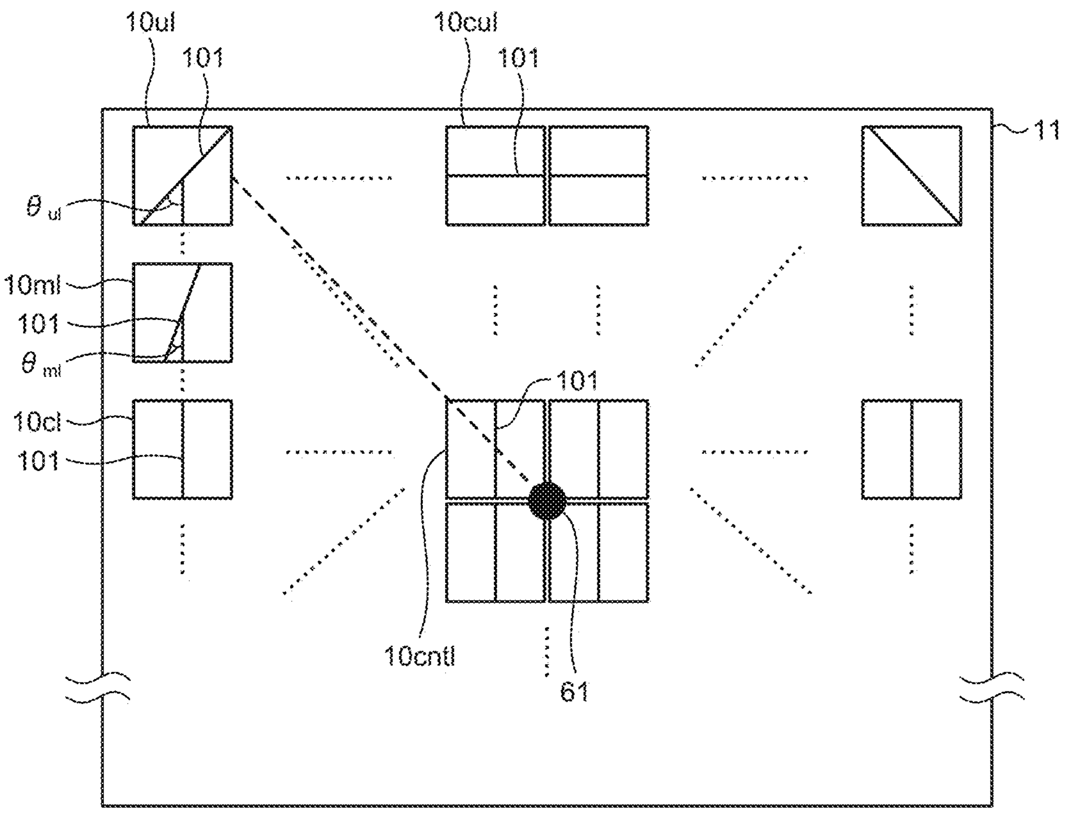
FIG. 21 is a schematic view depicting an example of arrangement of pixels for a pixel array unit according to a fifth embodiment.
Figure 21:
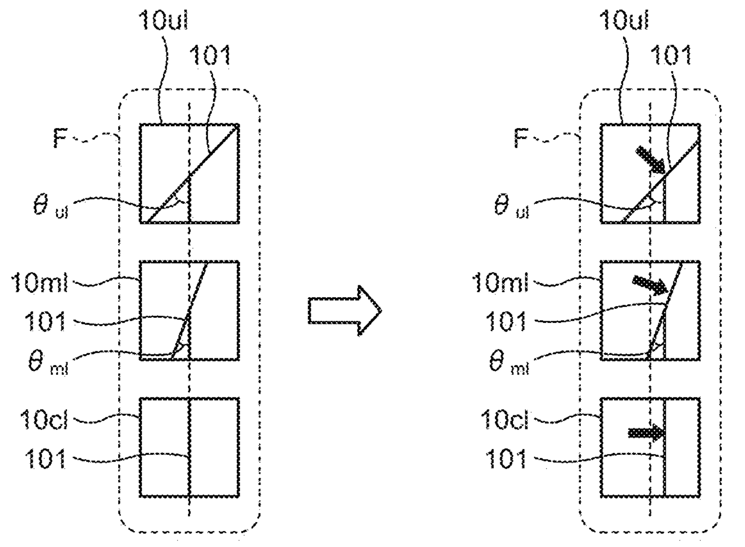

FIG. 21 is a schematic view depicting an example of arrangement of the pixels for the pixel array unit 11 according to the fifth embodiment. Pixels 10*cl*, 10*ml*, and 10*ul* at a left end of a second quadrant in the drawing in arrangement of the pixels 10 for the pixel array unit 11 depicted in a section (a) of FIG. 21 will be described as an example.

A section (b) of FIG. 21 schematically depicts the pixels 10*cl*, 10*ml*, and 10*ul* in a case where the fifth embodiment is not applied. In each of the pixels 10*cl*, 10*ml*, and 10*ul*, the pupil separation portion 101 is provided in each of the pixels 10*cl*, 10*ml*, and 10*ul* in such a way that the central portion of the pupil separation portion 101 coincides with the central portion of each of the pixels 10*cl*, 10*ml*, and 10*ul*.

A section (c) of FIG. 21 schematically depicts the pixels 10*cl*, 10*ml*, and 10*ul* in a case where the fifth embodiment is applied. As indicated by arrows in the drawing, the pupil separation portion 101 is provided in each of the pixels 10*cl*, 10*ml*, and 10*ul* in such a way as to be shifted from the position indicated in the section (b) toward the optical axis 61.

In this manner, by providing the pupil separation portion 101 of each pixel 10 included in the pixel array unit 11 in such a way as to be shifted toward the optical axis 61 by the shift amount according to the image height in accordance with pupil correction, it is possible to appropriately acquire the phase difference according to the image height.

8. Sixth Embodiment

Next, a sixth embodiment of the present disclosure will be described. In the sixth embodiment, the presence or absence of a pupil separation portion 101 and an angle θ of the pupil separation portion 101 are set according to a color filter 200 provided in each pixel 10. The sixth embodiment is applicable to the first to fifth embodiments and modified examples described above.

FIRST EXAMPLE

A first example of the sixth embodiment will be described. In the first example, for example, a pixel 10 that is not provided with the pupil separation portion 101 is set among a pixel 10R provided with a red color filter 200R, a pixel 10G provided with a green color filter 200G, and a pixel 10B provided with a blue color filter 200B (not depicted).

Figure 22A:
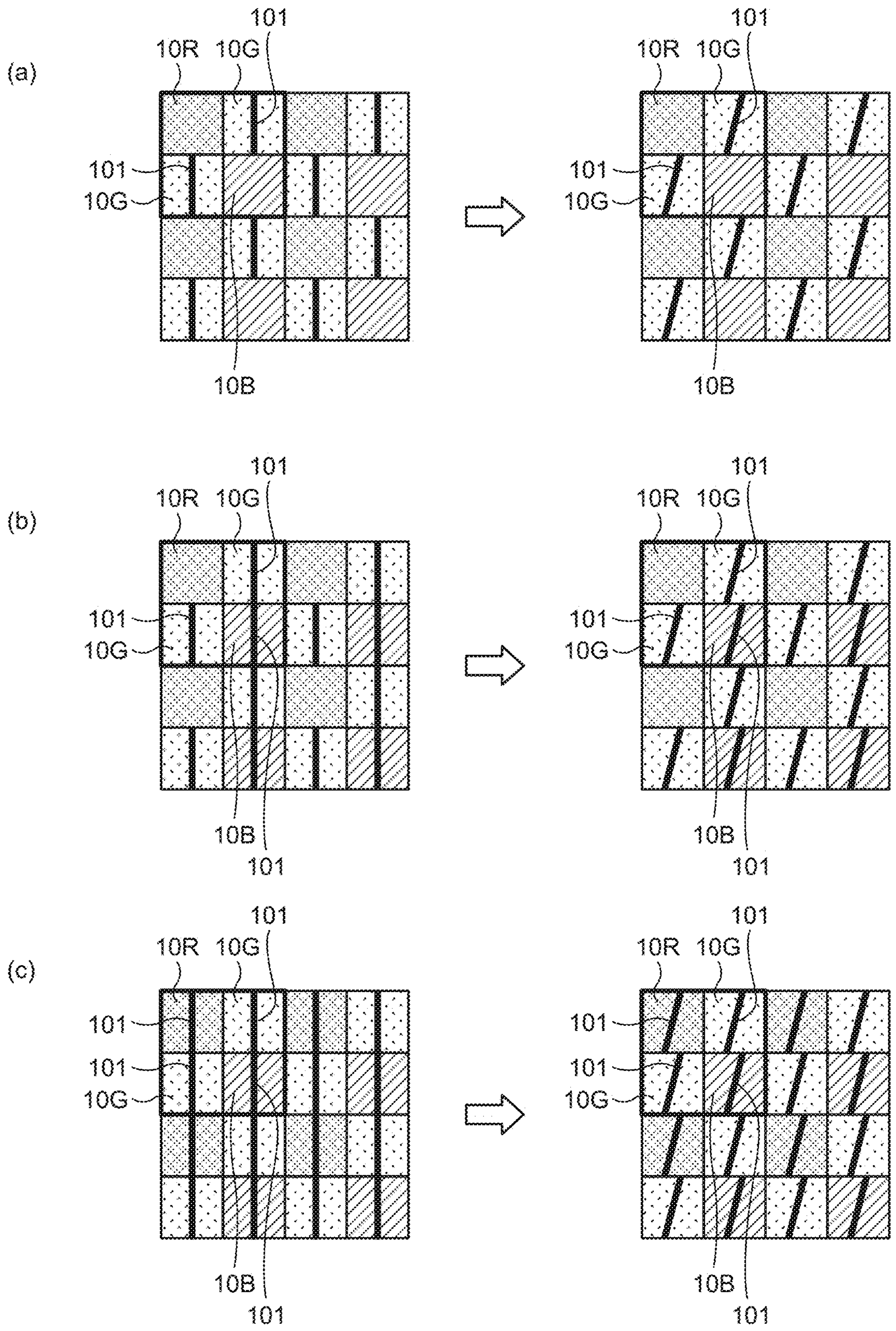
FIG. 22A is a schematic view depicting an example of a pupil separation portion provided in a pixel of each color in Bayer arrangement according to a first example of a sixth embodiment.

FIG. 22A is a schematic view depicting an example of the pupil separation portion 101 provided in each of the pixels 10R, 10G, and 10B of the respective colors in the Bayer arrangement according to the first example of the sixth embodiment. Here, it is assumed that the pixels 10R, 10G, and 10B are arranged according to the Bayer arrangement described above.

A section (a) of FIG. 22A depicts an example in which the pupil separation portion 101 is provided only in the pixel 10G. As depicted on the right side of the section (a), the pupil separation portion 101 is provided at a predetermined angle θ (not depicted) of larger than 0° and equal to or smaller than 90° in the pixel 10G. Similarly, the right side of a section (b) depicts an example in which the pupil separation portion 101 is provided at the predetermined angle θ in the pixels 10G and 10B, and the right side of a section (c) depicts an example in which the pupil separation portion 101 is provided at the predetermined angle θ in the pixels 10R, 10G, and 10B.

In the example of FIG. 22A, the pupil separation portion 101 is provided in the pixel 10 at a uniform angle θ regardless of the color of the color filter 200 of the pixel 10.

Figure 22B:
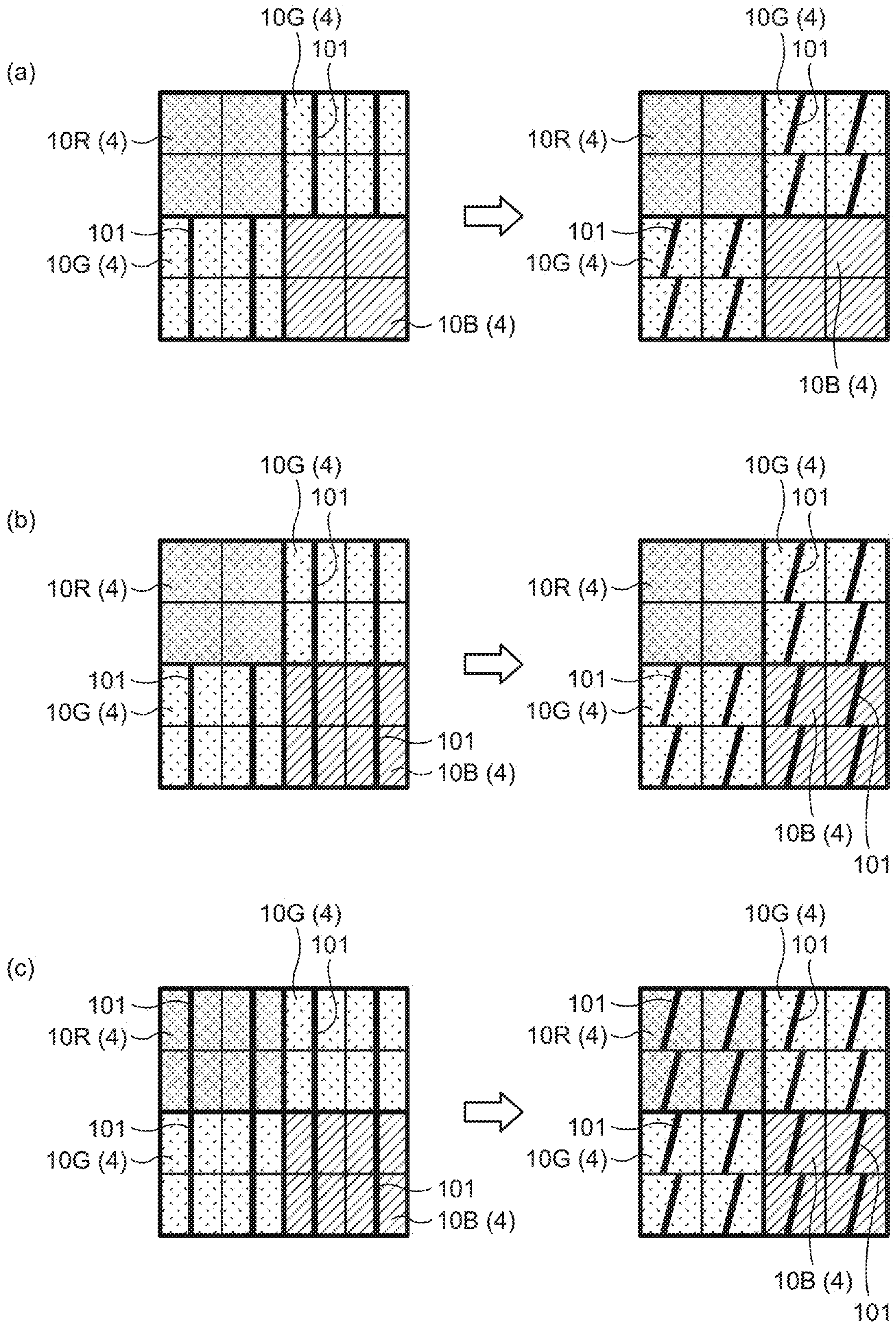
FIG. 22B is a schematic view depicting an example of a pupil separation portion provided in a pixel of each color in quadripartite Bayer-type RGB arrangement according to the first example of the sixth embodiment.

The arrangement of the pixels 10R, 10G, and 10B is not limited to the Bayer arrangement. FIG. 22B is a schematic view depicting an example of the pupil separation portion 101 provided in each of the pixels 10R, 10G, and 10B of the respective colors in quadripartite Bayer-type RGB arrangement according to the first example of the sixth embodiment.

In the quadripartite Bayer-type arrangement, pixel blocks each including four R color pixels 10R, four G color pixels 10G, or four B color pixels 10B are arranged in pixel arrangement according to the Bayer arrangement, with a pixel block in which 2×2 pixels of the same color are arranged in a grid pattern as a unit. Hereinafter, a pixel block including four pixels 10R is regarded as one pixel 10R (4). Similarly, a pixel block including four pixels 10G is regarded as one pixel 10G (4), and a pixel block including four pixels 10B is regarded as one pixel 10B (4).

A section (a) of FIG. 22B depicts an example in which the pupil separation portion 101 is provided only in the pixel 10G (4). As depicted on the right side of the section (a), the pupil separation portion 101 is provided at a predetermined angle θ (not depicted) of larger than 0° and equal to or smaller than 90° in four pixels 10G (not depicted) included in the pixel 10G (4). Similarly, the right side of a section (b) depicts an example in which the pupil separation portion 101 is provided at the predetermined angle θ in the pixels 10G (4) and 10B (4), and the right side of a section (c) depicts an example in which the pupil separation portion 101 is provided at the predetermined angle θ in the pixels 10R (4), 10G (4), and 10B (4).

SECOND EXAMPLE

A second example of the sixth embodiment will be described. The second example is an example in which the angle of the pupil separation portion 101 is changed according to the color of each of the pixels 10R, 10G, and 10B in the first example described above.

Figure 22C:
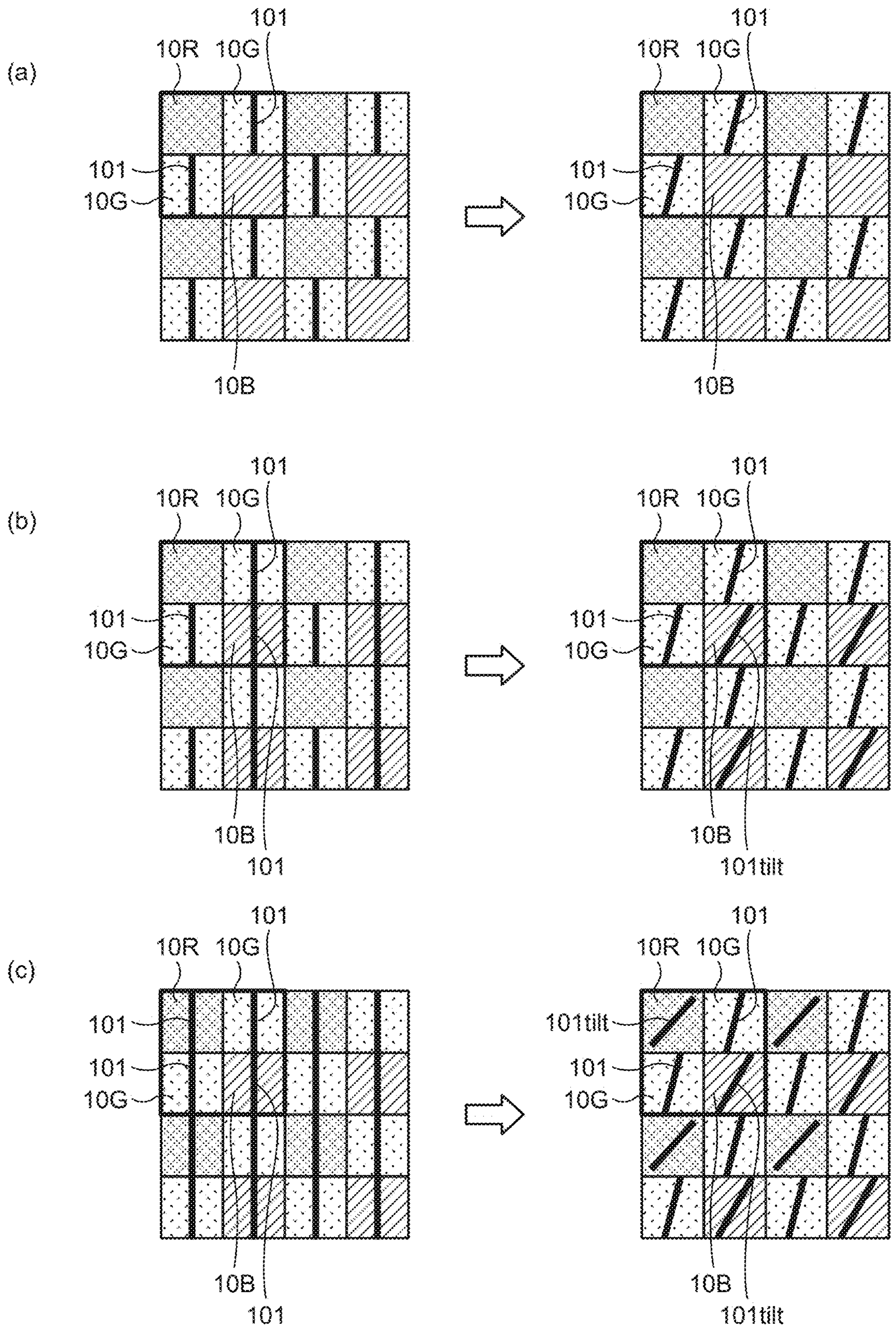
FIG. 22C is a schematic view depicting an example of a pupil separation portion provided in a pixel of each color in Bayer arrangement according to a second example of the sixth embodiment.

FIG. 22C is a schematic view depicting an example of the pupil separation portion 101 provided in each of the pixels 10R, 10G, and 10B of the respective colors in the Bayer arrangement according to the second example of the sixth embodiment. In the following description, a pupil separation portion 101*tilt* whose angle with respect to the column direction is larger than the angle θ of the pupil separation portion 101 provided in the pixel 10G is provided in the pixels 10R and 10B.

A section (a) of FIG. 22C depicts an example in which the pupil separation portion 101 is provided only in the pixel 10G. The pupil separation portion 101 is uniformly provided at a predetermined angle θ (not depicted) of larger than 0° and equal to or smaller than 90° in each pixel 10G.

On the other hand, a section (b) depicts an example in which the pupil separation portion 101 is provided in the pixels 10G and 10B. As depicted on the right side of the section (b), the pupil separation portion 101*tilt* having an angle larger than that of the pupil separation portion 101 provided in the pixel 10G is provided in the pixel 10B. Furthermore, a section (c) depicts an example in which the pupil separation portion 101 is provided in the pixels 10R, 10G, and 10B. As depicted on the right side of the section (c), the pupil separation portion 101*tilt* having an angle larger than that of the pupil separation portion 101 provided in the pixel 10G is provided in the pixels 10R and 10B. In this example, the pupil separation portion 101*tilt* provided in the pixel 10R has a larger angle than the pupil separation portion 101*tilt* provided in the pixel 10B.

Figure 22D:
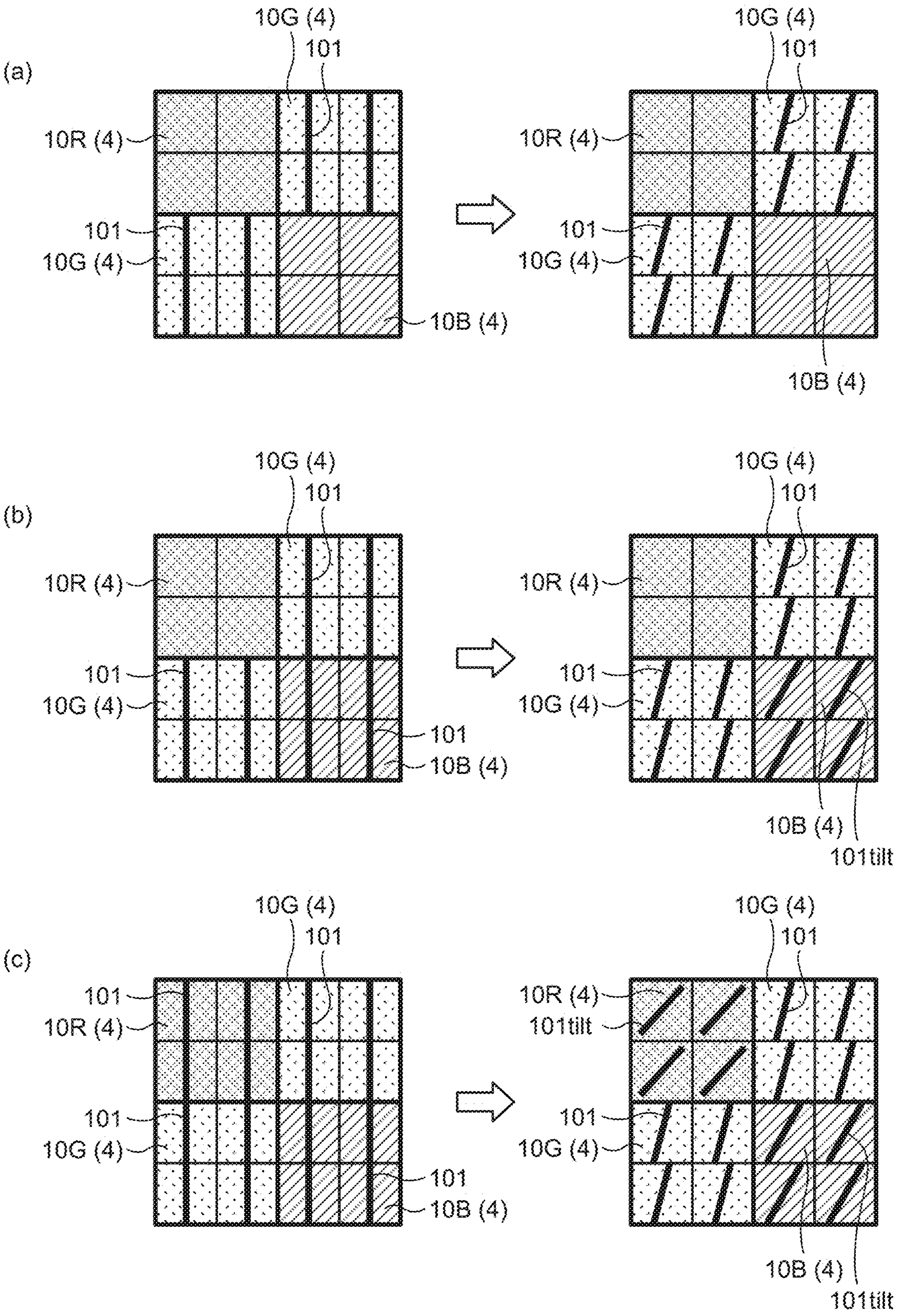
FIG. 22D is a schematic view depicting an example of a pupil separation portion provided in a pixel of each color in quadripartite Bayer-type RGB arrangement according to the second example of the sixth embodiment.

FIG. 22D is a schematic view depicting an example of the pupil separation portion 101 provided in each of the pixels 10R (4), 10G (4), and 10B (4) of the respective colors in quadripartite Bayer-type RGB arrangement according to the second example of the sixth embodiment.

A section (a) of FIG. 22D depicts an example in which the pupil separation portion 101 is provided only in the pixel 10G (4). As depicted on the right side of the section (a), the pupil separation portion 101 is provided at a predetermined angle θ (not depicted) of larger than 0° and equal to or smaller than 90° in four pixels 10G (not depicted) included in the pixel 10G (4).

On the other hand, a section (b) depicts an example in which the pupil separation portion 101 is provided in the pixels 10G (4) and 10B (4). As depicted on the right side of the section (b), the pupil separation portion 101*tilt* having an angle larger than that of the pupil separation portion 101 provided in the pixel 10G (4) is provided in the pixel 10B (4). Furthermore, a section (c) depicts an example in which the pupil separation portion 101 is provided in the pixels 10R (4), 10G (4), and 10B (4). As depicted on the right side of the section (c), the pupil separation portion 101*tilt* having an angle larger than that of the pupil separation portion 101 provided in the pixel 10G (4) is provided in the pixels 10R (4) and 10B (4). In this example, the pupil separation portion

101*tilt* provided in the pixel 10R (4) has a larger angle than the pupil separation portion 101*tilt* provided in the pixel 10B (4).

As described above, by setting the presence or absence of the pupil separation portion 101 and the angle θ of the pupil separation portion 101 according to the color filter 200 provided in each pixel 10, it is possible to appropriately acquire the phase difference according to a wavelength characteristic of light included in the incident light 30.

9. Seventh Embodiment

9-1. Application Example of Technology of Present Disclosure

Figure 23:
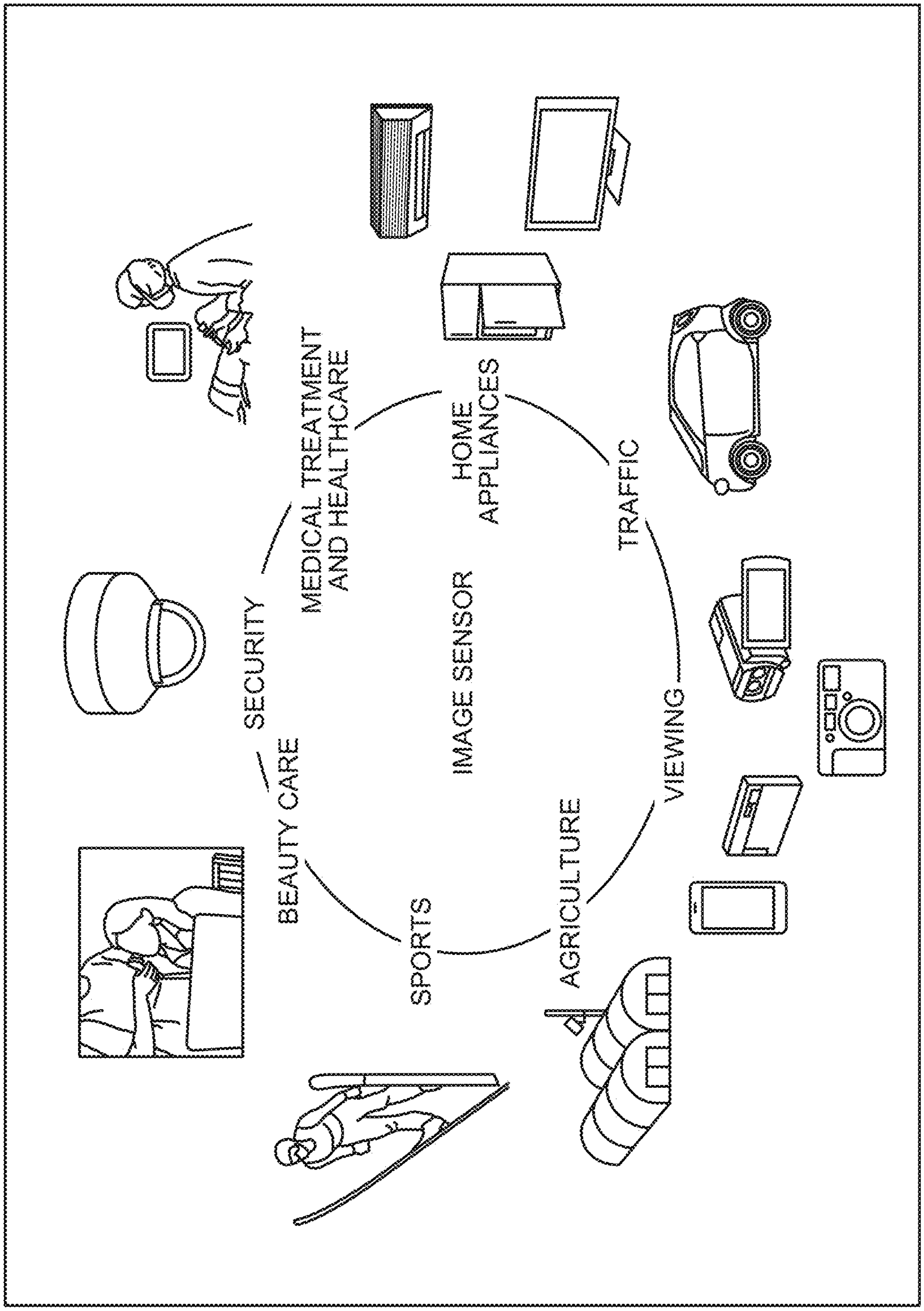
FIG. 23 is a diagram depicting a usage example of the imaging device to which the technology of the present disclosure is applied.

Next, as a seventh embodiment, application examples of the imaging devices 1011 according to the first to sixth embodiments and the respective modified examples of the present disclosure will be described. FIG. 23 is a diagram depicting a usage example of the imaging devices 1011 according to the first to sixth embodiments and the respective modified examples. In the following description, the imaging device 1011 will be described as an imaging element unless otherwise specified.

The imaging devices 1011 according to the first to sixth embodiments and the respective modified examples described above can be used, for example, in various cases of sensing light such as visible light, infrared light, ultraviolet light, and X-rays as described below.

- A device that captures an image provided for viewing, such as a digital camera and a portable device with a camera function
- A device provided for traffic, such as an in-vehicle sensor for capturing an image of a region in front of, behind, surrounding, or inside a vehicle, a monitoring camera for monitoring a traveling vehicle or a road, or a distance measurement sensor for measuring a distance between vehicles, for the purpose of safe driving such as automatic stop and recognition of a driver's state
- A device provided for home appliances, such as a television (TV), a refrigerator, and an air conditioner, to capture an image of the gesture of the user and perform a device operation in accordance with the gesture
- A device provided for medical treatment and healthcare, such as an endoscope or a device for capturing an image of blood vessels by receiving infrared light
- A device provided for security, such as a monitoring camera for security or a camera for personal authentication
- A device provided for beauty care, such as a skin measuring device for capturing an image of skin or a microscope for capturing an image of scalp
- A device provided for sports, such as an action camera or a wearable camera for use in sports
- A device provided for agriculture, such as a camera for monitoring the state of fields and crops

9-2. Example of Application to Endoscopic Surgery System

The technology (present technology) according to the present disclosure can be applied to various products. For example, the technology according to the present disclosure may be applied to an endoscopic surgical system.

Figure 24:
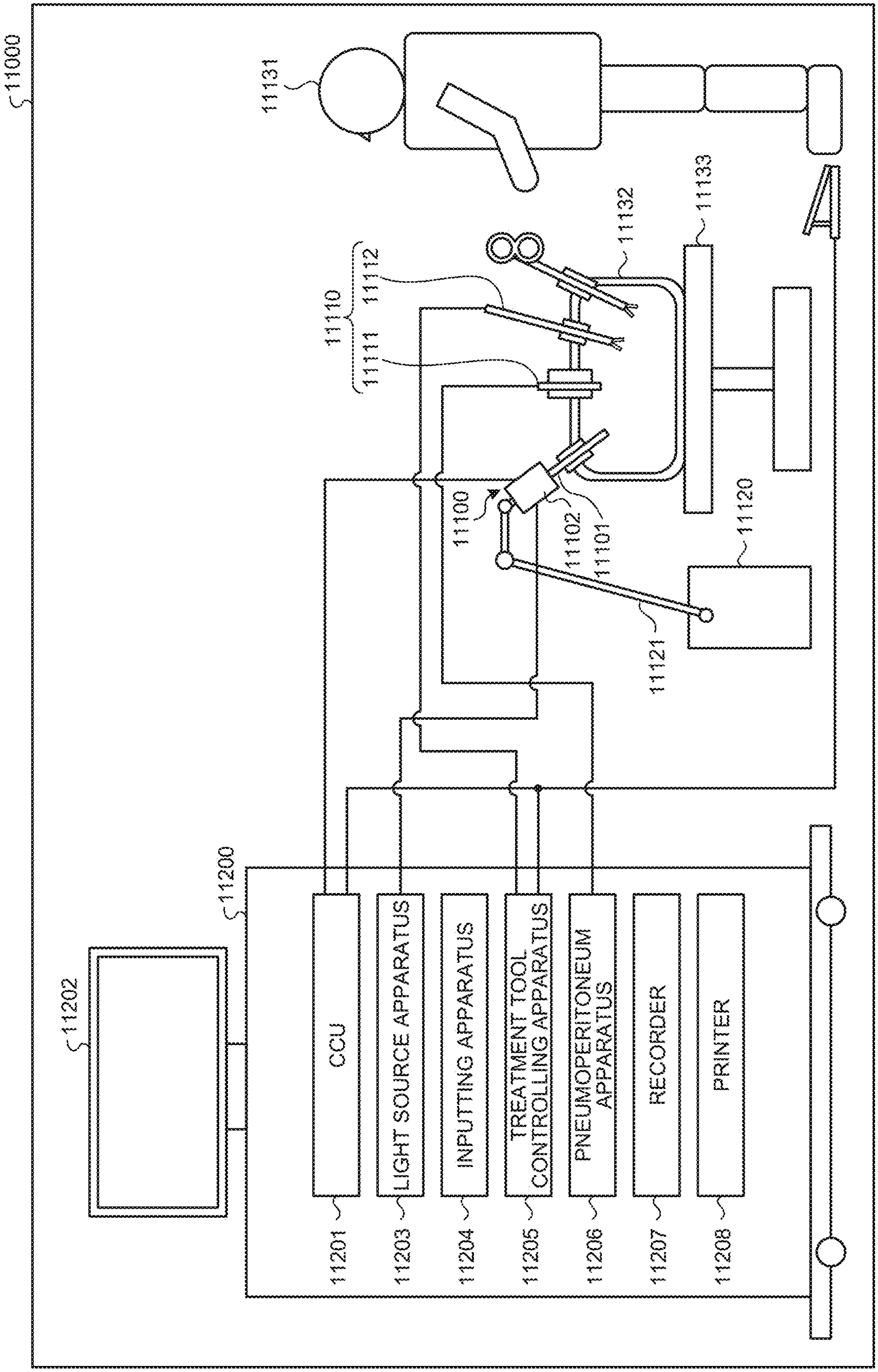
FIG. 24 is a view depicting an example of a schematic configuration of an endoscopic surgery system.

FIG. 24 is a view depicting an example of a schematic configuration of an endoscopic surgery system to which the technology according to an embodiment of the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon via an arm portion 11121, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 25:
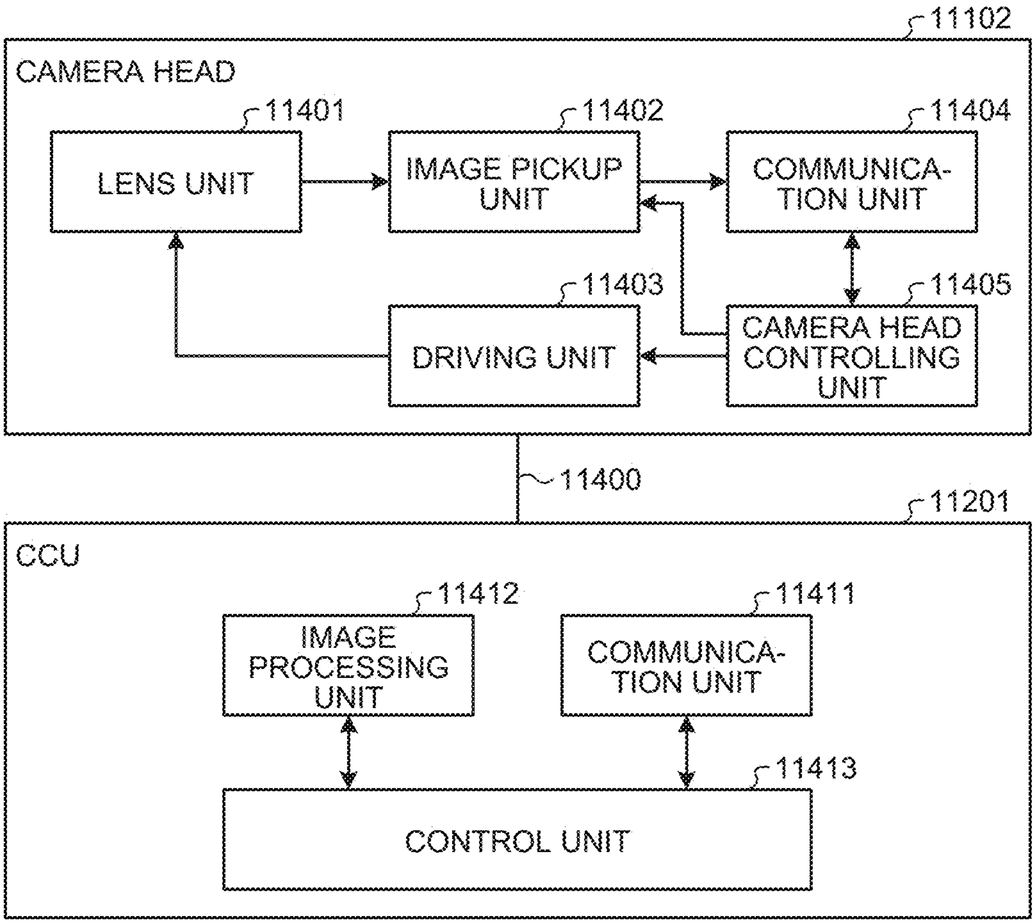
FIG. 25 is a block diagram depicting an example of a functional configuration of a camera head and a camera control unit (CCU).

FIG. 25 is a block diagram depicting an example of a functional configuration of the camera head 11102 and the CCU 11201 depicted in FIG. 24.

The camera head 11102 includes a lens unit 11401, an image pickup unit 11402, a driving unit 11403, a communication unit 11404 and a camera head controlling unit 11405.

The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Hereinabove, an example of the endoscopic surgery system to which the technology according to the present disclosure can be applied has been described. The technology according to the present disclosure can be applied to, for example, the endoscope 11100 and the image pickup unit 11402 of the camera head 11102 among the above-described configurations. Specifically, the above-described image pickup element can be applied to an image pickup unit 10112. The imaging element according to the present disclosure can reduce the influence of color mixing and improve the QE while acquiring the phase difference with predetermined accuracy as compared with the imaging element according to the existing technology, and thus, it is possible to obtain a captured image with higher quality. As a result, for example, the surgeon 11131 can more reliably proceed with the surgery.

Note that, here, the endoscopic surgery system has been described as an example, but the technology according to the present disclosure may be applied to, for example, a microscopic surgery system or the like.

9-3. Example of Application to Moving Body

For example, the technology according to the present disclosure may further be applied to an apparatus mounted in various moving bodies such as a vehicle, an electric vehicle, a hybrid electric vehicle, a motorcycle, a bicycle, a personal mobility device, a plane, a drone, a ship, and a robot.

Figure 26:
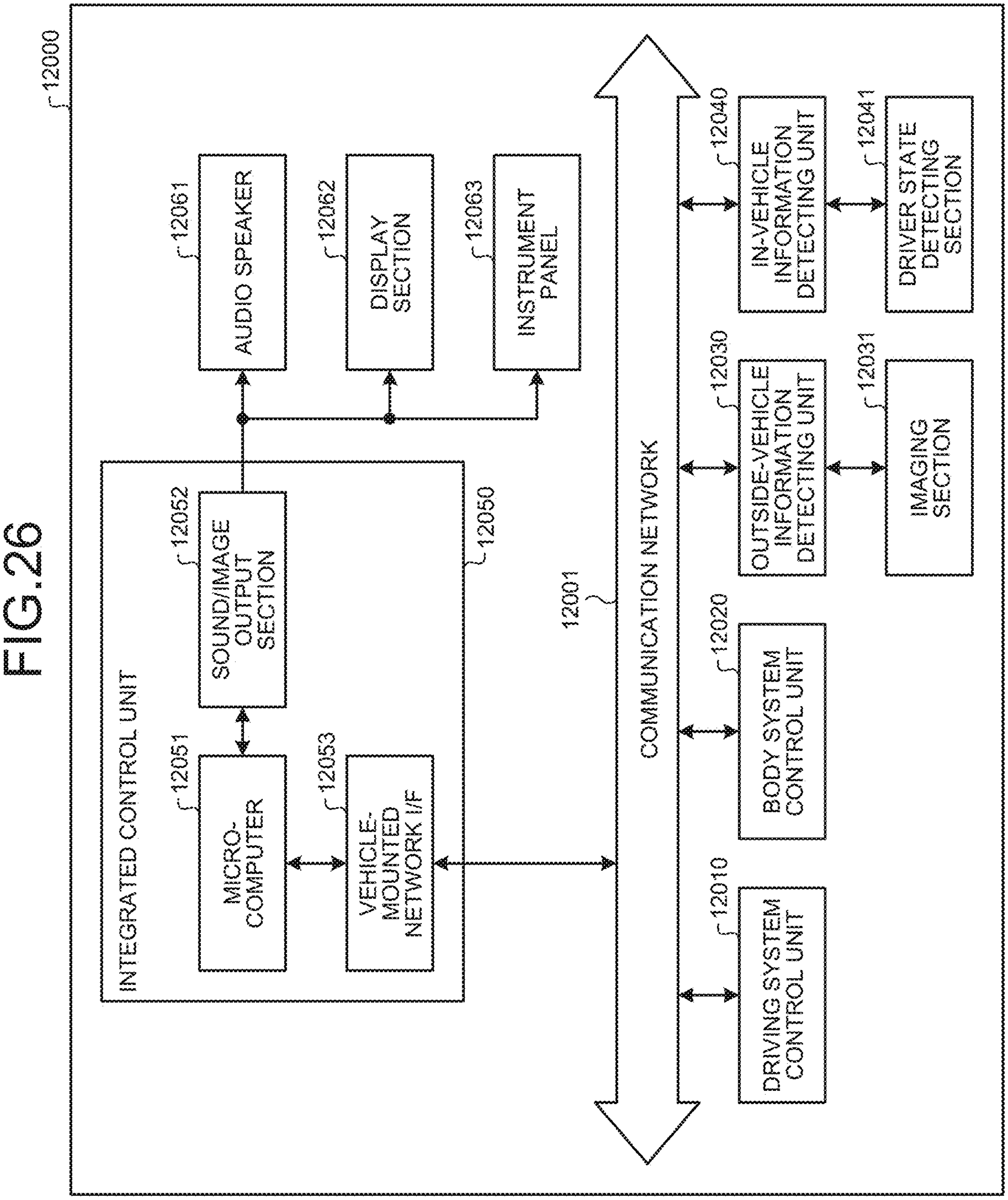
FIG. 26 is a block diagram depicting an example of schematic configuration of a vehicle control system.

FIG. 26 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 26, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto. For example, the outside-vehicle information detecting unit 12030 performs an image process on the received image, and performs object detection processing and distance detection processing based on a result of the image process.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 26, an audio speaker 12061, a display section 12062, and an instrument panel 12063 are illustrated as the output device. The display section 12062 may, for example, include at least one of an on-board display and a head-up display.

Figure 27:
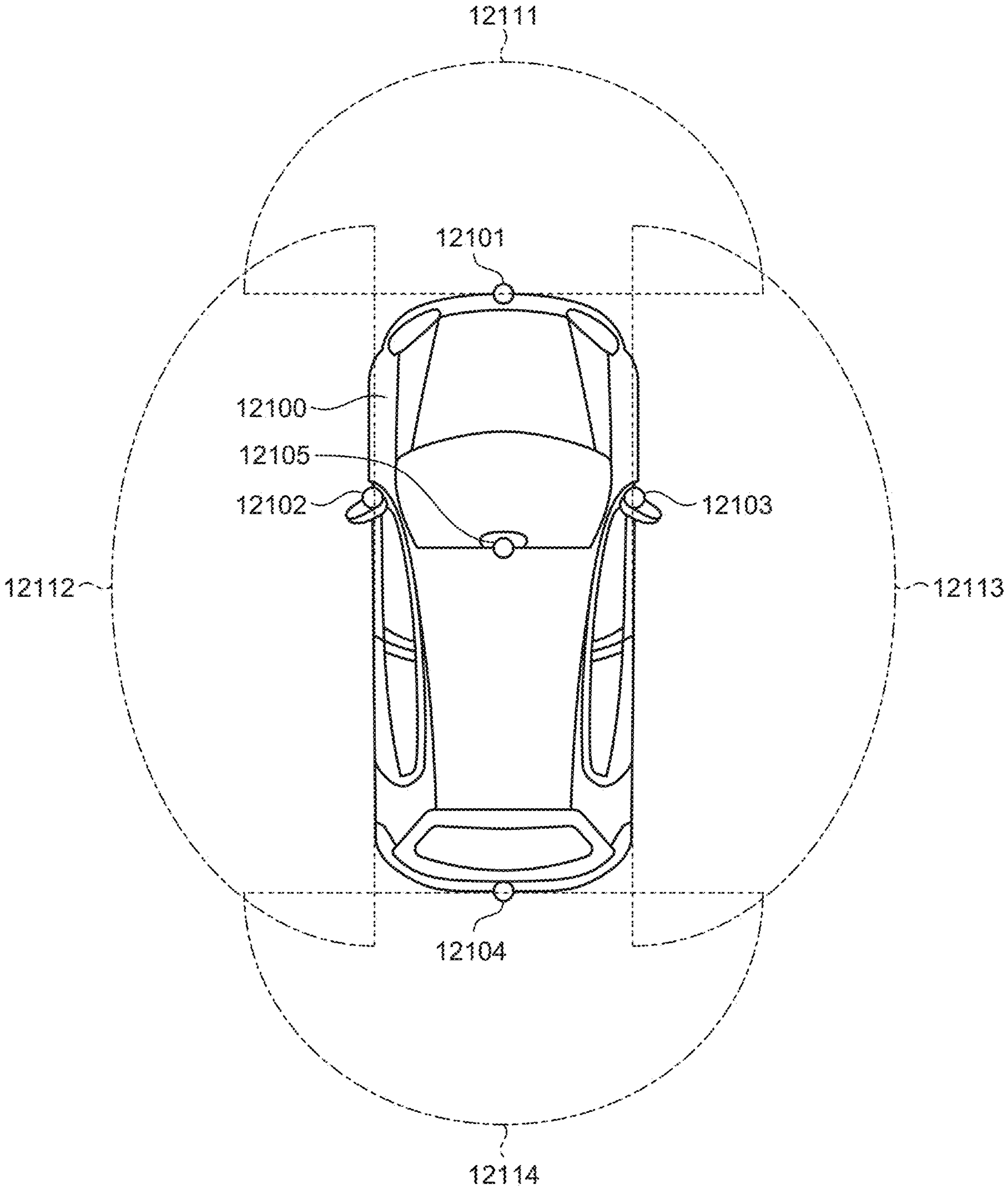
FIG. 27 is a diagram of assistance in explaining an example of installation positions of an outside-vehicle information detecting section and an imaging section.

FIG. 27 is a diagram depicting an example of the installation position of the imaging section 12031. In FIG. 27, a vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the area in front of the vehicle 12100 acquired by the imaging sections 12101 and 12105 are used mainly to detect a preceding vehicle, a pedestrian, an obstacle, a signal, a traffic sign, a lane, or the like.

Incidentally, FIG. 27 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of the vehicle control system to which the technology according to the present disclosure can be applied has been described. The technology according to the present disclosure can be applied to, for example, the imaging section 12031 among the above-described configurations.

Specifically, the above-described imaging element can be applied to the imaging section 12031. The imaging element according to the present disclosure can reduce the influence of color mixing and improve the QE while acquiring the phase difference with predetermined accuracy as compared with the imaging element according to the existing technology, and thus, it is possible to obtain a captured image with higher quality. As a result, it is possible to implement more accurate pedestrian recognition and vehicle control.

Note that the effects described in the present specification are merely examples. The effects of the present disclosure are not limited thereto, and other effects may be obtained. Note that the present technology can also have the following configurations.

(1) An imaging device comprising:

a pixel array unit that includes a plurality of pixels arranged in matrix arrangement, wherein a separation portion that separates a pixel with a separation surface to acquire a phase difference is provided at an angle different from 0 degrees with respect to a column direction in the arrangement in at least some of the plurality of pixels.

(2) The imaging device according to the above (1), wherein in the separation portion, the separation surface is provided at an angle different from 0 degrees with respect to a column in the arrangement in a pixel positioned in a direction different from 0 degrees with respect to a row in the arrangement from an optical axis position of incident light in the pixel array unit.

(3) The imaging device according to the above (2), wherein in the separation portion, the separation surface is provided toward the optical axis position at an angle of larger than 0 degrees and smaller than 90 degrees with respect to a column in the arrangement.

(4) The imaging device according to the above (2), wherein in the separation portion, an angle formed by the separation surface and a direction from the optical axis position is approximately 90 degrees.

(5) The imaging device according to any one of the above (2) to (4), wherein in the separation portion, the separation surface is provided at an angle different from 0 degrees with respect to a column in the arrangement in a pixel positioned in the column direction in the arrangement from the optical axis position.

(6) The imaging device according to the above (5), wherein in the separation portion, the separation surface is provided toward the optical axis position at an angle of larger than 0 degrees and equal to or smaller than 90 degrees with respect to a column in the arrangement.

(7) The imaging device according to the above (6), wherein the separation portion is provided at the angle corresponding to a distance from the optical axis position to the pixel.

(8) The imaging device according to the above (1), wherein in the separation portion, the separation surface is provided toward an optical axis position of incident light in the pixel array unit at a uniform angle of larger than 0 degrees and smaller than 90 degrees with respect to a column in the arrangement.

(9) The imaging device according to any one of the above (1) to (8), wherein in the separation portion, the separation surface is provided from one end of the pixel in which the separation portion is provided toward another end opposite to the one end on a plane parallel to an incident surface of the pixel in which the separation portion is provided among the plurality of pixels.

(10) The imaging device according to the above (9), wherein in the separation portion, the separation surface is provided to penetrate from the one end toward the another end.

(11) The imaging device according to the above (9) or (10), wherein in the separation portion, another separation surface that intersects with the separation surface and is shorter than the separation surface is further provided.

(12) The imaging device according to any one of the above (1) to (8), wherein in the separation portion, the separation surface includes a first separation portion provided from one end of the pixel in which the separation portion is provided to a position that does not reach an intermediate position between the one end and another end opposite to the one end on a plane parallel to an incident surface of the pixel in which the separation portion is provided among the plurality of pixels, and a second separation portion provided from the another end to a position that does not reach the intermediate position.

(13) The imaging device according to the above (12), wherein in the separation portion, the first separation portion and the second separation portion are provided on the same straight line.

(14) The imaging device according to any one of the above (9) to (13), wherein the separation portion is provided from an incident surface of a semiconductor layer in the pixel in which the separation portion is provided among the plurality of pixels toward a surface opposite to the incident surface while having a gap from the opposite surface.

(15) The imaging device according to any one of the above (9) to (13), wherein the separation portion is provided from a surface opposite to an incident surface of a semiconductor layer in the pixel in which the separation portion is provided among the plurality of pixels toward the incident surface while having a gap from the incident surface.

(16) The imaging device according to any one of the above (9) to (13), wherein the separation portion is provided from an incident surface of a semiconductor layer in the pixel in which the separation portion is provided among the plurality of pixels to a surface opposite to the incident surface while having a gap at a middle portion of the semiconductor layer.

(17) The imaging device according to any one of the above (9) to (13), wherein the separation portion is provided to penetrate from an incident surface of a semiconductor layer in the pixel in which the separation portion is provided among the plurality of pixels to a surface opposite to the incident surface.

(18) The imaging device according to any one of the above (1) to (17), further comprising an optical filter provided on an incident surface of a semiconductor layer in each of the plurality of pixels, wherein the separation portion is provided according to a characteristic of the optical filter.

(19) The imaging device according to the above (18), wherein the separation portion is provided at the angle corresponding to the characteristic of the optical filter.

(20) The imaging device according to any one of the above (1) to (19), wherein the separation portion has a thickness corresponding to a distance between the pixel in which the separation portion is provided among the plurality of pixels and an optical axis position of incident light in the pixel array unit.

(21) The imaging device according to any one of the above (1) to (20), wherein the separation portion is provided in such a way that a position of the separation portion in each of the plurality of pixels is shifted in accordance with pupil correction for each of the plurality of pixels.

(22) The imaging device according to any one of the above (1) to (21), wherein each of the plurality of pixels is a back-illuminated pixel.

(23) An electronic apparatus comprising:

a pixel array unit that includes a plurality of pixels arranged in matrix arrangement;

a drive unit that drives the plurality of pixels; and a storage unit that stores image data based on pixel signals output from the plurality of pixels driven by the drive unit, wherein a separation portion that separates a pixel with a separation surface to acquire a phase difference is provided at an angle different from 0 degrees with respect to a column direction in the arrangement in at least some of the plurality of pixels.

REFERENCE SIGNS LIST

10, 10*cl*, 10*cntl*, 10*cntr*, 10*cul*, 10*cur*, 10*ml*, 10*ul*, 10*ur*, 10*ulm*$_1$, 10*ulm*$_2$, 10R, 10R(4), 10G, 10G(4), 10B, 10B (4) PIXEL

11 PIXEL ARRAY UNIT

20 SEMICONDUCTOR LAYER

21 WIRING LAYER

30, 30(0), 30(10) INCIDENT LIGHT

60 MAIN LENS

61 OPTICAL AXIS

100*a*, 100*b* PD

101, 101*a*, 101*b*, 101*c*, 101*d*, 101*mid*$_1$, 101*mid*$_2$, 101*mid*$_3$, 101*nrw*, 101*tilt* PUPIL SEPARATION PORTION

102 ELEMENT SEPARATION PORTION

200, 200R, 200G, 200B COLOR FILTER

210 OCL

1000 ELECTRONIC APPARATUS

1010 OPTICAL SYSTEM

1011 IMAGING DEVICE

1018 OVERALL CONTROL UNIT

1200, 1210 PHOTOELECTRIC TRANSFORMATION ELEMENT

What is claimed is:

1. An imaging device, comprising:

a pixel array unit that includes a plurality of pixels arranged in a matrix arrangement having a plurality of rows and a plurality of columns of the pixels, wherein a separation portion that separates a pixel with a separation surface to acquire a phase difference is provided at an angle different from 0 degrees with respect to a column direction in the arrangement in at least some of the plurality of pixels, wherein in the separation portion, the separation surface is provided at an angle different from 0 degrees with respect to a column in the arrangement in a pixel positioned in a direction different from 0 degrees with respect to a row in the arrangement from an optical axis position of incident light in the pixel array unit, wherein an angle of the separation surface with respect to the column direction in a first pixel disposed in a first row and a first column of the matrix is different than an angle of the separation surface with respect to the column direction in a second pixel disposed in a second row and the first column of the matrix, and wherein in the separation portion of each pixel provided therewith, an angle formed by the separation surface and a line extending in a direction from the optical axis position to the separation surface is approximately 90 degrees.

2. The imaging device according to claim 1, wherein in the separation portion, the separation surface is provided toward the optical axis position at an angle of larger than 0 degrees and smaller than 90 degrees with respect to a column in the arrangement.

3. The imaging device according to claim 1, wherein in the separation portion, the separation surface is provided at an angle different from 0 degrees with respect to a column in the arrangement in a pixel positioned in the column direction in the arrangement from the optical axis position.

4. The imaging device according to claim 3, wherein in the separation portion, the separation surface is provided toward the optical axis position at an angle of larger than 0 degrees and equal to or smaller than 90 degrees with respect to a column in the arrangement.

5. The imaging device according to claim 4, wherein the separation portion is provided at the angle corresponding to a distance from the optical axis position to the pixel.

6. The imaging device according to claim 1, further comprising an optical filter provided on an incident surface of a semiconductor layer in each of the plurality of pixels, wherein the separation portion is provided according to a characteristic of the optical filter.

7. The imaging device according to claim 6, wherein the separation portion is provided at the angle corresponding to the characteristic of the optical filter.

8. The imaging device according to claim 1, wherein each of the plurality of pixels is a back-illuminated pixel.

9. An imaging device, comprising:

a pixel array unit that includes a plurality of pixels arranged in matrix arrangement, wherein a separation portion that separates a pixel with a separation surface to acquire a phase difference is provided at an angle different from 0 degrees with respect to a column direction in the arrangement in at least some of the plurality of pixels, wherein in the separation portion, the separation surface is provided from one end of the pixel in which the separation portion is provided toward another end opposite to the one end on a plane parallel to an incident surface of the pixel in which the separation portion is provided among the plurality of pixels.

10. The imaging device according to claim 9, wherein in the separation portion, the separation surface is provided toward an optical axis position of incident light in the pixel array unit at a uniform angle of larger than 0 degrees and smaller than 90 degrees with respect to a column in the arrangement.

11. The imaging device according to claim 9, wherein in the separation portion, the separation surface is provided to penetrate from the one end toward the another end.

12. The imaging device according to claim 9, wherein in the separation portion, another separation surface that intersects with the separation surface and is shorter than the separation surface is further provided.

13. The imaging device according to claim 9, wherein the separation portion is provided from an incident surface of a semiconductor layer in the pixel in which the separation portion is provided among the plurality of pixels toward a surface opposite to the incident surface while having a gap from the opposite surface.

14. The imaging device according to claim 9, wherein the separation portion is provided from a surface opposite to an incident surface of a semiconductor layer in the pixel in which the separation portion is provided among the plurality of pixels toward the incident surface while having a gap from the incident surface.

15. The imaging device according to claim 9, wherein the separation portion is provided from an incident surface of a semiconductor layer in the pixel in which the separation portion is provided among the plurality of pixels to a surface opposite to the incident surface while having a gap at a middle portion of the semiconductor layer.

16. The imaging device according to claim 9, wherein the separation portion is provided to penetrate from an incident surface of a semiconductor layer in the pixel in which the separation portion is provided among the plurality of pixels to a surface opposite to the incident surface.

17. An imaging device, comprising:

a pixel array unit that includes a plurality of pixels arranged in a matrix arrangement, wherein a separation portion that separates a pixel with a separation surface to acquire a phase difference is provided at an angle different from 0 degrees with respect to a column direction in the arrangement in at least some of the plurality of pixels, wherein in the separation portion, the separation surface includes a first separation portion provided from one end of the pixel in which the separation portion is provided to a position that does not reach an intermediate position between the one end and another end opposite to the one end on a plane parallel to an incident surface of the pixel in which the separation portion is provided among the plurality of pixels, and a second separation portion provided from the another end to a position that does not reach the intermediate position.

18. The imaging device according to claim 17, wherein in the separation portion, the first separation portion and the second separation portion are provided along a same straight line.

19. An imaging device, comprising:

a pixel array unit that includes a plurality of pixels arranged in a matrix arrangement, wherein a separation portion that separates a pixel with a separation surface to acquire a phase difference is provided at an angle different from 0 degrees with respect to a column direction in the arrangement in at least some of the plurality of pixels, wherein the separation portion has a thickness corresponding to a distance between the pixel in which the separation portion is provided among the plurality of pixels and an optical axis position of incident light in the pixel array unit.

20. An imaging device, comprising:

a pixel array unit that includes a plurality of pixels arranged in a matrix arrangement, wherein a separation portion that separates a pixel with a separation surface to acquire a phase difference is provided at an angle different from 0 degrees with respect to a column direction in the arrangement in at least some of the plurality of pixels, wherein the separation portion is provided in such a way that a position of the separation portion in each of the plurality of pixels is shifted in accordance with pupil correction for each of the plurality of pixels.

* * * * *